(12) United States Patent
Hattori et al.

(10) Patent No.: US 11,985,837 B2
(45) Date of Patent: May 14, 2024

(54) PHOTOELECTRIC CONVERSION ELEMENT

(71) Applicants: SONY CORPORATION, Tokyo (JP); SONY SEMICONDUCTOR SOLUTIONS CORPORATION, Kanagawa (JP)

(72) Inventors: Shinnosuke Hattori, Tokyo (JP); Hajime Kobayashi, Tokyo (JP); Sae Miyaji, Tokyo (JP); Masato Kanno, Tokyo (JP); Miki Kimijima, Tokyo (JP); Yuta Hasegawa, Kanagawa (JP); Toshio Nishi, Tokyo (JP); Takashi Kawashima, Tokyo (JP); Yosuke Saito, Tokyo (JP); Yuta Inaba, Tokyo (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 620 days.

(21) Appl. No.: 17/261,215

(22) PCT Filed: Jul. 25, 2019

(86) PCT No.: PCT/JP2019/029184
§ 371 (c)(1),
(2) Date: Jan. 19, 2021

(87) PCT Pub. No.: WO2020/022421
PCT Pub. Date: Jan. 30, 2020

(65) Prior Publication Data
US 2021/0280639 A1    Sep. 9, 2021

(30) Foreign Application Priority Data

Jul. 26, 2018 (JP) .................................. 2018-140401
Jul. 19, 2019 (JP) .................................. 2019-133395

(51) Int. Cl.
*H01L 27/146*   (2006.01)
*H10K 30/81*    (2023.01)
*H10K 39/32*    (2023.01)

(52) U.S. Cl.
CPC ....... *H10K 39/32* (2023.02); *H01L 27/14621* (2013.01); *H01L 27/14625* (2013.01); *H10K 30/81* (2023.02)

(58) Field of Classification Search
CPC .. H10K 39/32; H10K 30/81; H01L 27/14621; H01L 27/14625
See application file for complete search history.

(56) References Cited

U.S. PATENT DOCUMENTS

2013/0333758 A1* 12/2013 Okabe ................. H10K 85/113
136/263
2015/0311445 A1* 10/2015 Udaka ................. H10K 85/657
257/40

(Continued)

FOREIGN PATENT DOCUMENTS

CN    102610627 A    7/2012
CN    107615504 A    1/2018

(Continued)

OTHER PUBLICATIONS

International Search Report prepared by the Japan Patent Office dated Oct. 7, 2019, for International Application No. PCT/JP2019/029184.

*Primary Examiner* — Samuel A Gebremariam
(74) *Attorney, Agent, or Firm* — Sheridan Ross PC

(57) ABSTRACT

To provide a photoelectric conversion element capable of further improving performance in a photoelectric conversion element using an organic semiconductor material. The photoelectric conversion element includes a first electrode and a second electrode arranged to face each other, and a photoelectric conversion layer 17 provided between the first (Continued)

electrode and the second electrode, in which the photoelectric conversion layer 17 includes a first organic semiconductor material and a second organic semiconductor material, and at least one of the first organic semiconductor material or the second organic semiconductor material is an organic molecule having a HOMO volume fraction of 0.15 or less or a LUMO volume fraction of 0.15 or less.

24 Claims, 22 Drawing Sheets

(56) References Cited

U.S. PATENT DOCUMENTS

| 2018/0151624 A1 | 5/2018 | Hasegawa et al. |
| 2018/0219045 A1 | 8/2018 | Murata et al. |

FOREIGN PATENT DOCUMENTS

| JP | 2010219212 A | 9/2010 |
| JP | 2013168612 A | 8/2013 |
| TW | 201733150 A | 9/2017 |
| WO | WO 2017/014146 | 1/2017 |
| WO | WO 2017/191468 | 11/2017 |
| WO | WO 2016/194630 | 3/2018 |

* cited by examiner

PHOTOELECTRIC CONVERSION ELEMENT

CROSS REFERENCE TO RELATED APPLICATIONS

This application is a national stage application under 35 U.S.C. 371 and claims the benefit of PCT Application No. PCT/JP2019/029184 having an international filing date of 25 Jul. 2019, which designated the United States, which PCT application claimed the benefit of Japanese Patent Application Nos. 2018-140401 filed 26 Jul. 2018 and 2019-133395 filed 19 Jul. 2019, the entire disclosures of each of which are incorporated herein by reference.

TECHNICAL FIELD

The technology according to the present disclosure (present technology) relates to a photoelectric conversion element using, for example, an organic semiconductor material.

BACKGROUND ART

In recent years, in a solid-state imaging device such as a CCD (Charge Coupled Device) image sensor and a CMOS (Complementary Metal Oxide Semiconductor) image sensor, a reduction of a pixel size is in progress. Thus, because the number of photons incident on a unit pixel is reduced, sensitivity is lowered and a decrease in an S/N ratio occurs. Furthermore, in a case where color filters formed by two-dimensionally arranging primary color filters of red, green, and blue for coloring are used, green light and blue light are absorbed by the color filters in red pixels, resulting in a decrease in the sensitivity. Moreover, since interpolation processing is performed between pixels when generating each color signal, so-called false colors are generated.

Therefore, Patent Literature 1 discloses an image sensor using an organic photoelectric conversion film having a multilayer structure in which an organic photoelectric conversion film having sensitivity to blue light (B), an organic photoelectric conversion film having sensitivity to green light (G), and an organic photoelectric conversion film having sensitivity to red light (R) are sequentially laminated. In this image sensor, by taking signals of B/G/R from one pixel separately, sensitivity improvement is achieved. Patent Literature 2 discloses an image pickup element in which a single organic photoelectric conversion film is formed, a signal of one color is extracted from the organic photoelectric conversion film, and signals of two colors are extracted by silicon (Si) bulk spectroscopy.

Furthermore, Non-Patent Literature 1 reports that it is necessary to reduce a standard deviation of an energy level σ to 0.2 eV or less in order to obtain mobility of $1 \times 10^{-4}$ $cm^2/Vs$ or more. Non-Patent Literature 2 reports that the mobility decreases by one order of magnitude when the standard deviation σ of the energy level increases by about 25 meV. In addition, Non-Patent Literature 3 reports that a parameter of a force field is given by a GAFF (General Amber Force Field).

CITATION LIST

Patent Literature

Patent Literature 1: Japanese Patent Application Laid-open No. 2003-332551
Patent Literature 2: Japanese Patent Application Laid-open No. 2005-303266

Non-Patent Literature

Non-Patent Literature 1: P. Friederich et al., Adv. Funct. Mater. 26, 5757-5763 (2016)
Non-Patent Literature 2: Vadim Rodin, et al., Phys. Rev. B 91, 155203 (2015)
Non-Patent Literature 3: Wang J, et al, J Comput Chem., 25(9) (2010)

DISCLOSURE OF INVENTION

Technical Problem

In the photoelectric conversion element using the organic semiconductor material such as Patent Literatures 1 and 2, for example, further performance improvements such as improvements of external quantum efficiency and afterimage characteristics, dark current suppression, and the like are desired.

An object of the present technology is to provide a photoelectric conversion element capable of further improving performance in a photoelectric conversion element using an organic semiconductor material.

Solution to Problem

A photoelectric conversion element according to one embodiment of the present technology is a photoelectric conversion element including a first electrode and a second electrode arranged to face each other, and a photoelectric conversion layer provided between the first electrode and the second electrode, in which the photoelectric conversion layer includes a first organic semiconductor material and a second organic semiconductor material, and at least one of the first organic semiconductor material or the second organic semiconductor material is an organic molecule having a HOMO volume fraction of 0.15 or less or a LUMO volume fraction of 0.15 or less.

The photoelectric conversion element according to other embodiment of the present technology is a photoelectric conversion element including a first electrode and a second electrode arranged to face each other, and a photoelectric conversion layer provided between the first electrode and the second electrode, in which the photoelectric conversion layer is formed of two or more kinds of organic semiconductor materials, and m/n is 1 or more where m is a film density of the photoelectric conversion layer and n is a weighted average of the film density of a single film of each organic semiconductor material forming the photoelectric conversion layer with respect to a composition.

A photoelectric conversion element according to still other embodiment of the present technology is a photoelectric conversion element including a first electrode and a second electrode arranged to face each other, and a photoelectric conversion layer provided between the first electrode and the second electrode, in which the photoelectric conversion layer includes first to third organic semiconductor materials, and a ratio of the second organic semiconductor material, which has only a most stable structure as a coordination structure with the third organic semiconductor material adjacent to the second organic semiconductor material, is 0.5 or more.

A photoelectric conversion element according to still another embodiment of the present technology is a photoelectric conversion element including a first electrode and a second electrode arranged to face each other; and a photoelectric conversion layer provided between the first electrode and the second electrode, in which the photoelectric conversion layer includes first to third organic semiconductor materials, and the photoelectric conversion layer has a first domain formed of the first organic semiconductor material and a second domain in which the second organic semiconductor material and the third organic semiconductor material are uniformly dissolved at a molecular level.

BRIEF DESCRIPTION OF DRAWINGS

FIG. 22 is a graph showing a LUMO level and a HOMO level of C60 and the like.

MODE(S) FOR CARRYING OUT THE INVENTION

Figure 1:
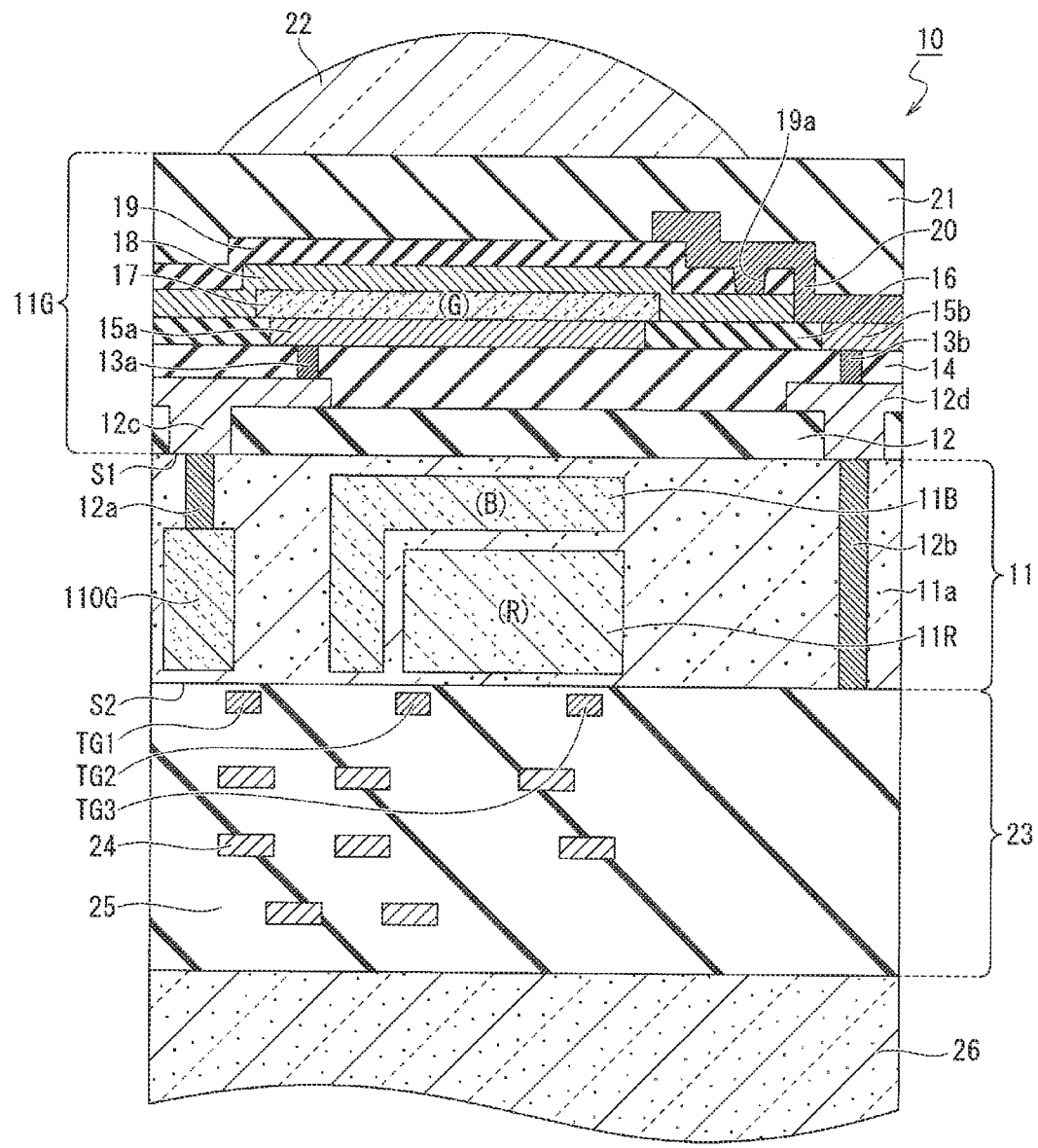
FIG. 1 is a cross-sectional view showing an example of a photoelectric conversion element according to an first embodiment.

In the following, first to fifth embodiments of the present technology will be described with reference to the drawings. In the description of the drawings referred to in the following description, the same or similar parts are denoted by the same or similar reference numerals. It should be noted, however, that the drawings are schematic, and that the relationship between thickness and plane dimensions, a ratio of the thickness of each layer, etc., are different from the actual ones. Therefore, specific thicknesses and dimensions should be determined by referring to the following description. Moreover, it is needless to say that the drawings also include portions having different dimensional relationships and ratios from each other. It should be noted that the effects described herein are merely illustrative and not restrictive, and other effects may be present.

In the following description, definitions of up and down directions, etc. are merely definitions for convenience of description and do not limit the technical idea of the present invention. For example, it is needless to say that when an object is rotated by 90 degrees and observed, it reads by converting the up and down to the left and right and read, and when the object is rotated by 180 degrees and observed, it reads by inverting the up and down. Furthermore, for example, in the description of FIG. 1 or the like, depending on understanding of the structural such as "as a back surface incident type photoelectric conversion element", an upper surface side of a semiconductor substrate 11 in FIG. 1 is defined as a "back surface", a lower surface side of the semiconductor element 11 is defined as a "front surface". Designation of the "back surface" and "front surface" is only a definition for convenience of explanation. Regardless of the definition of "the back surface" and "the surface", in the definition of a member name of an organic photoelectric conversion section of FIG. 1, an electrode on a lower side is referred to as a "lower electrode 15a", and an electrode on an upper side is referred to as an "upper electrode 18", and "top" and "bottom" are arbitrarily defined in individual layer, even within the same drawing.

First Embodiment

<Overall Configuration of Photoelectric Conversion Element>

FIG. 1 shows a cross-sectional configuration of a photoelectric conversion element 10 according to a first embodiment. Note that the cross-sectional configuration of the photoelectric conversion element 10 shown in FIG. 1 is common to second to fourth embodiments of the present technology to be described later. The photoelectric conversion element 10 according to the first embodiment, for example, constitutes one pixel of a solid-state imaging device such as a CCD image sensor or a CMOS image sensor (unit pixel). Here, a case where a pixel of a so-called back-side illumination type solid-state imaging device is configured will be exemplified. Therefore, in FIG. 1, a light receiving surface S1 of the semiconductor substrate 11 forming the photoelectric conversion element 10 (upper surface of semiconductor substrate 11 in FIG. 1) is referred to as "back surface", and a surface S2 opposite to the back surface S1 of the semiconductor element 11 (lower surface of semiconductor substrate 11 in FIG. 1) is referred to as "surface".

The photoelectric conversion element 10 has a structure in which one organic photoelectric conversion section 11G for performing photoelectric conversion by selectively detecting light of different respective wavelength ranges and two inorganic photoelectric conversion sections 11B and 11R are laminated in the longitudinal direction, whereby each color signal of red (R), green (G), and blue (B) is acquired by one element. The organic photoelectric conversion section 11G is formed on the back surface S1 of the semiconductor substrate 11. The inorganic photoelectric conversion sections 11B and 11R are embedded/formed in the semiconductor substrate 11.

The organic photoelectric conversion section 11G is an organic photoelectric conversion element that absorbs light in a selective wavelength range using an organic semiconductor to generate electron-hole pairs, and the organic photoelectric conversion section 11G selectively absorbs green light to generate electron-hole pairs. The organic photoelectric conversion section 11G has a pair of the lower electrodes (first electrode) 15a and an upper electrode (second electrode) 18 for extracting signal charges, which are arranged to face each other, and an organic photoelectric conversion layer 17 provided between the lower electrode 15a and the upper electrode 18. The lower electrode 15a and the upper electrode 18 are electrically connected to conductive plugs 12a and 12b buried in the semiconductor substrate 11 via wiring layers 13a, 13b, and 15b, and a contact metal layer 20.

Specifically, in the organic photoelectric conversion portion 11G, interlayer insulating films 12 and 14 are formed on the back surface S1 of the semiconductor substrate 11. The interlayer insulating film 12 is provided with through holes, and the conductive plugs 12c and 12d are buried in the respective through holes. In the interlayer insulating film 14, the wiring layers 13a and 13b are buried in regions facing the conductive plugs 12c and 12d, respectively. On the interlayer insulating film 14, a lower electrode 15a is provided, and the wiring layer 15b electrically separated from the lower electrode 15a by an insulating film 16 is provided. Of these, the organic photoelectric conversion layer 17 is formed on the lower electrode 15a, and the upper electrode 18 is formed so as to cover the organic photoelectric conversion layer 17. A protective layer 19 is formed on the upper electrode 18 so as to cover the surface thereof. A contact hole 19a is provided in a predetermined region of the protective layer 19. A contact metal layer 20 is formed on the protective layer 19 so as to fill the contact hole 19a and extend to the upper surface of the wiring layer 15b.

The conductive plug 12c functions as a connector together with the conductive plug 12a. The conductive plug 12c forms a transmission path of charges (electrons) from the lower electrode 15a to a green storage layer 110G together with the conductive plug 12a and the wiring layer 13a. The conductive plug 12d serves as a connector together with the conductive plug 12b. In addition, the conductive plug 12d forms a discharge path of charges (holes) from the upper electrode 18 together with the conductive plug 12b, the wiring layer 13b, the wiring layer 15b, and the contact metal layer 20. The conductive plugs 12c, 12d are desirable to be constituted by a laminated film of a metal material such as titanium nitride (TiN), titanium (Ti), and tungsten, for example, in order to function also as a light shielding film. In addition, by using such a laminated film, in a case where the conductive plugs 12a and 12b are formed as n-type or p-type semiconductor layers, it is desirable because it is possible to ensure contact with silicon.

The interlayer insulating film 12 reduces an interface state between the interlayer insulating film 12 and the silicon layer 11a as the semiconductor substrate 11, and also suppresses an occurrence of a dark current from an interface between the interlayer insulating film 12 and the silicon layer 11a. Therefore, the interlayer insulating film 12 is desirably formed of an insulating film having a low interface state between the interlayer insulating film 12 and the silicon layer 11a. As such an insulating film, for example, a laminated film of a hafnium oxide ($HfO_2$) film and a silicon oxide ($SiO_2$) film can be used. The interlayer insulating film 14 is formed of, for example, a single layer film of one of silicon oxide, silicon nitride, silicon oxynitride (SiON) and the like, or a laminated film of two or more of them.

The insulating film 16 is formed of, for example, a single layer film of one of silicon oxide, silicon nitride, silicon oxynitride (SiON) and the like, or a laminated film of two or more of them. The surface of the insulating film 16 is flattened, for example, and has a shape and a pattern substantially without a step with the lower electrode 15a. The insulating film 16 has a function of electrically separating the lower electrodes 15a of the respective pixels when the photoelectric conversion element 10 is used as unit pixels 3 of the solid-state imaging device 1.

The lower electrode 15a is provided in a region covering the light receiving surface facing the light receiving surface of the inorganic photoelectric conversion sections 11B and 11R formed in the semiconductor substrate 11. The lower electrode 15a is made of a conductive film having light transmittance, and is made of, for example, indium tin oxide (ITO). However, in addition to the ITO, a tin oxide ($SnO_2$) based material to which a dopant is added or a zinc oxide based material obtained by adding a dopant to aluminum zinc oxide may be used as a constituent material of the lower electrode 15a. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. Furthermore, in addition to this, CuI, InSbO$_4$, ZnMgO, CuInO$_2$, MgIN$_2$O$_4$, CdO, ZnSnO$_3$, and the like may be used. In the first embodiment, since the signal charges (electrons) are extracted from the lower electrode 15a, in the solid-state imaging device 1 described later using the photoelectric conversion element 10 as each unit pixel 3, the lower electrode 15a is separated for each pixel and is formed.

The organic photoelectric conversion layer 17 photoelectrically converts light of a selective wavelength, and transmits light of another wavelength range. The organic photoelectric conversion layer 17 includes, for example, two or more kinds of organic semiconductor materials (p-type organic semiconductor material or n-type organic semiconductor material) each functioning as a p-type semiconductor or an n-type semiconductor. The organic photoelectric conversion layer 17 has a junction surface (p/n junction surface) between the p-type organic semiconductor material and the n-type organic semiconductor material in the layer. The p-type organic semiconductor material functions relatively as an electron donor, while the n-type organic semiconductor material functions relatively as an electron acceptor. The organic photoelectric conversion layer 17 provides a field in which an exciton generated when light is absorbed is separated into an electron and a hole, and specifically, the exciton is separated into an electron and a hole at the interface (p/n junction surface) between the electron donor and the electron acceptor.

The organic photoelectric conversion layer 17 may include, in addition to the p-type semiconductor material and the n-type semiconductor material, an organic semiconductor material which performs photoelectric conversion of light in a predetermined wavelength range and transmits light in another wavelength range, that is, a so-called pigment material. In a case where the organic photoelectric conversion layer 17 is formed using three types of organic semiconductor materials, i.e., a p-type semiconductor material, an n-type semiconductor material, and a pigment material, it is desirable that the p-type semiconductor material and the n-type semiconductor material have light transmittance in a visible region (e.g., 450 nm to 800 nm). The thickness of the organic photoelectric conversion layer 17 is, for example, 50 nm to 500 nm. Details of the organic photoelectric conversion layer 17 will be described later.

Between the organic photoelectric conversion layer 17 and the lower electrode 15a, and between the organic photoelectric conversion layer 17 and the upper electrode 18, other layers (not shown) may be provided. For example, an undercoat film, a hole transport layer, an electron blocking film, an organic photoelectric conversion layer 17, a hole blocking film, a buffer film, an electron transport layer, and a work function adjusting film may be laminated in this order from a lower electrode 15a side.

The upper electrode 18 and the protective layer 19 are provided so as to cover the organic photoelectric conversion layer 17, for example. The upper electrode 18 is formed of a conductive film having the same light transmittance as that of the lower electrode 15a. In the solid-state imaging device using the photoelectric conversion element 10 as a pixel, the upper electrode 18 may be separated for each pixel and may be formed as a common electrode for each pixel. The thickness of the upper electrode 18 is, for example, 10 nm to 200 nm.

The protective layer 19 is made of a material having light transmittance, and is, for example, a single layer film made of any one of silicon oxide, silicon nitride, silicon oxynitride, and the like, or a laminated layer film made of two or more of them. The thickness of this protective layer 19 is, for example, 100 nm to 30000 nm.

The contact metal layer 20 is made of, for example, any one of titanium (Ti), tungsten (W), titanium nitride (TiN), aluminum (Al), and the like, or a laminated film made of two or more of them.

A planarization layer 21 is formed on the protective layer 19 and the contact metal layer 20 so as to cover the entire surface. On the planarization layer 21, an on-chip lens 22 (microlens) is provided. The on-chip lens 22 collects light incident from above to each light receiving surface of the organic photoelectric conversion section 11G and the inorganic photoelectric conversion sections 11B and 11R. In the first embodiment, since a multilayer wiring layer 23 is formed on a surface S2 side of the semiconductor substrate 11, respective light receiving surfaces of the organic photoelectric conversion section 11G and the inorganic photoelectric conversion section 11B and 11R can be arranged close to each other, it is possible to reduce a variation in sensitivity between the colors depending on an F value of the on-chip lens 22.

Note that, in the photoelectric conversion element 10 according to the first embodiment, the signal charge (electron) is extracted from the lower electrode 15a, and therefore, in the solid-state imaging device using the photoelectric conversion element 10 as the pixel, the upper electrode 18 may be the common electrode. In this case, the transmission path including the contact hole 19a, the contact metal layer 20, the wiring layers 15b and 13b, the conductive plugs 12b and 12d described above may be formed at least one location with respect to all pixels.

In the semiconductor substrate 11, for example, the inorganic photoelectric conversion portions 11B and 11R and the green storage layer 110G are buried/formed in a predetermined region of the n-type silicon (Si) layer 11a. Also, in the semiconductor substrate 11, the conductive plugs 12a and 12b serving as transmission paths of charges (electrons or holes) from the organic photoelectric conversion section 11G are buried. At the surface S2 side of the semiconductor substrate 11, a plurality of pixel transistors (including transfer transistors TR1 to TR3) corresponding to the respective of the organic photoelectric conversion section 11G, the inorganic photoelectric conversion section 11B and 11R is formed, a peripheral circuit including a logic circuit and the like is formed.

On the surface S2 of the semiconductor substrate 11, the multilayer wiring layer 23 is formed. In the multilayer wiring layer 23, a plurality of wires 24 is arranged through an interlayer insulating film 25. Thus, in the photoelectric conversion element 10, the multilayer wiring layer 23 is formed on a side opposite to the light receiving surface, it is possible to realize a so-called back-surface irradiation type solid-state imaging device. The multilayer wiring layer 23, for example, a support substrate 26 made of silicon (Si) is bonded.

The pixel transistors include, for example, a transfer transistor, a reset transistor, an amplification transistor, and a selection transistor. Any of these pixel transistors is, for example, constituted by a MOS transistor, and is formed in a p-type semiconductor well region on the surface S2 side of the semiconductor substrate 11. A circuit including such a pixel transistor is formed for each photoelectric conversion section of red, green, and blue. Each circuit may have a three-transistor configuration including a total of three transistors, e.g. a transfer transistor, a reset transistor, and an amplifying transistor among these pixel transistors, and may be a four-transistor configuration obtained by adding a selection transistor thereto. In FIG. 1, among these pixel transistors, only the gate electrodes TG1 to TG3 of the transfer transistor are illustrated as a structure embedded in the multilayer wiring layer 23 at the surface S2 side. Also, other pixel transistors other than the transfer transistor may be shared between the photoelectric conversion sections or between pixels. It is also possible to apply a so-called pixel sharing structure, which shares a floating diffusion region (FD).

The transfer transistor is configured to include the gate electrodes TG1 to TG3 and the floating diffusion region. The transfer transistor having the gate electrode TG1 transfers a signal charge (electron) corresponding to a green color generated in the organic photoelectric conversion layer 11G and accumulated in the green storage layer 110G to the vertical signal line of the solid-state imaging device. The transfer transistor having the gate electrode TG2 transfers a signal charge (electron) corresponding to a blue color generated and accumulated in the inorganic photoelectric conversion section 11B to the vertical signal line of the solid-state imaging device. Similarly, the transfer transistor 3 having the gate electrode TG3 transfers a signal charge corresponding to a red color generated and accumulated in the inorganic photoelectric conversion section 11R to the vertical signal lines of the solid-state imaging device.

Although a p-type semiconductor region and an n-type semiconductor region are now shown, each of the inorganic photoelectric conversion sections 11B and 11R is a photodiode having a pn junction in the n-type silicon layer 11a, and is formed in the order of the inorganic photoelectric conversion sections 11B and 11R from a back surface S1 side of the semiconductor substrate 11 on the optical path in the semiconductor substrate 11. Of these, the inorganic photoelectric conversion section 11B selectively detects blue light to accumulate the signal charge corresponding to the blue color, and is formed so as to extend, for example, from a selective region along the back surface S1 of the semiconductor substrate 11 to a region in the vicinity of the interface with the multilayer wiring layer 23. The inorganic photoelectric conversion section 11R selectively detects red light to accumulate the signal charge corresponding to the red color, and is formed, for example, over a region lower than the inorganic photoelectric conversion section 11B (at surface S2 side of semiconductor substrate 11). Note that blue (B) is, for example, a color corresponding to a wavelength range of 450 nm to 495 nm, and red (R) is, for example, a color corresponding to a wavelength range of 620 nm to 750 nm, and each of the inorganic photoelectric conversion sections 11B and 11R may be capable of detecting light in part or all of the wavelength ranges.

<Configuration of Organic Photoelectric Conversion Layer>

In an image pickup element in which signals of two colors are extracted by Si bulk spectroscopy and a signal of one color is extracted by the organic photoelectric conversion film provided on the Si bulk, the organic photoelectric conversion film generally has a bulk heterostructure in which the p-type organic semiconductor material and the n-type organic semiconductor material are mixed irregularly. In the bulk heterostructure, the organic semiconductor materials are often present in an amorphous state. Generally, an amorphous organic semiconductor has low mobility because of its large energy dispersion compared with crystal. If the mobility is lowered, a time required for the charge generated at a charge separation interface to reach the electrode becomes long, there is therefore a problem that the afterimage characteristics are lowered. Therefore, in the first embodiment, the photoelectric conversion element capable of improving the afterimage characteristics is provided by using the amorphous organic semiconductor having a small energy dispersion and high mobility.

In the first embodiment, the organic photoelectric conversion layer 17 includes at least the first organic semiconductor material and the second organic semiconductor material having different mother skeletons. The first organic semiconductor material and the second organic semiconductor material are formed of the p-type organic semiconductor material and the n-type organic semiconductor material, respectively. Since holes are carriers that conduct mainly in the p-type organic semiconductor material after the photoelectric conversion by the organic photoelectric conversion layer 17, it is desirable that the p-type organic semiconductor material has high hole mobility. Since electrons are carriers that mainly conduct in the n-type organic semiconductor material, it is desirable that the n-type organic semiconductor material has high electron mobility. Incidentally, a mixing ratio of the p-type organic semiconductor material and the n-type organic semiconductor material forming the organic photoelectric conversion layer 17 may be, for example, about 30% by weight of the p-type organic semiconductor material and about 70% by weight of the n-type organic semiconductor material, but it is not limited thereto. Note that the organic photoelectric conversion layer 17 may further include a third organic semiconductor material having a mother skeleton different from those of the first organic semiconductor material and the second organic semiconductor material.

Figure 2:
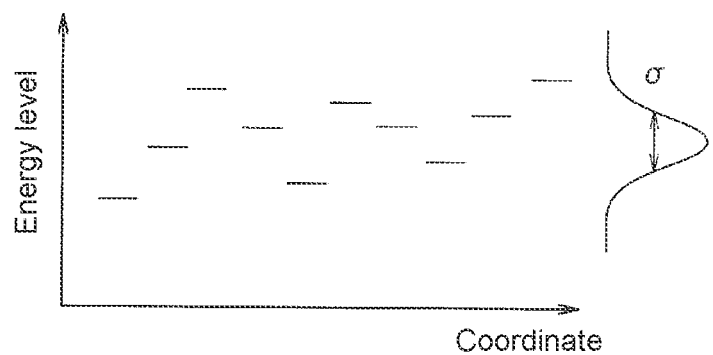
FIG. 2 is a graph showing a spatial distribution of an energy level and energy dispersion.
Figure 3:
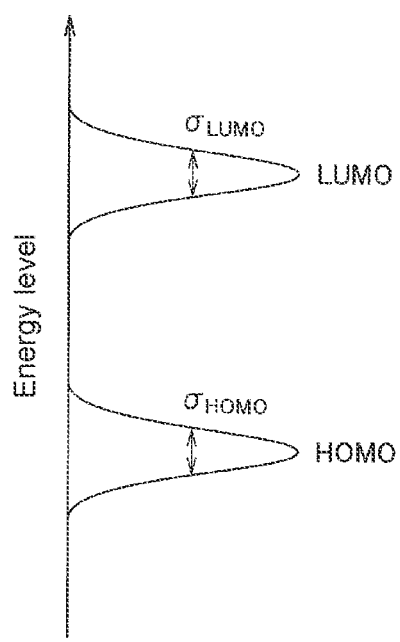
FIG. 3 is a graph showing $\sigma_{HOMO}$ and $\sigma_{LUMO}$.

Generally, in the amorphous organic semiconductor, as schematically shown in FIG. 2, a carrier conduction energy level of each molecule varies spatially and forms a profile that can be approximated by a normal distribution. Since this varied profile becomes an energy barrier for carrier mobility, the larger energy dispersion σ of the carrier conduction energy level is, the lower the carrier mobility is. In the amorphous organic semiconductor, a Highest Occupied Molecular Orbital (HOMO) level for holes and a Lowest Unoccupied Molecular Orbital (LUMO) level for electrons are defined as the carrier conductivity energy level. The HOMO means a molecular orbital in which the last filled electron is present, as electrons are filled in order from a stable molecular orbital with lower energy level. The LUMO means a molecular orbital with one energy level higher than the HOMO and no electrons in the orbital with the higher energy levels. As shown in FIG. 3, energy dispersion of the HOMO level when approximated by the normal distribution is denoted as $\sigma_{HOMO}$, and energy dispersion of the LUMO level is denoted as $\sigma_{LUMO}$.

In the first embodiment, at least one of the first organic semiconductor material or the second organic semiconductor material contained in the organic photoelectric conversion layer 17 is formed of organic molecules having a HOMO volume fraction or a LUMO volume fraction of about 0.15 or less. The "HOMO volume fraction" and the "LUMO volume fraction" are defined by the following equations (1) and (2), respectively.

HOMO volume fraction=HOMO volume/occupied volume of one molecule   (1)

LUMO volume fraction=LUMO volume/occupied volume of one molecule   (2)

In the equations (1) and (2), the "HOMO volume" is a volume in a region where an absolute value of the HOMO level is 0.02 or more. In addition, the "LUMO volume" is a volume in a region where an absolute value of the LUMO level is 0.02 or more. The HOMO volume and the LUMO volume can be determined by a first-principles calculation. The occupied volume of one molecule can be obtained by an actual measurement of density or a computer simulation such as a molecular dynamics method.

For example, the smaller the HOMO volume fraction or the LUMO volume fraction of at least one of the first organic semiconductor material or the second organic semiconductor material is, the more it is desirable, and it is further desirable that it is about 0.10 or less.

For example, both of the first organic semiconductor material and the second organic semiconductor material contained in the organic photoelectric conversion layer 17 may have the HOMO volume fraction or the LUMO volume fraction of 0.15 or less. In addition, one of the first organic semiconductor material and the second organic semiconductor material may have the HOMO volume fraction or the LUMO volume fraction of 0.15 or less. In addition, both of the HOMO volume fraction and the LUMO volume fraction of the first organic semiconductor material may be 0.15 or less, and only one of the HOMO volume fraction and the LUMO volume fraction may be 0.15 or less and the other may exceed 0.15. Similarly, both of the HOMO volume fraction and the LUMO volume fraction of the second organic semiconductor material may be 0.15 or less, and only one of the HOMO volume fraction and the LUMO volume fraction may be 0.15 or less and the other may be exceed 0.15. In addition, when the organic photoelectric conversion layer 17 further includes the third organic semiconductor material, the HOMO volume fraction or the LUMO volume fraction of the third organic semiconductor material may be 0.15 or less, or may exceed 0.15.

Furthermore, in each of the first organic semiconductor material and the second organic semiconductor material contained in the organic photoelectric conversion layer 17, when the HOMO volume fraction or the LUMO volume fraction is about 0.15 or less, the HOMO volume fraction and the LUMO volume fraction may be equal to each other. Alternatively, when the HOMO volume fraction or LUMO volume fraction is about 0.15 or less, the HOMO volume fraction may be higher than the LUMO volume fraction, and the HOMO volume fraction may be lower than the LUMO volume fraction.

Examples of the first organic semiconductor material, the second organic semiconductor material, and the third organic semiconductor material contained in the organic photoelectric conversion layer 17 include quinacridone, chlorinated boron subphthalocyanine, pentacene, benzothienobenzothiophene, fullerene, and derivatives thereof. The organic photoelectric conversion layer 17 is formed by, for example, combining two or more kinds of the organic semiconductor materials described above. The organic semiconductor material described above functions as a p-type semiconductor or an n-type semiconductor depending on a combination thereof. Furthermore, as the first organic semiconductor material, the second organic semiconductor material, and the third organic semiconductor material contained in the organic photoelectric conversion layer 17, for example, any one of naphthalene, anthracene, phenanthrene, tetracene, pyrene, perylene, fluoranthene, or derivatives thereof is preferably used. Alternatively, polymers such as phenylenevinylene, fluorene, carbazole, indole, pyrene, pyrrole, picoline, thiophene, acetylene, diacetylene, and the like, and derivatives thereof may be used.

Examples of the first organic semiconductor material, the second organic semiconductor material, and the third organic semiconductor material contained in the organic photoelectric conversion layer 17 include compounds represented by the following formulae (1-1) to (1-21).

[Chemical Formula 1]

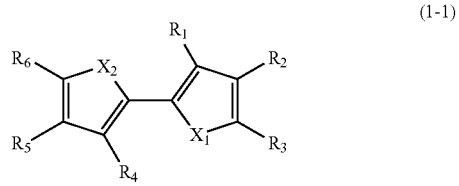

(1-1)

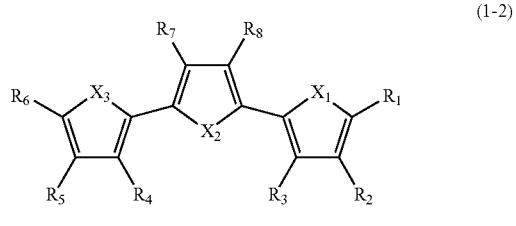

(1-2)

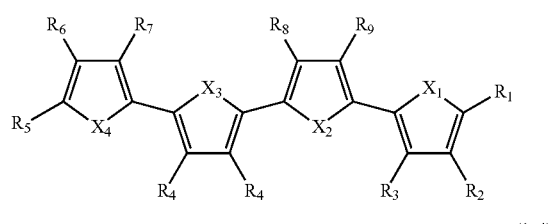

(1-3)

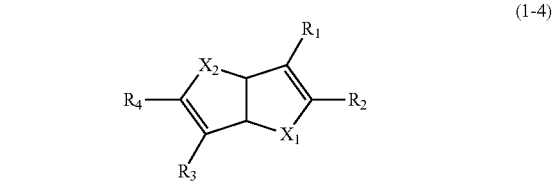

(1-4)

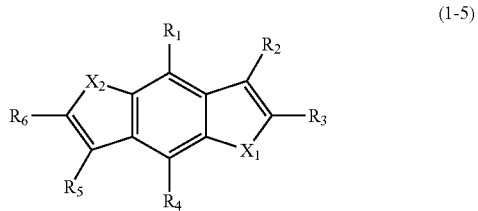

(1-5)

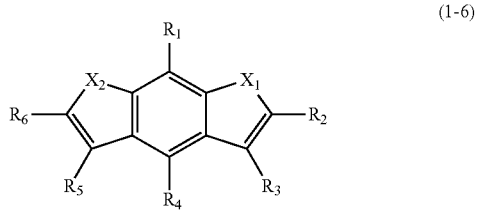

(1-6)

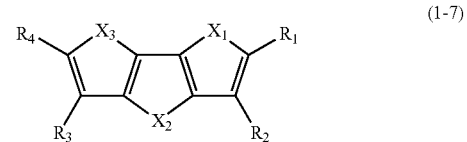

(1-7)

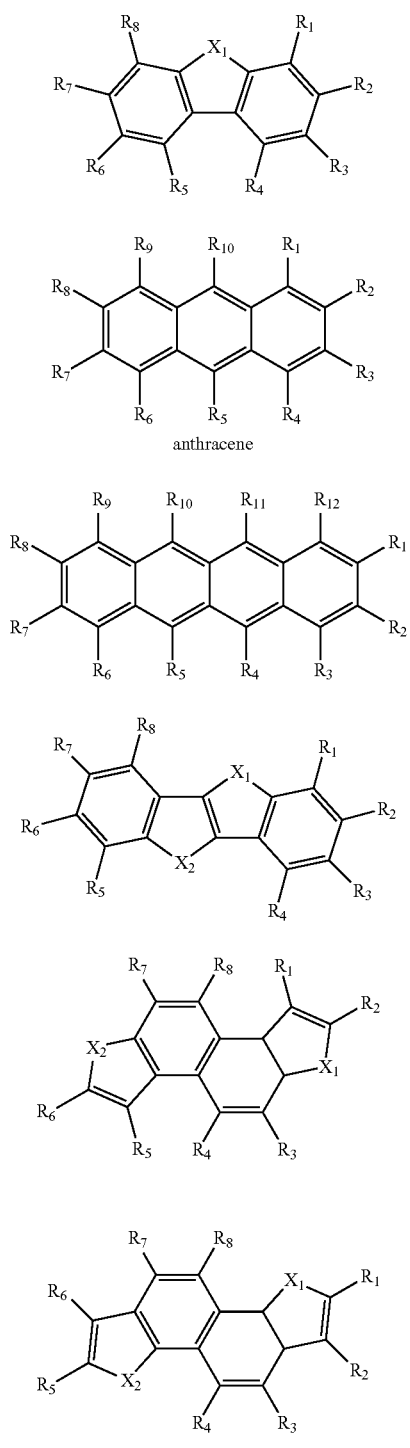
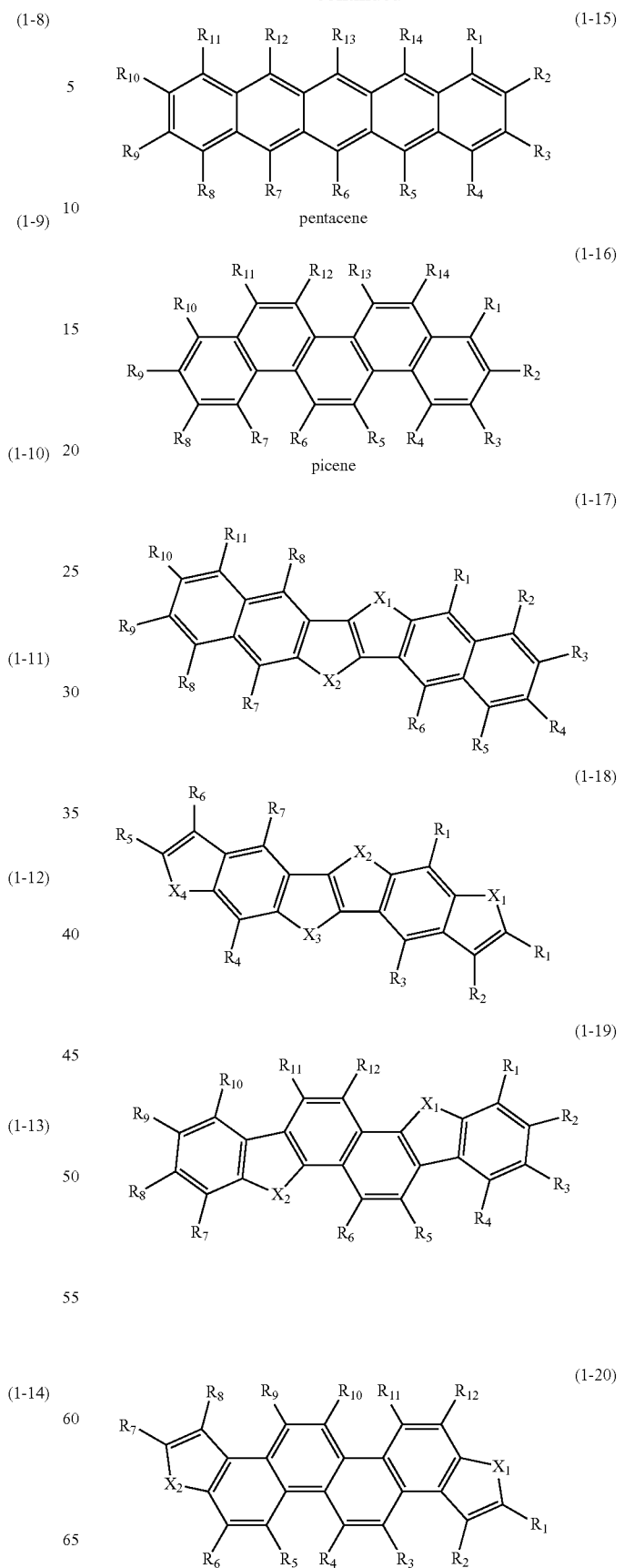

-continued

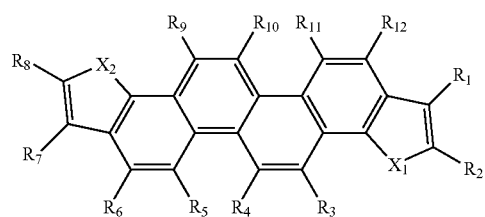

(1-21)

(R1 to R14 are each independently a hydrogen atom, a halogen atom, a substituted or unsubstituted aryl group, a substituted or unsubstituted complex aryl group, a thioalkyl group, an arylsulfonyl group, an amino group, an alkylamino group, a hydroxy group, an acylamino group, an acyloxy group, a carboxy group, a carboxy group, an acyl group, a sulfonyl group, a cyano group, and a nitro group; any adjacent R1 to R14 may bind each other to form a condensed aliphatic ring or a condensed aromatic ring; X1 to X4 are each independently a heteroatom).

Examples of the first organic semiconductor material, the second organic semiconductor material, and the third organic semiconductor material contained in the organic photoelectric conversion layer 17 include compounds represented by the following formulae (2-1) to (2-6).

[Chemical Formula 2]

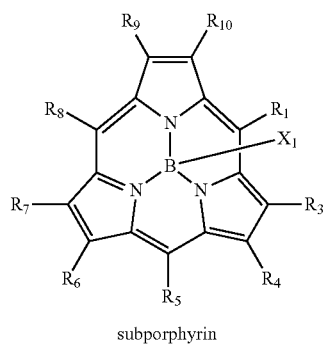

(2-1)

subporphyrin

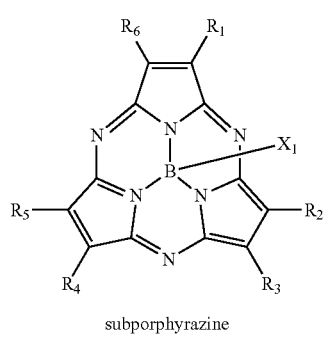

(2-2)

subporphyrazine

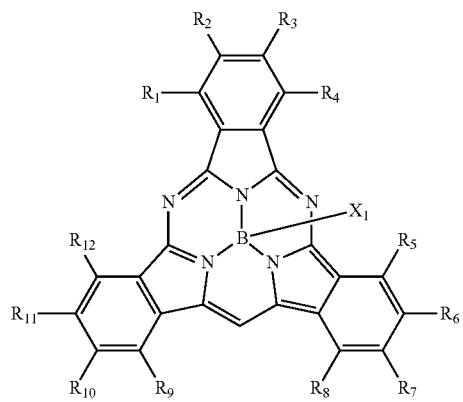

(2-3)

subphthalocyanine

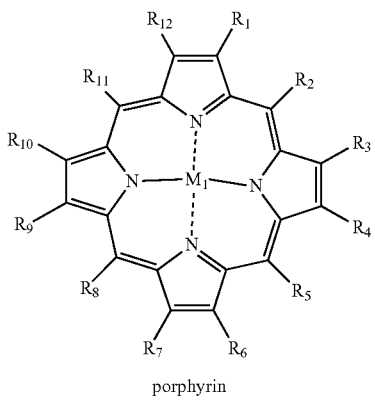

(2-4)

porphyrin

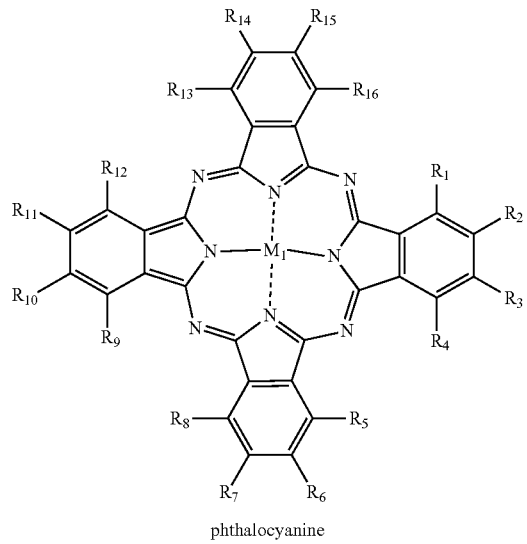

(2-5)

phthalocyanine

-continued (2-6)

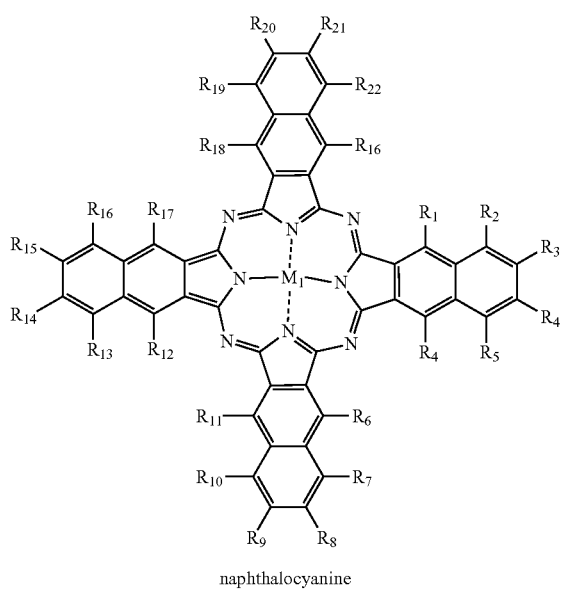

naphthalocyanine (R1 to R18 are each independently a hydrogen atom, a halogen atom, a substituted or unsubstituted aryl group, a substituted or unsubstituted complex aryl group, a thioalkyl group, an arylsulfonyl group, an amino group, an alkylamino group, a hydroxy group, an acylamino group, an acyloxy group, a carboxy group, a carboxy group, an acyl group, a sulfonyl group, a cyano group, and a nitro group; any adjacent R1 to R18 may be bonded to each other to form a fused aliphatic ring or a condensed aromatic ring); X1 is an anionic group, and M1 is a cationic group).

Furthermore, examples of the first organic semiconductor material, the second organic semiconductor material, and the third organic semiconductor material contained in the organic photoelectric conversion layer 17 include quinacridone and a derivative thereof represented by the following formula (3).

[Chemical Formula 3]

(3)

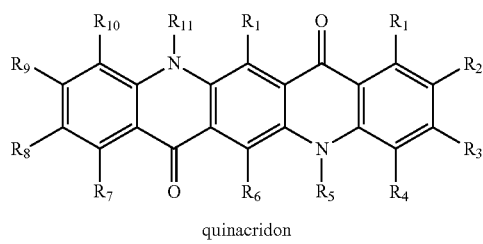

quinacridon (R1 to R11 are each independently a hydrogen atom, a halogen atom, a substituted or unsubstituted aryl group, a substituted or unsubstituted complex aryl group, a thioalkyl group, an arylsulfonyl group, an amino group, an alkylamino group, a hydroxy group, an acylamino group, an acyloxy group, a carboxy group, a carboxy group, an acyl group, a sulfonyl group, a cyano group, and a nitro group; any adjacent R1 to R11 may bind each other to form a condensed aliphatic ring or a condensed aromatic ring).

In addition, examples of the first organic semiconductor material, the second organic semiconductor material, and the third organic semiconductor material contained in the organic photoelectric conversion layer 17 include compounds represented by the following formulae (4-1) to (4-4).

[Chemical Formula 4]

(4-1)

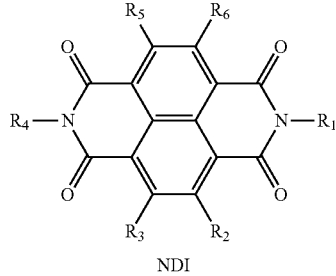

NDI (4-2)

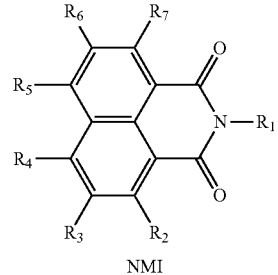

NMI (4-3)

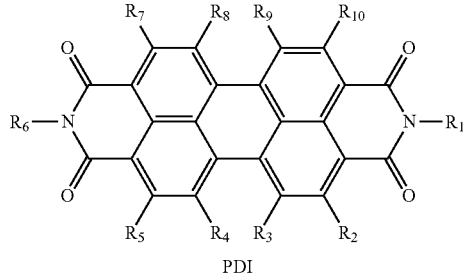

PDI (4-4)

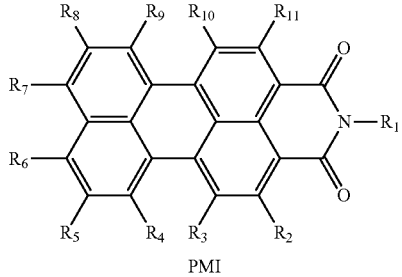

PMI (R1 to R11 are each independently a hydrogen atom, a halogen atom, a substituted or unsubstituted aryl group, a substituted or unsubstituted complex aryl group, a thioalkyl group, an arylsulfonyl group, an amino group, an alkylamino group, a hydroxy group, an acylamino group, an acyloxy group, a carboxy group, a carboxy group, an acyl group, a sulfonyl group, a cyano group, and a nitro group; any adjacent R1 to R11 may bind each other to form a condensed aliphatic ring or a condensed aromatic ring).

In addition, examples of the first organic semiconductor material, the second organic semiconductor material, and the third organic semiconductor material contained in the organic photoelectric conversion layer 17 include compounds represented by the following formula (5).

[Chemical Formula 5]

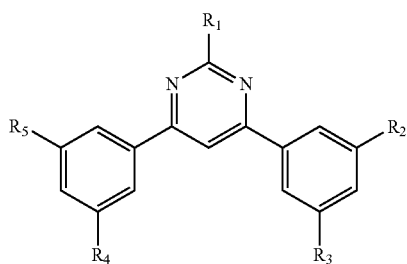

(5)

(R1 to R5 are each independently a hydrogen atom, a halogen atom, a substituted or unsubstituted alkyl group, a substituted or unsubstituted aryl group, a substituted or unsubstituted heteroaryl group, a thioalkyl group, a thioaryl group, an arylsulfonyl group, an alkylsulfonyl group, an amino group, an alkylamino group, a hydroxy group, an alkoxy group, an acylamino group, an acyloxy group, a carboxy group, a carboxyamido group, a carboxy group, an acyl group, a sulfonyl group, a cyano group, and a nitro group).

In addition, examples of the first organic semiconductor material, the second organic semiconductor material, and the third organic semiconductor material contained in the organic photoelectric conversion layer 17 include C60 fullerenes and derivatives thereof represented by the following formula (6-1). Furthermore, examples of the first organic semiconductor material, the second organic semiconductor material and the third organic semiconductor material include C70 fullerenes and derivatives thereof shown in the following formula (6-2). Incidentally, in the first to fifth embodiments, the fullerenes are handled as organic semiconductor materials.

[Chemical Formula 6]

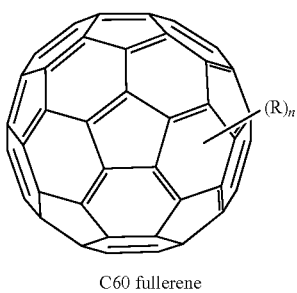

C60 fullerene (6-1)

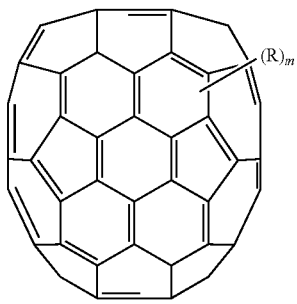

C70 fullerene (6-2)

(R is each independently a hydrogen atom, a halogen atom, a substituted or unsubstituted alkyl group, a substituted or unsubstituted aryl group, a substituted or unsubstituted heteroaryl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a carboxy group, a carboxyamide group, a carboxyl group, an acyl group, a sulfonyl group, a cyano group, and a nitro group; n, m is an integer of 0 or 1 or more; R may have a bond of two or more points with fullerene).

Furthermore, examples of the first organic semiconductor material, the second organic semiconductor material, and the third organic semiconductor material contained in the organic photoelectric conversion layer 17 include the compounds represented by the following formulae (7-1) and (7-2).

[Chemical Formula 7]

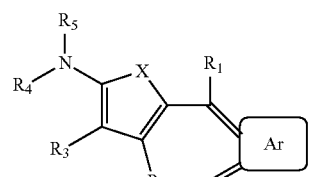

(7-1)

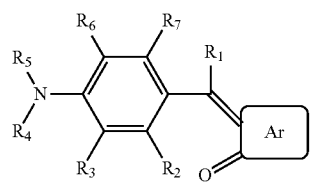

(7-2)

(Ar is selected from substituted or unsubstituted two or more fused rings, a substituted or unsubstituted five-membered aromatic ring, or a substituted or unsubstituted six-membered aromatic ring, R1 to R3, R6, and R7 are each independently selected from a hydrogen atom, a substituted or unsubstituted alkyl group, a substituted or unsubstituted aryl group, a substituted or unsubstituted heteroaryl group, a halogen, a cyano containing group, and a combination thereof. R4 and R5 are each independently a substituted or unsubstituted alkyl group and a substituted or unsubstituted heteroaryl group; in a case where R4 and R5 are each a substituted or unsubstituted alkyl base, each of which may bind to each other and form a ring with R3 to R6; where X is S, Se, Te, S(=O), or S(=O)2).

Furthermore, examples of the first organic semiconductor material, the second organic semiconductor material, and the third organic semiconductor material contained in the organic photoelectric conversion layer 17 include coumarin and derivatives thereof represented by the following formula (8).

[Chemical Formula 8]

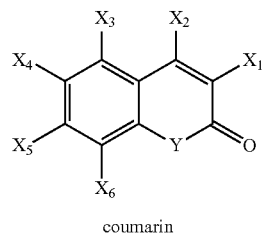

coumarin (Y represents an oxygen atom or a sulfur atom or a substituted or unsubstituted imino group, and X1 to X6 each independently represents a hydrogen atom, a halogen atom, a nitro group, a hydroxyl group, a carboxyl group, a sulfonyl group, a substituted or unsubstituted alkyl group, a substituted or unsubstituted aralkyl group, a substituted or unsubstituted arylthio group, a substituted or unsubstituted arylthio group, a substituted or unsubstituted alkylsulfonyl group, a substituted or unsubstituted alkylamino group, substituted or unsubstituted arylsulfonyl groups, substituted or unsubstituted acylamino groups, substituted or unsubstituted carboxamide groups, Substituted or unsubstituted acyloxy groups, substituted or unsubstituted alkoxycarbonyl groups, substituted or unsubstituted aralkyloxycarbonyl groups, substituted or unsubstituted aryloxycarbonyl groups, or alternatively substituted or unsubstituted amino groups, and each adjacent group selected from X1 to X6 may form a ring structure with the substituted carbon atom via a linking group).

As described above, in the bulk heterostructure forming the organic photoelectric conversion layer, the energy dispersion of the amorphous organic semiconductor material is generally large and the mobility is likely to decrease. In contrast, according to the photoelectric conversion element 10 of the first embodiment, since the organic photoelectric conversion layer 17 includes the first organic semiconductor material and the second organic semiconductor material, and at least one of the first organic semiconductor material or the second organic semiconductor material is formed of the organic molecules having the HOMO volume fraction or the LUMO volume fraction of about 0.15 or less, the energy dispersion of the amorphous organic semiconductor material forming the bulk heterostructure is low. Therefore, since high mobility can be obtained, excellent afterimage characteristics can be obtained.

Example

As calculation examples 1 to 7, the HOMO volume fractions and the LUMO volume fractions were calculated for pentacene represented by the above formulae (1 to 15), quinacridone represented by the above formula (3), the benzothienobenzothiophenone derivative (DPh-BTBT) represented by the following formula (9), F6-006F5 represented by the following formula (10), F6-OPh2,6F2 represented by the following formula (11), NTCD-Ph represented by the following formula (12), and B4PyMPM represented by the following formula (13)

[Chemical Formula 9]

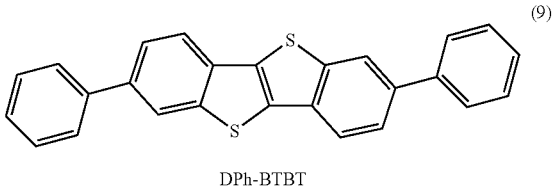

DPh-BTBT

[Chemical Formula 10]

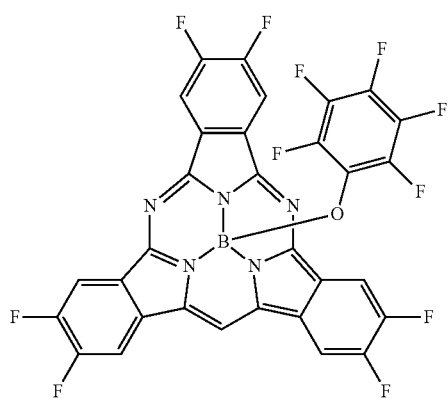

[Chemical Formula 11]

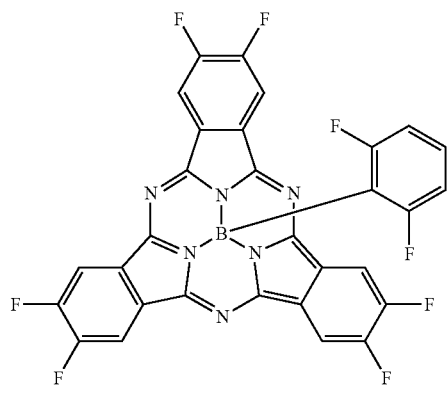

[Chemical Formula 12]

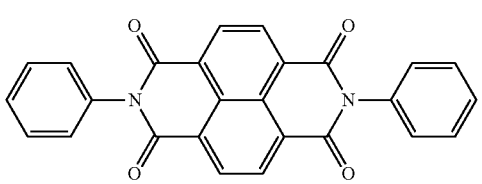

[Chemical Formula 13]

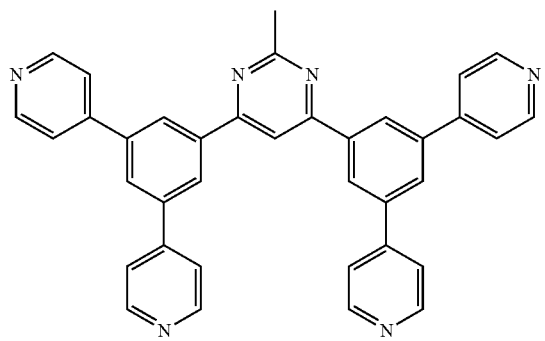

(13)

Calculations of the HOMO volume fraction and the LUMO volume fraction were carried out by a density functional method, a functional B3LYP and a ground state function 6-31G(d) were used in structural optimization of molecules, and a functional B3LYP and a basis function 6-311++G(d,p) were used in a molecular orbital and energy calculation. Subsequently, an amorphous structure of single composition, each containing about 500 molecules of these molecules, was generated by the molecular dynamics method. An arbitrary molecule was selected from the structure, and a peripheral molecule (molecular cluster) having a centroid within a radius of 12 Å centered on the molecule was taken out. An electron state of the molecular cluster is calculated by the density functional method to determine the energy levels (site energies) of the HOMO and LUMO levels of a central molecule. Similar calculations were carried out for all molecules to determine a site energy distribution. The site energy distribution is fitted by a Gaussian function to calculate the $\sigma_{HOMO}$ and the $\sigma_{LUMO}$. A relationship among the $\sigma_{HOMO}$, the $\sigma_{LUMO}$, the HOMO volume fraction, and the LUMO volume fraction is shown in Table 1.

TABLE 1

| | Molecule | $\sigma_{HOMO}$ | $\sigma_{LUMO}$ | HOMO Volume fraction | LUMO Volume fraction |
|---|---|---|---|---|---|
| Calculation example 1 | Pentacene | 0.26 | 0.27 | 0.20 | 0.22 |
| Calculation example 2 | Quinacridone | 0.24 | 0.24 | 0.19 | 0.18 |
| Calculation example 3 | DPh-BTBT | 0.18 | 0.19 | 0.15 | 0.15 |
| Calculation example 4 | F6-OC6F5 | 0.15 | 0.15 | 0.100 | 0.09 |
| Calculation example 5 | F6-OPh2,6F2 | 0.14 | 0.14 | 0.10 | 0.10 |
| Calculation example 6 | NTCD-Ph | 0.16 | 0.17 | 0.14 | 0.12 |
| Calculation example 7 | B4PyMPM | 0.12 | 0.14 | 0.10 | 0.08 |

As shown in Table 1, in Calculation examples 1 and 2, both the HOMO volume fraction and the LUMO volume fraction exceeded 0.15. On the other hand, in Calculated Examples 3 to 7, both the HOMO volume fraction and the LUMO volume fraction were 0.15 or less. Of these, in Calculations 4, 5, and 7, both the HOMO volume fraction and the LUMO volume fraction were 0.10 or less.

Figure 4:
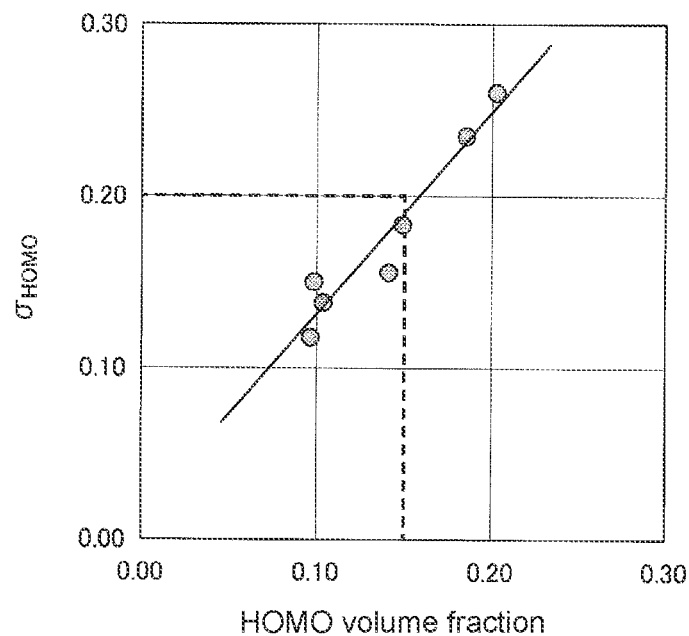
FIG. 4 is a graph showing a relationship between the $\sigma_{HOMO}$ and a HOMO volume fraction.
Figure 5:
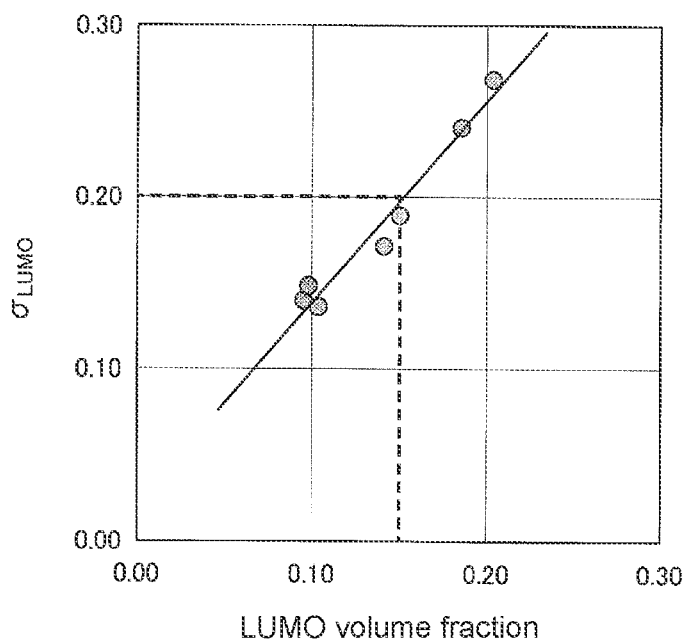
FIG. 5 is a graph showing a relationship between the $\sigma_{LUMO}$ and a LUMO volume fraction.

FIG. 4 shows a plot of the relationship between the $\sigma_{HOMO}$ and the HOMO volume fraction in Table 1, and FIG. 5 shows the relationship between the $\sigma_{LUMO}$ and the LUMO volume fraction in Table 1. As shown in FIGS. 4 and 5, there is an obvious correlation between the $\sigma_{HOMO}$ and the HOMO volume fraction and between the $\sigma_{LUMO}$ and the LUMO volume fraction. From FIG. 4, if the HOMO volume fraction is 0.15 or less, it can be seen that the $\sigma_{HOMO}$ can be suppressed to 0.2 eV or less. Furthermore, from FIG. 5, if the LUMO volume fraction is 0.15 or less, it can be seen that the $\sigma_{LUMO}$ can be suppressed to 0.2 eV or less. According to Non-Patent Literature 1, it is reported that the mobility of $1 \times 10^{-4}$ cm$^2$/V·s or more can be obtained by suppressing the standard deviation σ of the energy level to 0.2 eV or less. Therefore, by employing the organic molecules having the HOMO volume fraction or the LUMO volume fraction of 0.15 or less, the mobility of $1 \times 10^{-4}$ cm$^2$/V·s or more can be obtained, so that excellent afterimage characteristics can be obtained.

Second Embodiment

The photoelectric conversion element 10 according to a second embodiment also has the cross-sectional structure shown in FIG. 1, which is common to the structure of the photoelectric conversion element according to the first embodiment. However, the photoelectric conversion element 10 according to the second embodiment differs from the first embodiment in the configuration of the organic photoelectric conversion layer 17. Hereinafter, description will be given focusing on the configuration of the organic photoelectric conversion layer 17, and description of common portions with the first embodiment will be omitted.

As already described in the first embodiment, in the photoelectric conversion element using the organic semiconductor material, the bulk heterostructure in which the p-type organic semiconductor material and the n-type organic semiconductor material are mixed irregularly is employed to improve the quantum efficiency. However, it is a problem that the quantum efficiency is insufficient, a response speed is slow, and the dark current is large merely by providing the bulk heterostructure. In particular, as a factor of the dark current, it is supposed that, when a mixed state of the p-type organic semiconductor material and the n-type organic semiconductor material is poor, which results in a sparse film, photoelectric conversion efficiency is lowered due to a decrease of a material interface, carrier diffusion between materials is inhibited, a trap level is generation, etc. Therefore, the second embodiment provides a photoelectric conversion element capable of improving a mixed state of the p-type organic semiconductor material and the n-type organic semiconductor material and suppressing the dark current.

The photoelectric conversion element 10 according to the second embodiment includes the lower electrode (first electrode) 15a and the upper electrode (second electrode) 18 arranged to face each other, and the organic photoelectric conversion layer 17 provided between the lower electrode 15a and the upper electrode 18, as shown in FIG. 1. The organic photoelectric conversion layer 17 is formed of the organic semiconductor material having two or more different mother skeletons. The organic photoelectric conversion layer 17 may be formed of, for example, two types of the organic semiconductor materials, or may be formed of three or more types of the organic semiconductor materials. The organic semiconductor material forming the organic photoelectric conversion layer 17 contains the p-type semiconductor organic material and the n-type semiconductor organic material. The p-type semiconductor organic material functions relatively as the electron donor, while the n-type semiconductor organic material functions relatively as the electron acceptor.

At least one of the organic semiconductor materials forming the organic photoelectric conversion layer 17 may be a hole transporting material. The organic photoelectric conversion layer 17 desirably contains 30% by weight or more of the hole transporting material. The hole mobility of the hole-transporting material is about $1\times10^{-5}$ cm$^2$/V·s or more, preferably about $1\times10^{-4}$ cm$^2$/V·s or more, more preferably about $1\times10^{-2}$ cm$^2$/V·s or more.

In the second embodiment, m/n is 1 or more, where m is the film density of the organic photoelectric conversion layer 17, and n is the weighted average of the film density of the single film of each organic semiconductor material forming the organic photoelectric conversion layer 17 with respect to a composition. That is, by an interaction between each of the organic semiconductor materials forming the organic photoelectric conversion layer 17, the organic photoelectric conversion layer 17 is a state in which each of the organic semiconductor materials forming the organic photoelectric conversion layer 17 is equal to or denser the case in which each of the organic semiconductor materials is a single film. The m/n is preferably greater than 1.0, the m/n is more preferably 1.02 or more, and the m/n is still more preferably 1.04 or more.

The organic photoelectric conversion layer 17 is formed of the plurality of organic semiconductor materials and has the bulk heterostructure, and a difference occurs in the mixed state depending on a combination or a ratio of the materials. Such a mixed state is complicated because it is influenced by a spatial distribution, a molecular shape, an energy ranking, and the like of electrons of the material, but can be defined by a film density ratio of the single film and the mixed film. Even if single high-density materials are collected and a mixed film is formed, when there is no interaction between the materials or when the sparse film is formed, the carrier diffusion is inhibited or the trap level is generated at a domain interface, so that the organic photoelectric conversion layer 17 having good characteristics cannot be obtained.

On the other hand, even if the single film is sparse, it may become a dense mixed film by combining with different materials. As a factor thereof, it is conceivable that the interaction with other specific molecules is stronger than the interaction between the same molecules, or that a steric shape is a form that encourages a dense packing, and the like. In such an organic photoelectric conversion layer 17, an efficient photoelectric conversion and a carrier transfer can be realized by good adhesion between the materials, and the dark current can be reduced by reducing the interface state. A quality of the mixing property can be evaluated by the m/n described above, and if it is 1.0 or more by the definition, a combination (composition) of materials has a good mixing property.

As the organic semiconductor material forming the organic photoelectric conversion layer 17, for example, two or more kinds of the organic semiconductor materials such as quinacridone, chlorinated boron subphthalocyanine, pentacene, benzothienobenzothiophene, fullerene, and derivatives thereof are combined to be formed. The above-described organic semiconductor material functions as the p-type semiconductor or the n-type semiconductor depending on the combination thereof. Note that, as the organic semiconductor material forming the organic photoelectric conversion layer 17, for example, any one of naphthalene, anthracene, phenanthrene, tetracene, pyrene, perylene, and fluoranthene or a derivative thereof is suitably used. Alternatively, polymers such as phenylenevinylene, fluorene, carbazole, indole, pyrene, pyrrole, picoline, thiophene, acetylene, diacetylene, and the like and derivatives thereof may be used.

Furthermore, as the organic semiconductor material forming the organic photoelectric conversion layer 17, for example, a metal complex pigment material, a merocyanine-based pigment material, a phenylxanthene-based pigment material, a triphenylmethane-based pigment material, a rhodacyanine-based pigment material, a xanthene-based pigment material, a macrocyclic azaannulene-based pigment material, an azulene-based pigment material, naphthoquinone, an anthraquinone-based pigment material, a pigment material similar to the cyanine-based pigment material bonded by a chain compound in which a fused polycyclic aromatic such as anthracene and pyrene, and an aromatic ring or a heterocyclic compound is fused, or two nitrogen-containing heterocyclic rings such as quinoline, benzothiazole and benzooxazol having a squarylium group and a croconicumetin group as bonding chains or a squarylium group and a croconicumetin group, or the like can be desirably used. Note that, as the above-described metal complex pigment material, a dithiol metal complex-based pigment material, a metal phthalocyanine pigment material, a metal porphyrin pigment material, or a ruthenium complex pigment material is desirable, but it is not limited thereto.

As described above, the bulk heterostructure in which the p-type organic semiconductor material and the n-type organic semiconductor material are mixed irregularly has a problem of suppressing the dark current. With respect thereto, according to the second embodiment, when the film density of the organic photoelectric conversion layer 17 is m and the weighted average of the film density of the single film of each organic semiconductor material forming the organic photoelectric conversion layer 17 with respect to the composition is n, the combination and the composition of the organic semiconductor material in which m/n is 1 or more are selected. This makes it possible to make the mixed state of organic molecules in a bulk heterolayer denser. Therefore, the dark current can be reduced by lowering photoelectric conversion efficiency due to a decrease in the photoelectric convertible interface, efficient carrier diffusion between materials, and a decrease in the trap level.

Example

After a quartz glass substrate was cleaned by UV/ozone treatment, organic photoelectric conversion layers were formed by a resistive heating method using an organic evaporation device while a substrate holder was rotated under vacuum of $1\times10^{-5}$ Pa or less. First, respective single films of a quinacridone derivative (QD) shown in a formula (14-1), a quinacridone derivative (BQD) shown in a formula (14-2), a quinacridone derivative (MMQD) shown in a formula (14-3), a BP-ChDT shown in a formula (15), C60 shown in a formula (6-1), a F6-SubPc-F shown in a formula (16), and a subphthalocyanine derivative (F6-SubPc-OPh2, 6F2) shown in a formula (17) were formed as Samples 1 to 7. Thereafter, respective co-evaporation films having combinations of compounds and deposition rates of QD:F6-SubPc-F=5:5, QD:F6-SubPc-F=7:3, BQD:QD:F6-SubPc-F=3.5:3.5:3, BP-ChDT:C60:F6-SubPc-OPh2,6F2=3:4, BP-ChDT:C60:F6-SubPc-OPh2,6F2=4:24:4:2 was formed and Samples 8 to 12 were provided. The film thickness of each single film of Samples 1 to 7 was set to 50 nm, and the film thickness of each co-deposited film of Samples 8 to 12 was set to 230 nm.

[Chemical Formula 14]

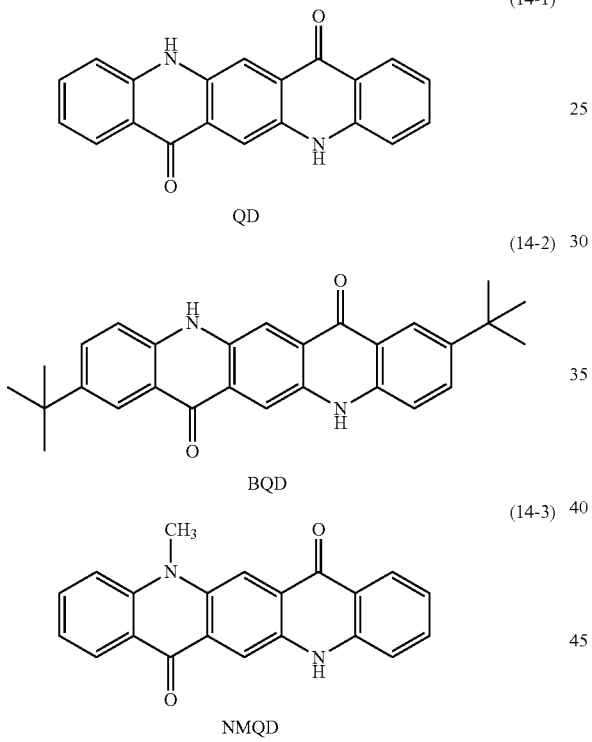

[Chemical Formula 15]

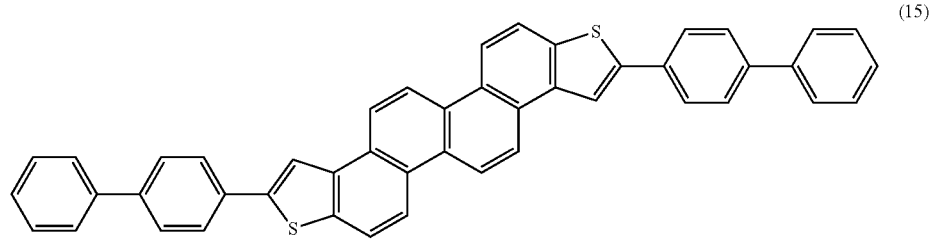

[Chemical Formula 16]

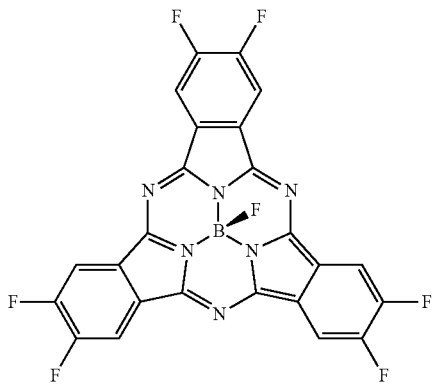

[Chemical Formula 17]

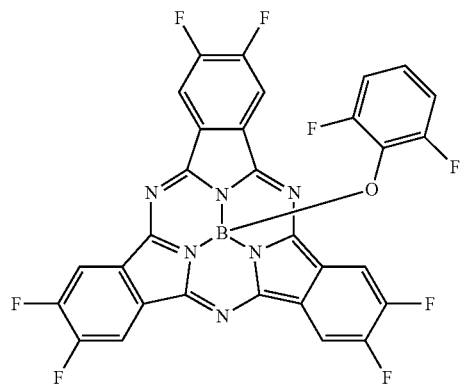

An X-ray reflectance (XRR) was used to calculate the film density of the single films of Samples 1 to 7 and the film density of the co-deposited films of Samples 8 to 12, respectively. The measurement conditions are shown in Table 2. A set value "2θ/θ" of a scan axis in Table 2 indicates that an oblique viewing angle of the X-ray with respect to Sample is scanned to be just half of a detector angle 2θ.

TABLE 2

| Setting item | Setting value |
|---|---|
| Apparatus | X-ray difractometer, D8 Discover µTXS, manufactured by Bruker Corp. |
| Scan axis | 2θ/θ |
| Scan range (2θ) | 0.2°~2.0° |
| Scan method | Step scan |
| Step interval | 0.002° |
| Integral time for one step | 1 sec |

The film densities of the single films of Samples 1 to 7, calculated from measurement results of the XRR, are shown in Table 3.

TABLE 3

| | Material | Film density(g/cm$^3$) |
|---|---|---|
| Sample 1 | QD | 1.41 |
| Sample 2 | BQD | 1.20 |
| Sample 3 | MMQD | 1.35 |
| Sample 4 | BP-ChDT | 1.23 |
| Sample 5 | C60 | 1.54 |
| Sample 6 | F6-SubPc-F | 1.51 |
| Sample 7 | F6-SubPc-OPh2,6F2 | 1.46 |

In addition, Table 4 shows the film densities m of the co-deposited films of Samples 8 to 12, the weighted averages n of the film densities calculated from the film densities and composition ratios of the single films of Samples 1 to 7, the ratios m/n of the film densities m to the weighted averages n, and the dark current characteristics with respect to Samples 8 to 12.

TABLE 4

| | Material and composition | m | n | m/n | Dark current (A/cm$^2$) |
|---|---|---|---|---|---|
| Sample 8 | QD:F6-SubPc-F = 5:5 | 1.34 | 1.46 | 0.92 | $9 \times 10^{-8}$ |
| Sample 9 | QD:F6-SubPc-F = 7:3 | 1.46 | 1.44 | 1.01 | $2 \times 10^{-9}$ |
| Sample 10 | BQD:QD: F6-SubPc-F = 3.5:3.5:3 | 1.14 | 1.36 | 0.84 | $6 \times 10^{-8}$ |
| Sample 11 | MMQD: BQD:F6-SubPc-F = 3:3:4 | 1.39 | 1.37 | 1.02 | $1 \times 10^{-10}$ |
| Sample 12 | BP-ChDT:C60:F6-SubPc-OPh2,6F2 = 4:4:2 | 1.45 | 1.40 | 1.04 | $2 \times 10^{-11}$ |

From Table 4, it can be seen that when the m/n is less than 1.0 as in Samples 8 and 10, the dark current becomes $10^{-8}$ A/cm$^2$ or more and the dark current characteristics are not good. On the other hand, when the m/n is 1.0 or more as in Samples 9, 11, and 12, the dark current is $10^{-9}$ A/cm$^2$ range or less, and it is understood that good dark current characteristics are obtained. Of these, when the m/n is 1.02 or more as in Samples 11 and 12, the dark current is $10^{-10}$ A/cm$^2$ range or less, and it is understood that more favorable dark current characteristics are obtained. Of these, when the m/n is 1.04 or more as in Sample 12, the dark current is $10^{-11}$ A/cm$^2$ range or less, and it is understood that much better dark current characteristics are obtained. In addition, it is understood that the m/n and the dark current characteristics are changed by making the compositions different even if the materials are the same as in Samples 8 and 9.

Third Embodiment

The photoelectric conversion element 10 according to a third embodiment also has the cross-sectional structure shown in FIG. 1, which is common to the structure of the photoelectric conversion element according to the first and second embodiments. However, the photoelectric conversion element 10 according to the third embodiment differs from the first and second embodiments in the configuration of the organic photoelectric conversion layer 17. Hereinafter, description will be given focusing on the configuration of the organic photoelectric conversion layer 17, and description of common portions with the first and second embodiments will be omitted.

As already described in the first and second embodiments, the organic photoelectric conversion layer 17 shown in FIG. 1 has the bulk heterostructure in which the p-type organic semiconductor material and the n-type organic semiconductor material are mixed irregularly. In the bulk heterolayer, the semiconductor materials are often present in an amorphous state. Generally, in the amorphous organic semiconductor, the carrier conduction energy level of each molecule varies spatially, as schematically shown in FIGS. 2 and 3. Since this varied profile becomes the energy barrier for the carrier mobility, the larger the energy dispersion σ of the carrier conduction energy level is, the lower the carrier mobility is. Generally, the amorphous organic semiconductor has low mobility because of its large energy dispersion σ compared with crystal. When the mobility is lowered, since the time required for the charge generated at the charge separation interface to reach the electrode becomes long, there is a problem that the afterimage characteristics of the photoelectric conversion element is lowered.

Incidentally, in the photoelectric conversion element used as a pixel or the like of the solid-state imaging device, an improvement of external quantum efficiency (EQE) is needed. In order to improve the EQE, it is desirable to improve an light absorption amount and charge separation efficiency of an exciton. Therefore, for example, in a bulk heterojunction type photoelectric conversion element, it is conceivable that light absorption efficiency per film volume is increased by further adding the pigment material to donor and acceptor materials. However, adding the pigment material may increase the aforementioned energy dispersion σ by coordinating to the donor or acceptor in the film. Therefore, in the third embodiment, by controlling the structure of the pigment material coordinated to the donor and the acceptor, a photoelectric conversion element is provided which achieves both suppression of lowering the afterimage characteristics and high EQE.

The photoelectric conversion element 10 according to the third embodiment includes, as shown in FIG. 1, the lower electrode (first electrode) 15a and the upper electrode (second electrode) 18 arranged to face each other, and the organic photoelectric conversion layer 17 provided between the lower electrode 15a and the upper electrode 18. The organic photoelectric conversion layer 17 includes first to third organic semiconductor materials having different mother skeletons. The first organic semiconductor material is the pigment material having an electron donating property, the second organic semiconductor material is the pigment material having an electron accepting property, and the third organic semiconductor material is the pigment material that absorbs light and is excited. The first organic semiconductor material and the second organic semiconductor material are formed of the p-type semiconductor organic material and the n-type semiconductor organic material, respectively. The p-type organic semiconductor material functions relatively as the electron donor, while the n-type organic semiconductor material functions relatively as the electron acceptor.

In the third embodiment, a ratio $N/N_A$ is about 0.5 or more in which the ratio is the number N of the second organic semiconductor material, which is only the most stable structure as a coordination structure with the third organic semiconductor material adjacent to the second organic semiconductor material, with respect to the total number $N_A$ of the second organic semiconductor material in the organic photoelectric conversion layer 17. The $N_A/N$ may be, for example, 0.5 or more and 1.0 or less, and the closer to 1.0 is desirable.

Figure 6A:
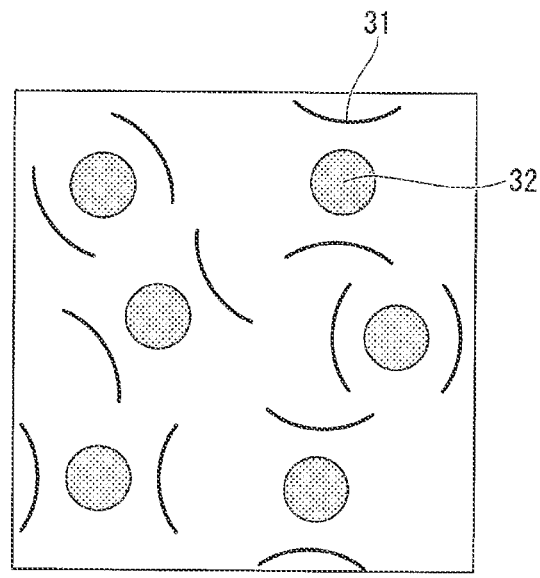
FIG. 6A is a conceptual diagram showing a state of mixture of different dimer structures.
Figure 6B:
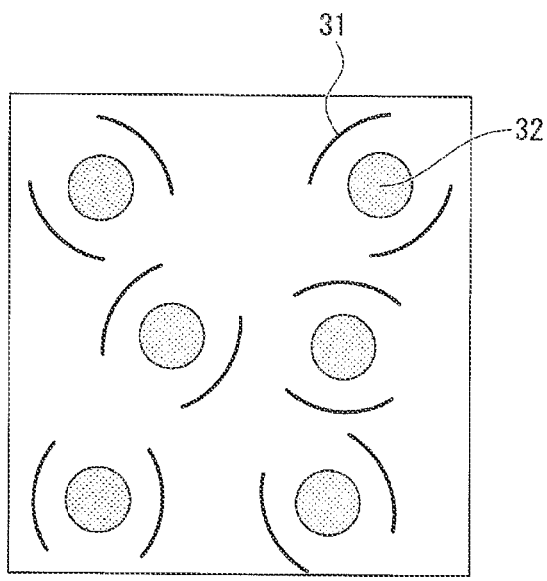
FIG. 6B is a conceptual diagram showing a dimer structures aligned.

Here, since the energy level of the organic semiconductor material changes due to the interaction with the organic material coordinated around the organic semiconductor material, there is a concern that a variation of the energy level increases and the electron mobility decreases due to the blending of the pigment material. In other words, as the pigment material to be blended into the organic photoelectric conversion layer, it is desirable that the interaction given to the organic semiconductor material is uniform. The interaction between the organic materials is changed by the coordination structure. In other words, it is desirable that the coordination structure between the pigment material and the organic semiconductor material contained in the optical conversion layer be one type as much as possible. FIG. 6A schematically shows a state in which the coordination structure of each third organic semiconductor material 31 that is the pigment material and the coordination structure of each second organic semiconductor material 32 are not aligned, and FIG. 6B schematically shows a state in which the coordination structure of each third organic semiconductor material 31 that is the pigment material and the coordination structure of each second organic semiconductor material 32 are aligned.

As an index in which the coordination structures in the organic photoelectric conversion layer 17 are aligned in one type, the deviation of the distribution of the coordination structures may be observed. The distribution of the coordination structures of the pigment material and the organic semiconductor in the organic photoelectric conversion layer 17 can be calculated by a computer simulation such as a quantum chemical calculation. In addition, the distribution of the coordination structures of the pigment material and the organic semiconductor can also be identified by experimental analysis. For example, if a peak separation derived from the orientation structures of the molecules can be performed by a spectroscopic analysis such as a Raman spectroscopy, an infrared spectroscopy (IR) and a photoluminescence (PL), the ratio of the coordination structures can be obtained from a peak intensity ratio. That is, it is in principle possible to calculate the coordination structure ratio of the pigment material and the organic semiconductor material present in the film from the experiment.

Figure 7:
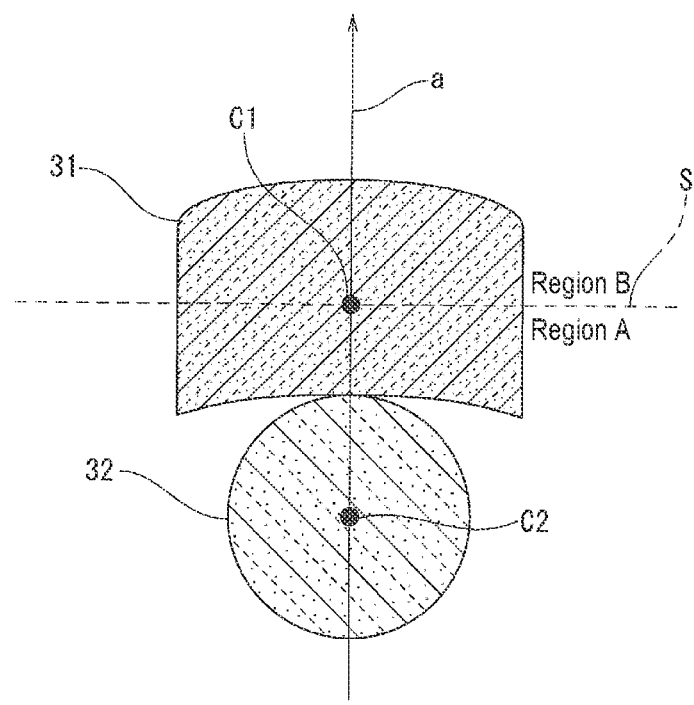
FIG. 7 is a conceptual diagram for explaining a definition of a segment surface or the like in a most stable dimer structure.

The $N/N_A$ can be determined, for example, as follows: First, as schematically shown in FIG. 7, a most stable dimer structure of the third organic semiconductor material 31 that is the pigment material and the second organic semiconductor material 32 is obtained by the quantum chemical calculation. FIG. 7 schematically shows a case where the third organic semiconductor material 31 is a bowl-shaped (umbrella-shaped) and the second organic semiconductor material 32 is substantially spherical. Furthermore, a segment surface S is defined which is perpendicular to an axis a passing through a center of gravity C1 of the third organic semiconductor material 31 and a center of gravity C2 of the second organic semiconductor material 32 in the dimer structure and which is segmented by a plane passing through the center of gravity C1 of the third organic semiconductor material 31. Furthermore, of two regions defined by the segment surface S, the region on the side where the second organic semiconductor material 32 is present is defined as a "region A", and the side where the second organic semiconductor material is not present is defined as a "region B". By the definition, any dimer structure can be classified into two; region A or region B.

Of the second organic semiconductor materials in the photoelectric conversion layer 17, the number of the second organic semiconductor materials 32 in which the second organic semiconductor materials 32 are present only in the region A as seen from the third organic semiconductor materials 31 adjacent to the second organic semiconductor materials 32 is $N_A$, and the total number of the second organic semiconductor materials 32 in the photoelectric conversion layer 17 is N, so that $N_A/N$ can be calculated. At this time, when the distance between the centers of gravity of the second organic semiconductor material 32 and the third organic semiconductor material 31 is within 1.0 nm, it is conceivable that the second organic semiconductor material 32 and the pigment material 31 are adjacent to each other.

Figure 8A:
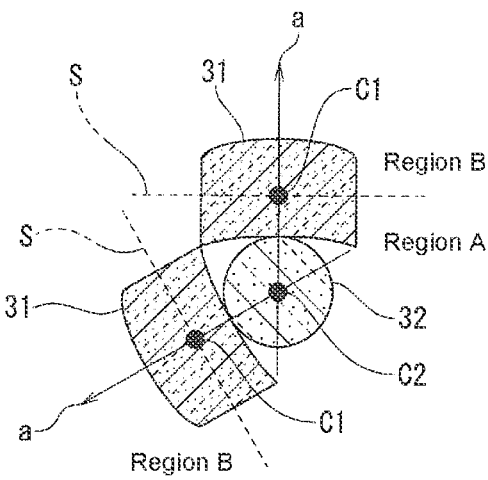
FIG. 8A is a conceptual diagram of a dimer structure when a second organic semiconductor material 32 is included in $N_A$.
Figure 8B:
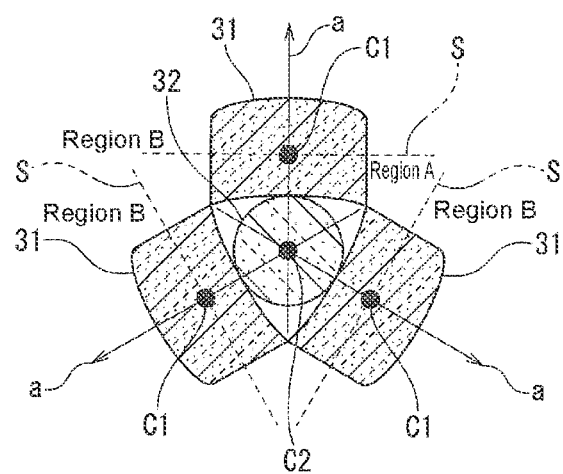
FIG. 8B is another conceptual diagram of a dimer structure when the second organic semiconductor material 32 is included in $N_A$.
Figure 8C:
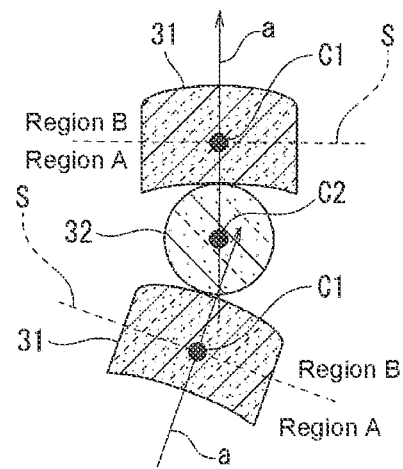
FIG. 8C is a conceptual diagram of a dimer structure when the second organic semiconductor material 32 is not included in $N_A$.

For example, in the most stable dimer structure shown in FIG. 7, the second organic semiconductor material 32 is included in $N_A$ because the second organic semiconductor material 32 is present only in the region A as seen from the third organic semiconductor material 31 adjacent to the second organic semiconductor material 32. Furthermore, as shown in FIGS. 8A to 8C, the dimer structure may be formed of the second organic semiconductor material 32 and a plurality of the adjacent third organic semiconductor materials 31. In each structure shown in FIGS. 8A and 8B, since the second organic semiconductor material 32 is present only in the region A as seen from the third organic semiconductor materials 31 adjacent to the second organic semiconductor material 32, each second organic semiconductor material 32 shown in FIGS. 8A and 8B is included in $N_A$. On the other hand, in the case of the structure shown in FIG. 8C, the second organic semiconductor material 32 is present in the region A when seen from the third organic semiconductor material 31 on an upper side, but the second organic semiconductor material 32 is present in the region B when seen from the third organic semiconductor material 31 on a lower side, so that the respective second organic semiconductor materials 32 shown in FIG. 8C are not included in $N_A$. In FIGS. 8A and 8B, two and three third organic semiconductor materials 31 adjacent to the second organic semiconductor material 32 are respectively illustrated, but four or more third organic semiconductor materials 31 adjacent to the second organic semiconductor material 32 may three-dimensionally present.

In order to get $N_A/N$ to 0.5 or more in the organic photoelectric conversion layer 17, it is effective to modify morphology of the organic photoelectric conversion layer 17. For example, the morphology of the organic photoelectric conversion layer 17 can be modified by adjusting a deposition temperature and a deposition rate of the organic photoelectric conversion layer 17 and a base of the organic photoelectric conversion layer 17. In addition, in the organic photoelectric conversion layer 17, in order to get $N_A/N$ to 0.5 or more, it is effective to improve a molecular structures of the pigment material. For example, by extremely stabilizing specific dimer structures in the third organic semiconductor material and the second organic semiconductor material, it is possible to align the structures in the organic photoelectric conversion layer 17. In addition, by making the structure of the third organic semiconductor material symmetrical and making the plurality of second organic semiconductor materials having the same coordination structure adjacent to one third organic semiconductor material, it is possible to increase the ratio which is only the most stable structure as the coordination structure.

As the first organic semiconductor material and the 2 organic semiconductor material contained in the organic photoelectric conversion layer 17, for example, two or more kinds of the organic semiconductor materials such as quinacridone, chlorinated boron subphthalocyanine, pentacene, benzothienobenzothiophene, fullerene, and derivatives thereof are combined and constituted. The organic semiconductor material functions as the p-type semiconductor or the n-type semiconductor depending on the combination thereof. Incidentally, as the first organic semiconductor material and the second organic semiconductor material contained in the organic photoelectric conversion layer 17, any one of naphthalene, anthracene, phenanthrene, tetracene, pyrene, perylene, and fluoranthene or a derivative thereof is suitably further used, for example. Alternatively, polymers such as phenylenevinylene, fluorene, carbazole, indole, pyrene, pyrrole, picoline, thiophene, acetylene, diacetylene, and the like and derivatives thereof may be used.

It is desirable that the third organic semiconductor material as the pigment material contained in the organic photoelectric conversion layer 17 has a high absorbance. As the third organic semiconductor material, a metal complex pigment material, a cyanine-based pigment material, a merocyanine-based pigment material, a phenylxanthene-based pigment material, a triphenylmethane-based pigment material, a rhodacyanine-based pigment material, a xanthene-based pigment material, a macrocyclic azaannulene-based pigment material, an azulene-based pigment material, naphthoquinone, an anthraquinone-based pigment material, similar to the cyanine-based pigment material bonded by a chain compound in which a fused polycyclic aromatic such as anthracene and pyrene, and an aromatic ring or a heterocyclic compound is fused, or two nitrogen-containing heterocyclic rings such as quinoline, benzothiazole and benzooxazol having a squarylium group and a croconicumetin group as bonding chains or a squarylium group and a croconicumetin group, or the like can be desirably used. Note that, as the above-described metal complex pigment material, a dithiol metal complex-based pigment material, a metal phthalocyanine pigment material, a metal porphyrin pigment material, or a ruthenium complex pigment material is desirable, but it is not limited thereto.

In addition, the mixing ratio of the first organic semiconductor material, the second organic semiconductor material, and the third organic semiconductor material contained in the organic photoelectric conversion layer 17 may be, for example, about 30% by weight of the first organic semiconductor material, about 30% by weight of the second organic semiconductor material, and about 40% by weight of the pigment material, but is not limited thereto.

As described above, in the photoelectric conversion element using the organic semiconductor material, it is conceivable to incorporate the pigment material in the organic photoelectric conversion layer in order to improve the EQE, but there is a concern that the variation of the energy level will be large and the afterimage characteristics will be lowered. On the other hand, according to the photoelectric conversion element 10 according to the third embodiment, in addition to the first and second organic semiconductor materials each having electron donating properties and electron accepting properties, the pigment material is blended as the third organic semiconductor material in the organic photoelectric conversion layer 17, whereby the light absorption efficiency can be increased and the photoelectric conversion efficiency can be improved. Furthermore, a combination of controlled coordination structures is selected, in which the ratio $N/N_A$ is 0.5 or more in which the ratio is the number N of the second organic semiconductor material, which is only the most stable structure as a coordination structure with the third organic semiconductor material adjacent to the second organic semiconductor material, with respect to the total number $N_A$ of the second organic semiconductor material in the organic photoelectric conversion layer 17. It is possible to suppress an increase in the energy dispersion, thereby preventing a decrease in the afterimage characteristics. Therefore, it is possible to provide the photoelectric conversion element 10 having both excellent afterimage characteristics and high EQE.

Example

First, C60 shown in the above formula (6-1) was employed as the second organic semiconductor material (n-type organic semiconductor material), and F6-OPh2,6F2 shown in the above formula (11) was employed as the third organic semiconductor material (pigment material), and the most stable dimer structure of C60 and F6-OPh2,6F2 was determined. The calculation was carried out by the density functional method, the functional B3LYP and the ground state function 6-31G(d) were used in the structural optimization of the molecule, and the functional B3LYP and the basis function 6-311++G(d,p) were used in the molecular orbital and energy calculation.

From the most stable dimer structure, a definition is made to characterize the coordination structure. First, as schematically shown in FIG. 7, the segment surface S is defined which is perpendicular to the axis a passing through the center of gravity C1 of F6-OPh2,6F2 as the third organic semiconductor material 31 and the center of gravity C2 of C60 as the second organic semiconductor material 32 in the dimer structure and which is segmented by the plane passing through the center of gravity C1. Furthermore, of two regions defined by the segment surface S, the region on the side where C60 as the second organic semiconductor material 32 is present is defined as the "region A", and the side where C60 as the second organic semiconductor material is not present is defined as the "region B". By the definition, any dimer structure can be classified into two; region A or region B.

Subsequently, in order to determine the distribution of the coordination structure, a binary dissolved amorphous structure containing about 1000 molecules of F6-OPh2,6F2 as the third organic semiconductor material 31 and about 1000 molecules of C60 as the second organic semiconductor material 32 was generated by the molecular dynamics method. The force field utilized by the molecular dynamics method utilized GAFF (General Amber Force Field) disclosed in Non-Patent Literature 3.

Figure 9:
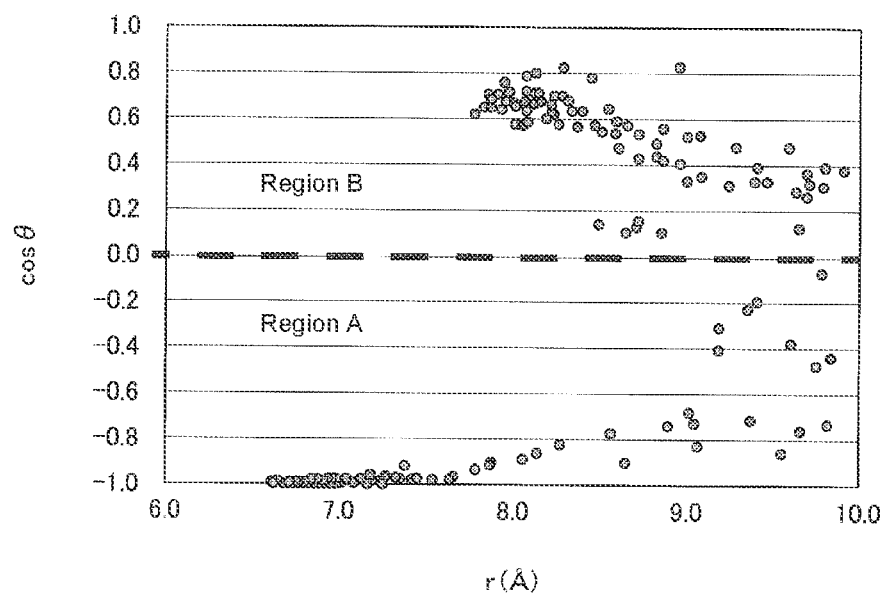
FIG. 9 is a graph showing a distribution of a coordination structure in a binary dissolved amorphous structure.
Figure 10A:
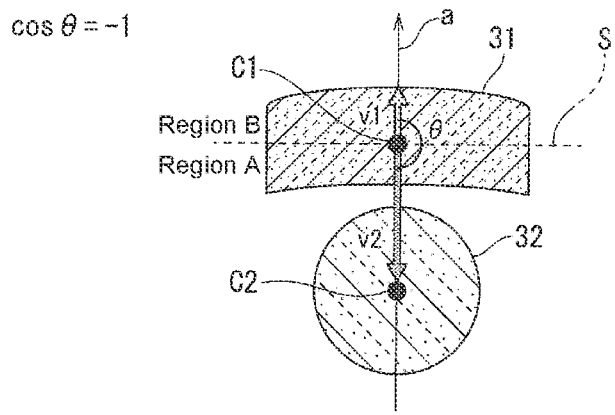
FIG. 10A is a conceptual diagram of the dimer structure when cos θ=−1.
Figure 10B:
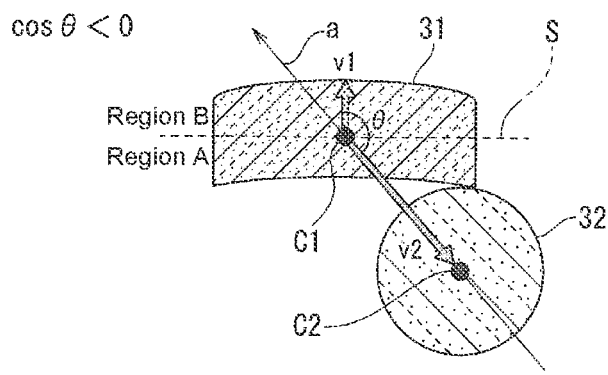
FIG. 10B is a conceptual diagram of the dimer structure when cos θ<0.
Figure 10C:
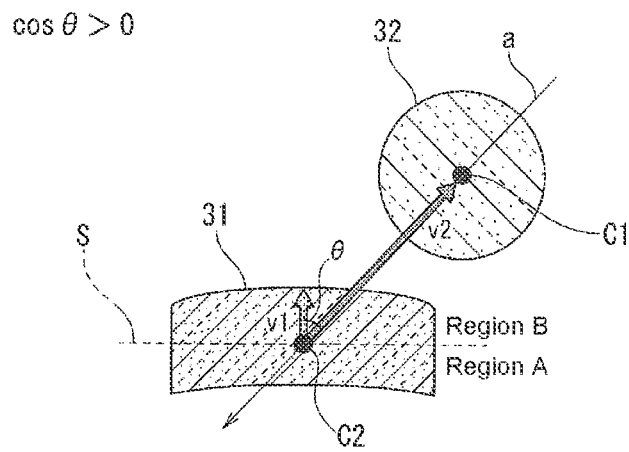
FIG. 10C is a conceptual diagram of the dimer structure when cos θ>0.

FIG. 9 shows the distribution of the coordination structure in the binary dissolved amorphous structure produced by the molecular dynamics method. The horizontal axis of FIG. 9 shows a distance r between the center of gravity of C60 as the second organic semiconductor material 32 and the center of gravity of F6-OPh2,6F2 as the third organic semiconductor material 31. The vertical axis of FIG. 9 shows an angle θ formed between a normal vector v1 in a region A direction with respect to the segment surface S of F6-OPh2,6F2 as the third organic semiconductor material 31 and a vector v2 connecting from the center of gravity C1 of C60 as the second organic semiconductor material 32 to the center of gravity C2 of F6-OPh2,6F2 as shown schematically in FIGS. 10A to 10C. Note that, from the definition of the divided segment surface S described above, cos θ=−1 corresponds to the most stable dimer structure as shown in FIG. 10A. As shown in FIG. 10B, the region of cos θ<0 corresponds to the region A, and as shown in FIG. 10C, the region of cos θ>0 corresponds to the region B. In FIG. 9, the periphery in which the points are densely packed in the region A can be extracted as the coordination structure close to the dimer structure in which C60 and F6-OPh2,6F2 are the most stable. On the other hand, the points in the region B become the coordination structure different from the stable dimer structure.

Next, the variation of the energy level of C60 in the above-described generated structure was evaluated. An arbitrary molecule was selected from the structure, and peripheral molecules (molecular cluster) having the center of gravity within a radius of 12 Å centered on the molecule were taken out. The electron state of the molecular cluster was calculated by the density functional method to determine the energy level (site energy) of the HOMO and LUMO levels of the central molecule. Similar calculation was performed for all C60 molecules to determine the distribution of site energy. The site energy distribution is fitted with the Gaussian function to calculate the standard deviation $\sigma_{LUMO}$ of the LUMO level.

Next, a relationship between the deviation of the distribution of the coordination structures and the $\sigma_{LUMO}$ of C60 was determined. As the deviation of the distribution of the coordination structures, the ratio $N_A/N$, which is only the most stable structure as the coordination structure with F6-OPh2,6F2 adjacent to C60, is used. Here, N represents the total number of C60, and $N_A$ represents the number of C60 when C60 is present only in the region A as seen from F6-OPh2,6F2 adjacent to C60. In addition, the definition of "adjacent" is to be within 1.0 nm of the distance between the centers of gravity. The relationship between $N_A/N$ and the $\sigma_{LUMO}$ of is shown in Table 5. In addition, FIG. 11 shows the plotted $N_A/N$ and $\sigma_{=0}$ of Table 5.

TABLE 5

| $N_A/N$ | $\sigma_{LUMO}$ (meV) |
|---|---|
| 0.2 | 102 |
| 0.50 | 93 |
| 1.0 | 78 |

Figure 11:
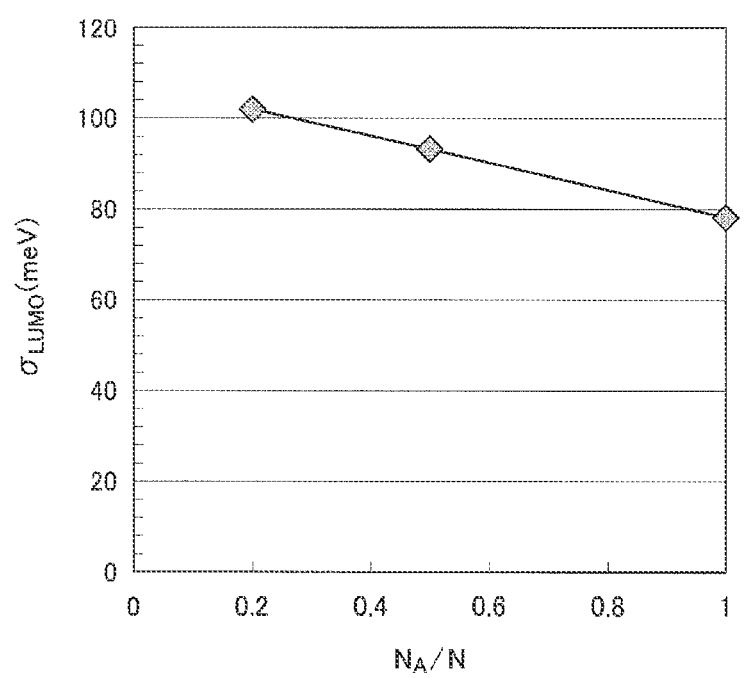
FIG. 11 is a graph showing of a relationship between the coordination structure and the $\sigma_{LUMO}$.

From Tables 5 and FIG. 11, it can be seen that the $N_A/N$ and the $\sigma_{LUMO}$ have an obvious correlation. According to Non-Patent Literature 2, it is reported that the standard deviation σ of the energy level increases by about 25 meV, to thereby decreasing the mobility by about one order of magnitude. From Table 5, there is a difference of 24 meV between 0.2 of the $N_A/N$ and 1.0 of the $N_A/N$, and it is expected that it causes a difference of the mobility by approximately one order of magnitude. Here, in the condition of $N_A/N=1.0$, the coordination structures of the pigment materials with respect to all the organic semiconductors, which is the condition of the highest mobility, are all the same. Furthermore, it can be seen that with respect to the condition that the $N_A/N$ is 0.2, in order to double or more the mobility, it is sufficient to improve the $N_A/N$ to 0.5 or more.

Fourth Embodiment

The photoelectric conversion element 10 according to a fourth embodiment also has the cross-sectional structure shown in FIG. 1, which is common to the structure of the photoelectric conversion element according to the first to third embodiments. However, the photoelectric conversion element 10 according to the fourth embodiment differs from the first to third embodiments in the configuration of the organic photoelectric conversion layer 17. Hereinafter, description will be given focusing on the configuration of the organic photoelectric conversion layer 17, and description of common portions with the first to third embodiments will be omitted.

As already described in the third embodiment, in the photoelectric conversion element used as the pixel or the like of the solid-state imaging device, the improvement of the external quantum efficiency (EQE) is needed. In order to improve the EQE, it is desirable to improve the light absorption amount and the charge separation efficiency of the exciton. Therefore, for example, in the bulk heterojunction type photoelectric conversion element, it is conceivable that the light absorption efficiency per film volume is increased by further adding the pigment material to the donor and acceptor materials.

However, in a case where the pigment material is segregated at the bonding interface between the donor and the acceptor or dispersed in the organic semiconductor material, it is necessary to limit a blending amount of the pigment material to 10% or less of the donor and acceptor components, or mass content or less of the organic semiconductor material. Therefore, it is difficult to increase the blending amount of the pigment material. Therefore, the fourth embodiment provides a photoelectric conversion element capable of improving the EQE by improving the light absorption efficiency by increasing the blending amount of the pigment material.

Figure 12:
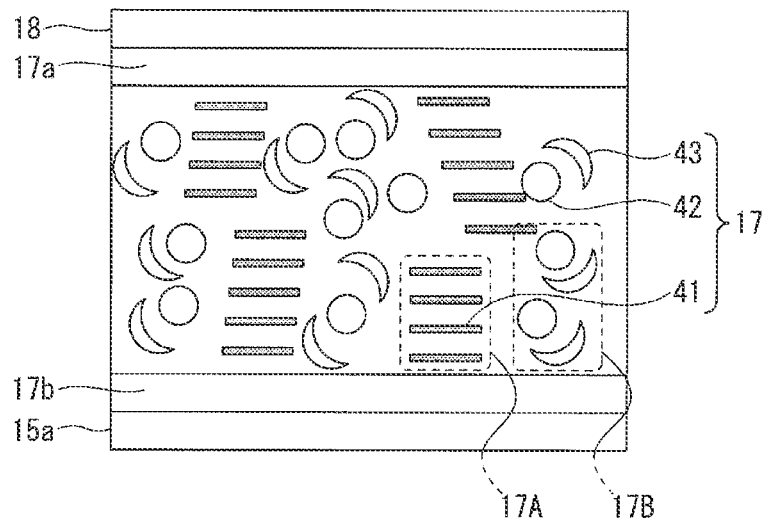
FIG. 12 is a conceptual diagram of a photoelectric conversion layer and the like according to a second embodiment.

The photoelectric conversion element 10 according to the fourth embodiment includes the lower electrode (first electrode) 15a and the upper electrode (second electrode) 18 arranged to face each other, and the organic photoelectric conversion layer 17 provided between the lower electrode 15a and the upper electrode 18, as schematically shown in FIG. 12. An electron transport layer 17a is provided between the upper electrode 18 and the organic photoelectric conversion layer 17. A hole transport layer 17b is provided between the lower electrode 15a and the organic photoelectric conversion layer 17.

The organic photoelectric conversion layer 17 includes a first organic semiconductor material 41, a second organic semiconductor material 42, and a third organic semiconductor material 43 having different mother skeletons. The first organic semiconductor material 41 is the pigment material having the electron donating property, the second organic semiconductor material 42 is the pigment material having the electron accepting property, and the third organic semi-conductor material 43 is the pigment material that absorbs light and is excited. The organic photoelectric conversion layer 17 has a first domain 17A formed of only the first organic semiconductor material 41, and a second domain 17B in which the second organic semiconductor material 42 and the third organic semiconductor material 43 are uniformly dissolved to each other.

Figure 13:
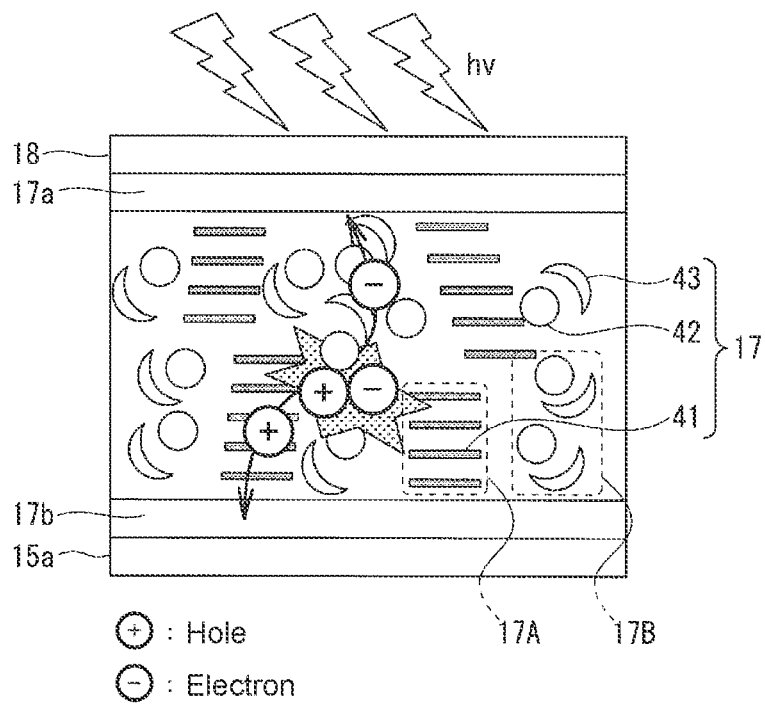
FIG. 13 is a conceptual diagram at the time of light reception of the photoelectric conversion layer and the like according to the second embodiment.

The first organic semiconductor material 41 is desirably crystalline, and as schematically shown in FIG. 13, the first domain 17A in a crystal fine particle state forms a hole transport path. The first organic semiconductor material 41 is formed of the p-type semiconductor organic material. The p-type semiconductor organic material functions relatively as the electron donor. The second organic semiconductor material 42 is formed of the n-type semiconductor organic material. The n-type semiconductor organic material functions relatively as an electron acceptor.

In the organic photoelectric conversion layer 17, the mass content of the third organic semiconductor material 43 is desirably larger than the mass content of the second organic semiconductor material 42. For example, as the mixing ratio of the first organic semiconductor material 41, the second organic semiconductor material 42, and the third organic semiconductor material 43 forming the organic photoelectric conversion layer 17, 30% by mass of the first organic semiconductor material 41, 30% by mass of the second organic semiconductor material 42, and 40% by mass of the third organic semiconductor material 43 are exemplified, but it is not limited to the values.

The first organic semiconductor material 41 and the second organic semiconductor material 42 contained in the organic photoelectric conversion layer 17 are formed by combining two or more kinds of the organic semiconductor materials such as quinacridone, chlorinated boron subphthalocyanine, pentacene, benzothienobenzothiophene, fullerene, and derivatives thereof, for example. The organic semiconductor materials function as the p-type semiconductor or the n-type semiconductor depending on the combination thereof. Incidentally, as the first organic semiconductor material 41 and the second organic semiconductor material 42 contained in the organic photoelectric conversion layer 17, naphthalene, anthracene, phenanthrene, tetracene, pyrene, perylene, and any one of fluoranthene or derivatives thereof is further suitably used, for example. Alternatively, a polymer such as phenylenevinylene, fluorene, carbazole, indole, pyrene, pyrrole, picoline, thiophene, acetylene, diacetylene, and the like and derivatives thereof may be used.

As the third organic semiconductor material 43, for example, a metal complex pigment material, a merocyanine-based pigment material, a phenylxanthene-based pigment material, a triphenylmethane-based pigment material, a rhodacyanine-based pigment material, a xanthene-based pigment material, a macrocyclic azaannulene-based pigment material, an azulene-based pigment material, naphthoquinone, an anthraquinone-based pigment material, a pigment material similar to the cyanine-based pigment material bonded by a chain compound in which a fused polycyclic aromatic such as anthracene and pyrene, and an aromatic ring or a heterocyclic compound is fused, or two nitrogen-containing heterocyclic rings such as quinoline, benzothiazole and benzooxazol having a squarylium group and a croconicumetin group as bonding chains or a squarylium group and a croconicumetin group, or the like can be desirably used. Note that, as the above-described metal complex pigment material, a dithiol metal complex-based pigment material, a metal phthalocyanine pigment material, a metal porphyrin pigment material, or a ruthenium complex pigment material is desirable, but it is not limited thereto.

Figure 14A:
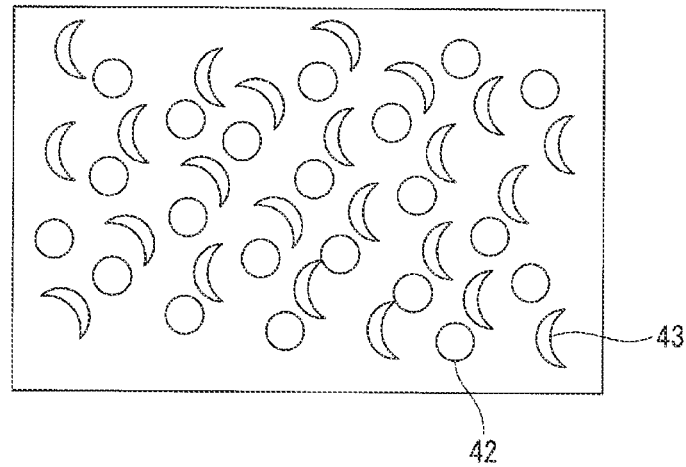
FIG. 14A is a conceptual diagram of a dissolved state within a second domain.

In the fourth embodiment, the second organic semiconductor material 42 and the third organic semiconductor material 43 are uniformly dissolved (miscible) at the molecular level, and a self-association and a self-aggregation of each of the second organic semiconductor material 42 and the third organic semiconductor material 43 are suppressed. In the second domain 17B, the state in which the second organic semiconductor material 42 and the third organic semiconductor material 43 are uniformly dissolved to each other means a state in which the second organic semiconductor material 42 and the third organic semiconductor material 43 do not form the self-association or the self-aggregation, and are uniformly mixed into one phase, as schematically shown in FIG. 14A. Specifically, in any region within the second domain 17B, the second organic semiconductor material 42 and the third organic semiconductor material 43 are close to each other with an intermolecular distance of less than 1.5 nm.

Figure 14B:
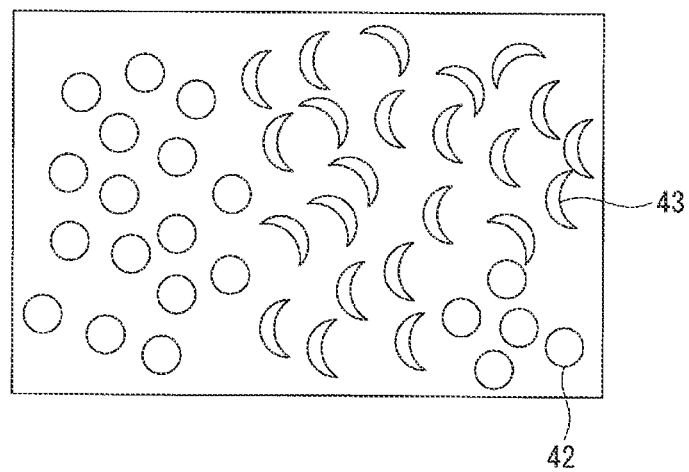
FIG. 14B is a conceptual diagram of a phase separation state within the second domain.

To the contrary, a state in which the second organic semiconductor material 42 or the third organic semiconductor material 43 forms each phase by the self-association or the self-aggregation is referred to as a phase separation state. As schematically shown in FIG. 14B, in the phase separation state, the second organic semiconductor material 42 and the third organic semiconductor material 43 are close to each other only at the interfacial where each phase contacts, but cannot be close to each other inside the phase. That is, the composition of the second organic semiconductor material 42 and the third organic semiconductor material 43 in the second domain 17B is not constant, there are many sites where intermolecular distance becomes 1.5 nm or more.

The effect that the second organic semiconductor material 42 and the third organic semiconductor material 43 forming the second domain 17B are uniformly dissolved to each other will be described. When the third organic semiconductor material 43 forms the self-association or the self-aggregation, it is conceivable that absorption different from the desired absorption is generated by an association, or the charge separation efficiency of the exciton is lowered. When the second organic semiconductor material 42 forms the self-association or the self-aggregation, energy level different from the dispersed state is generated. This can be a trap or an inhibition factor of an energy transfer.

Therefore, by uniformly dissolving the second organic semiconductor material 42 and the third organic semiconductor material 43 at the molecular level as shown in FIG. 14A, these disadvantages can be suppressed. Furthermore, since the distance between the second organic semiconductor materials 42 is also kept constant, an electron transport path is also ensured as shown in FIG. 13. By employing such a structure, it becomes unnecessary to limit the blending amount of the third organic semiconductor material 43, as compared with the case where the pigment material is segregated at the bonding interface between the donor and the acceptor or dispersed in the organic semiconductor material. Since the third organic semiconductor material 43 has an effect of sensitizing the light absorption, it is desirable to increase the blending amount of the second organic semiconductor material 42, to thereby increase the light absorption efficiency.

Incidentally, forming such a dissolved (miscible) state by the second organic semiconductor material 42 and the third organic semiconductor material 43 forming the second domain 17B can be confirmed by producing an organic photoelectric conversion layer 17, so that an emission peak of the third organic semiconductor material 43 itself is not observed, and only an emission peak of the second organic semiconductor material 42 is observed by measuring photoluminescence (PL) excited at a wavelength of a visible range absorption band of the third organic semiconductor material 43. When the second organic semiconductor material 42 and the third organic semiconductor material 43 are sufficiently close, the excitons of the third organic semiconductor material 43 excited by light irradiation are energetically transferred to the second organic semiconductor material 42 by FORSTER or DEXTER mechanism. When this energy transfer occurs, the emission peak of the third organic semiconductor material 43 itself disappears, and only the emission peak of the second organic semiconductor material 42 is observed. In the second domain 17B, when the second organic semiconductor material 42 or the third organic semiconductor material 43 forms the self-association or the self-aggregation and is not in a uniform dissolved state, the energy transfer from the third organic semiconductor material 43 to the second organic semiconductor material 42 becomes insufficient, and the emission peak of the third organic semiconductor material 43 itself is observed.

In a PL spectrum of the organic photoelectric conversion layer 17 excited at a wavelength of a visible absorption band of the third organic semiconductor material 43, not observing the emission peak of the third organic semiconductor material 43 but observing only the emission peak of the second organic semiconductor material 42 can be determined by A/B<0.1 where A denotes a maximum emission intensity of the emission peak of the third organic semiconductor material 43 and B denotes a maximum emission intensity of the emission peak of the other wavelength range derived from the second organic semiconductor material 42. At this time, Raman scattering of the third organic semiconductor material 43 may be observed in the wavelength range where the emission peak of the third organic semiconductor material 43 is observed, but this is not included in a local maximum emission intensity. The Raman scattering can be confirmed by the fact that a peak half-width is sufficiently narrow (half-width is 3 nm or less). When the Raman scattering overlaps the maximum wavelength, the value of the peak start point of the Raman scattering is taken as the emission maximum intensity.

In addition, the third organic semiconductor material 43 has a maximum absorption wavelength in a wavelength range of, for example, 500 nm or more and 600 nm or less. In addition, the third organic semiconductor material 43 has a maximum emission intensity in a wavelength range of, for example, 520 nm or more and 580 nm or less. Furthermore, the second organic semiconductor material 42 has a maximum emission intensity in a wavelength range of, for example, 710 nm or more and 740 nm or less. In addition, the second organic semiconductor material 42 may be fullerene or a fullerene derivative, and in this case, in the PL spectrum of the photoelectric conversion layer 17 excited by a wavelength of a visible absorption band of the third organic semiconductor material 43, the maximum wavelength in the wavelength range of 710 nm or more and 740 nm or less is 720 nm or less.

When the second organic semiconductor material 42 is fullerene or a fullerene derivative, dissolubility between the second organic semiconductor material 42 and the third organic semiconductor material 43 of the second domain 17B can also be confirmed by the position of the maximum wavelength of the emission peak derived from the second organic semiconductor material 42. When the second organic semiconductor material 42 is fullerene, the emission peak maximum wavelength of a fullerene single film is about 735 nm. In the fullerene single film, it is conceivable that molecules of fullerene are adjacent to each other and take a physically aggregated state. The present inventors have empirically found that when the fullerene is diluted with the third organic semiconductor material 43 and the concentration in the film is lowered, the emission maximum wavelength is shortened to 720 nm or less by sufficiently dispersing the fullerene. Therefore, when the second organic semiconductor material 42 is fullerene, the maximum emission wavelength of the second organic semiconductor material 42 is 720 nm or less, which is an index of determining that the self-aggregation of the second organic semiconductor material 42 is suppressed and a state in which the second organic semiconductor material 42 and the third organic semiconductor material 43 are uniformly dissolved to each other in the second domain 17B is formed. Since fullerene can be vapor-deposited and is inexpensive, it is a material expected to be applied to the industry, and it is suitable to employ fullerene as the second organic semiconductor material 42.

As described above, according to the photoelectric conversion element 10 of the fourth embodiment, the light absorption efficiency can be improved by blending the pigment material as the third organic semiconductor material 43 in the bulk heterojunction type organic photoelectric conversion layer 17. Furthermore, by controlling morphology of the donor and the acceptor to uniformly dissolve the second organic semiconductor material 42 and the third organic semiconductor material 43, deactivation due to the self-aggregation of the third organic semiconductor material 43 itself or the self-aggregation of the second organic semiconductor material 42 itself can be suppressed. Furthermore, the intermolecular distance between the second organic semiconductor materials 42 is kept constant by uniformly dissolving the second organic semiconductor material 42 and the third organic semiconductor material 43 at the molecular level, and the electron transport path can be ensured even if a self-domain or crystal fine particles of the second organic semiconductor material 42 is not formed. In addition, since the third organic semiconductor material 43 does not need to be segregated at the interface between the donor and the acceptor, there is no limitation on the blending amount, and the light absorption amount can be increased.

Furthermore, a crystal grain size of the first organic semiconductor material 41 is desirably about 5 nm or more and 20 nm or less. By the 20 nm or less, it is possible to realize the charge separation of the exciton at the interface between the second domain 17B and the first domain 17A formed of the second organic semiconductor material 42 and the third organic semiconductor material 43. Furthermore, from the viewpoint of improving the EQE, it is desirable that the crystal grain size of the first organic semiconductor material 41 is about 11.5 nm or more and 12.9 nm or less. The crystal grain size of the first organic semiconductor material 41 can be calculated, for example, by an X-ray diffraction method.

Example

[Method of Preparing Samples in Experimental Examples 1 to 3]

Figure 15:
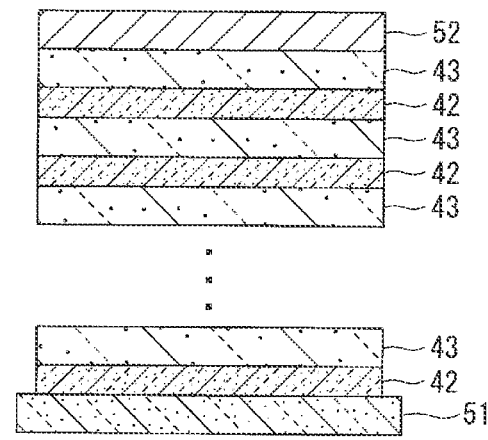
FIG. 15 is a cross-sectional view showing a sample structure of Experimental Examples 1 to 3.

Each sample of Experimental Examples 1 to 3 was made by the following procedure. An ITO film having a thickness of 100 nm was formed on a quartz substrate using a sputtering apparatus, and an ITO film was patterned by photolithography and etching to form a lower electrode. After the substrate was cleaned by the UV/ozone treatment, the substrate was transferred to a vacuum evaporator, and an organic material film was formed by the resistive heating method while the substrate holder was rotated under a reduced pressure of $1 \times 10^{-5}$ Pa or less. Next, the third organic semiconductor material 43 was F6-SubPc-OPh2, 6F2 shown in the above formula (17), the second organic semiconductor material 42 was C60 shown in the above formula (6-1), the deposition rate of the third organic semiconductor material 43 was 0.50 Å/sec, the deposition rate of the second organic semiconductor material 42 was 0.25 Å/sec, as shown schematically in FIG. 15, the second organic semiconductor material 42 was formed with a thickness of X nm, the third organic semiconductor material 43 was formed with a thickness of Y nm, the second organic semiconductor material 42 was formed with a thickness of X nm, the third organic semiconductor material 43 was formed with a thickness of Y nm, . . . , on the substrate 51 by alternately laminating until a total film thickness becomes 45 nm, thereafter ITO was formed with a thickness of 50 nm to form an upper electrode 52. Experimental Example 1 was set to (X, Y)=(1, 2), Experimental Example 2 was set to (X, Y)=(1.5, 3), and Experimental Example 3 was set to (X, Y)=(3, 6).

[PL Measurement]

A PL measurement was performed on each of Experimental Examples 1 to 3. Using a Raman spectroscopic apparatus and a YAG laser with a wavelength of 532 nm for excitation, the measurement wavelength range was 500 to 1000 nm. Since the organic film was damaged by intense irradiation with the laser, a minimum amount of light with which the emission spectrum was confirmable was adjusted by using an ND filter, and the measurement was performed by irradiating light from above the ITO. The F6-SubPc-OPh2,6F2 as the third organic semiconductor material 43 used in Experimental Examples 1 to 3 was an organic semiconductor material which absorbs a wavelength range of 500 nm to 600 nm, i.e., green light. The excitation wavelength was 532 nm included in the wavelength range of 500 nm to 600 nm. The emission peak of the third organic semiconductor material 43 excited at a wavelength of 532 nm is observed in the region of 520 to 580 nm.

Figure 16:
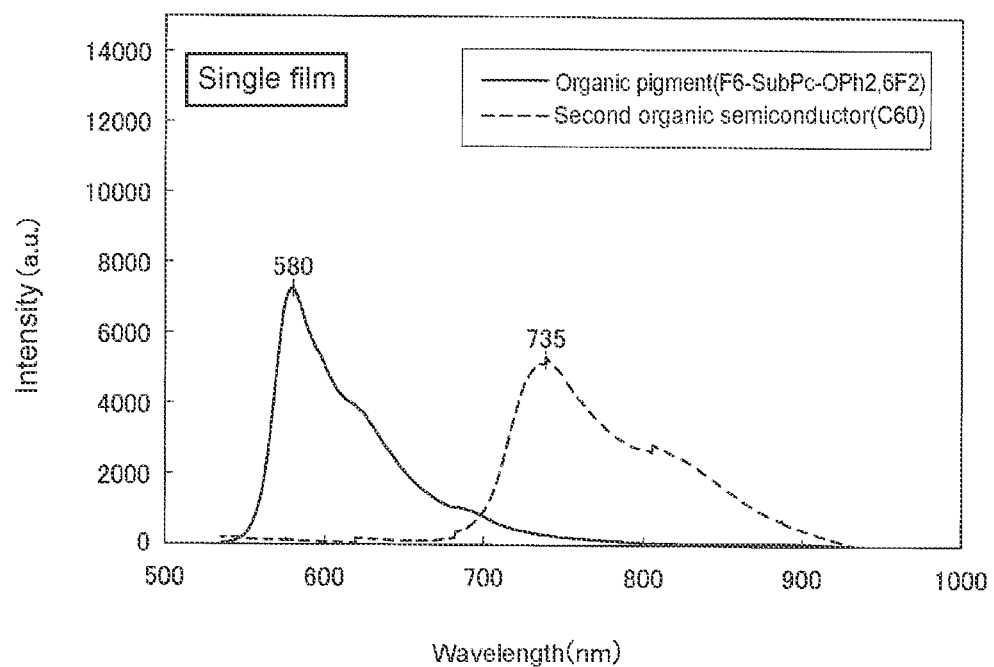
FIG. 16 is a graph showing photoluminescence (PL) spectra of single films.

FIG. 16 shows PL spectra of a single film of F6-SubPc-OPh2,6F2, which is the third organic semiconductor material 43, and a single film of C60, which is the second organic semiconductor material 42, measured at an exciting wavelength of 532 nm. The maximum wavelength of the emission peak of F6-SubPc-OPh2,6F2, which is the third organic semiconductor material 43, is 580 nm. The maximum wavelength of the emission peak of C60, which is the second organic semiconductor material 42, is 735 nm.

Figure 17:
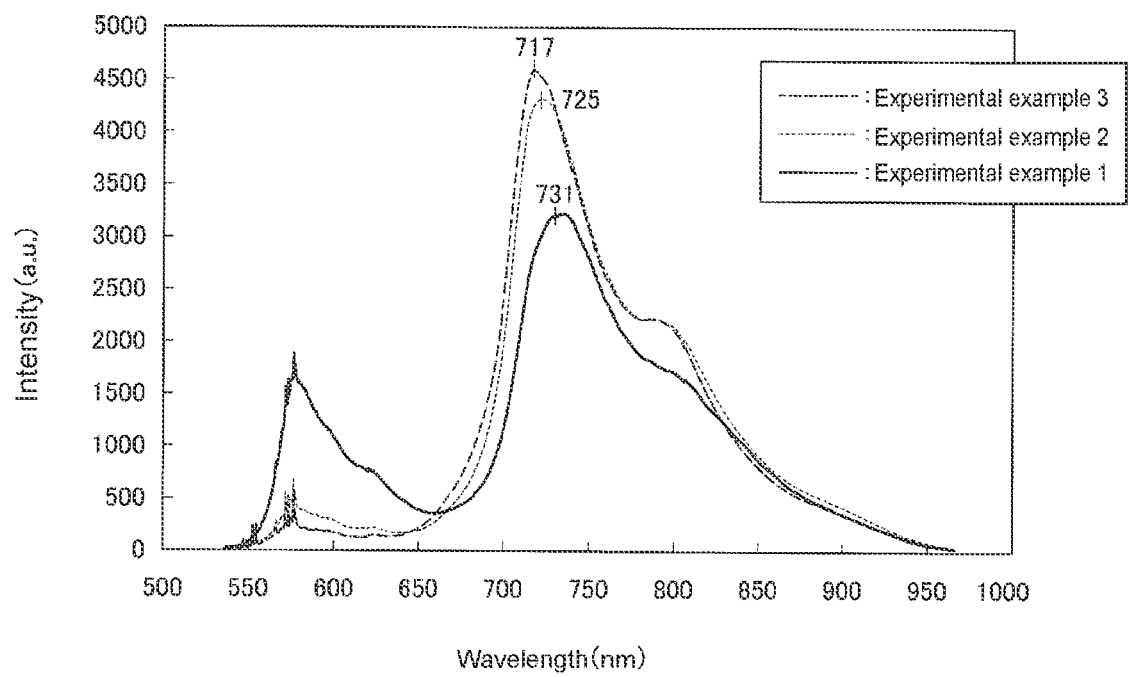
FIG. 17 is a graph showing the PL spectra of active layers of Experimental Examples 1 to 3.

FIG. 17 shows the PL spectrum measurement results of Experimental Examples 1 to 3. In each multilayer structure of Experimental Examples 1 to 3, the inter-molecular distance between the second organic semiconductor material 42 and the third organic semiconductor material 43 is the maximum (Y+X)/2 nm. In other words, since 4.5 nm is obtained in Experimental Example 1, 2.25 nm is obtained in Experimental Example 2, and 1.5 nm is obtained in Experimental Example 3, the intermolecular distance between the second organic semiconductor material 42 and the third organic semiconductor material 43 becomes less than 1.5 nm only in Experimental Example 3. From the PL spectra of FIG. 17, it can be seen that the emission peak of the third organic semiconductor material 43 is clearly observed in Experimental Example 1, but the emission peak of the third organic semiconductor material 43 becomes smaller in Experimental Examples 2 and 3.

Table 6 shows results of A/B calculated in the PL spectra of Experimental Examples 1 to 3. It is understood that only Experimental Example 3 in which the intermolecular distance between the second organic semiconductor material 42 and the third organic semiconductor material 43 is less than 1.5 nm satisfies A/B<0.1.

TABLE 6

| | X(nm) | Y(nm) | A/B | Maximum emission wavelength of second organic semiconductor material(nm) |
|---|---|---|---|---|
| Experimental example 1 | 3 | 6 | 0.50 | 730 |
| Experimental example 2 | 1.5 | 3 | 0.12 | 725 |
| Experimental example 3 | 1 | 2 | 0.07 | 717 |

Next, attention is made to the maximum emission wavelength of the second organic semiconductor material 42 in the PL spectrum of FIG. 17. As shown in Table 6, only in Experimental Example 3 in which the intermolecular distance between the second organic semiconductor material 42 and the third organic semiconductor material 43 is less than 1.5 nm, the emission maximum wavelength is 720 nm or less.

From the above, in Experimental Examples 1 to 3, it was confirmed that when the second organic semiconductor material 42 and the third organic semiconductor material 43 are close to each other at the intermolecular distance of less than 1.5 nm, the energy transfer occurs from the third organic semiconductor material 43 to the second organic semiconductor material 42, and A/B<0.1 is satisfied in the PL measurement.

[Methods of Preparing Samples in Experimental Examples 4 to 7]

As Experimental Examples 4 to 7, a photoelectric conversion element having a first organic semiconductor material 41 forming the first domain 17A and a second organic semiconductor material 42 forming the second domain 17B, and a third organic semiconductor material 43 was prepared. As the preparation method of Experimental Examples 4 to 7, an ITO film having a thickness of 100 nm was formed on a quartz substrate using a sputtering apparatus, and the ITO film was patterned by photolithography and etching to form the ITO lower electrode. After the substrate was cleaned by the UV/ozone treatment, the substrate was transferred to the vacuum evaporator, and an organic material film was formed by the resistive heating method while the substrate holder was rotated while the pressure of the organic material was reduced to $1 \times 10^{-5}$ Pa or less. First, as an electron blocking layer, a HTM105 represented by the following formula (18) was deposited with a thickness of 10 nm at a substrate temperature of 0° C., the F6-SubPc-OPh2,6F2 represented by the above formula (17) as the third organic semiconductor material 43, BP-rBDT represented by the following formula (19) as the first organic semiconductor material, and C60 as the second organic semiconductor material 42 were deposited at a deposition rate of 0.50 Å/sec, 0.50 Å/sec, and 0.25 Å/sec, respectively, so that the thickness of the mixed layer was 230 nm. Finally, as a hole blocking layer, a 10-nm-thick film of NDI-35 represented by the following equation (20) was formed at a substrate temperature of 0° C. Subsequently, the substrate was transferred to a sputtering apparatus, and ITO was formed with a thickness of 50 nm to form an upper electrode. A photoelectric conversion element having a photoelectric conversion region of 1 mm×1 mm was produced by the above preparing method. The element thus manufactured was annealed at 150° C. for 210 minutes in an $N_2$ atmosphere.

[Chemical Formula 18]

(18)

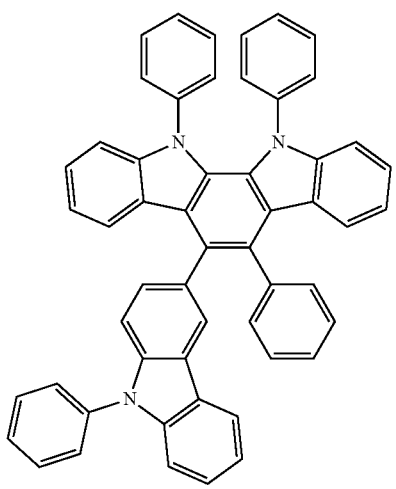

[Chemical Formula 19]

(19)

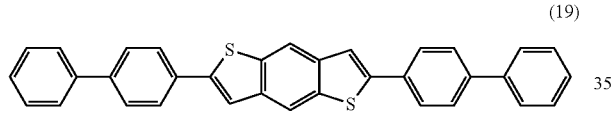

[Chemical Formula 20]

(20)

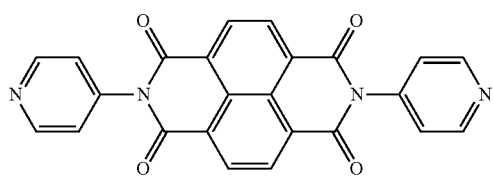

[Chemical Formula 21]

(21)

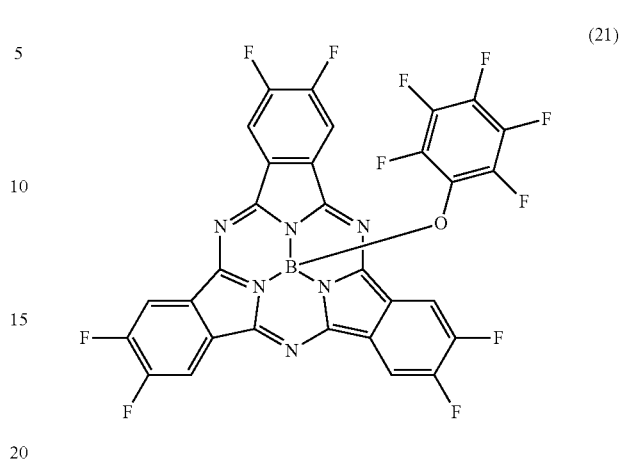

[Chemical Formula 22]

(22)

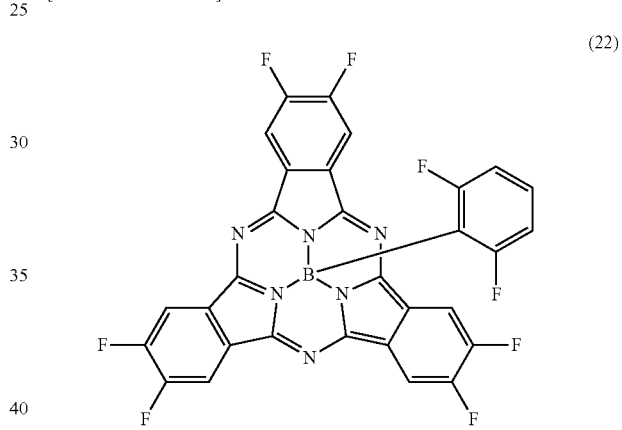

[Chemical Formula 23]

(23)

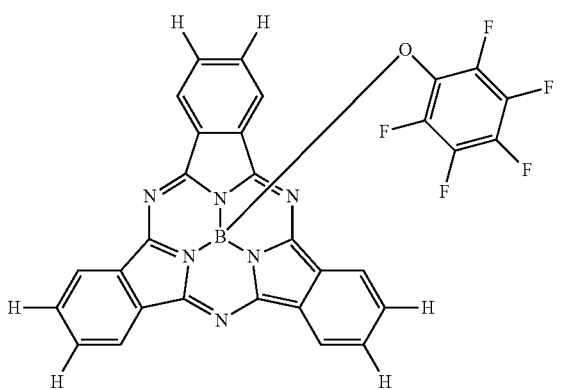

In addition, Experimental Examples 5 to 9 were produced in the same manner as in Experimental Example 4 by changing the third organic semiconductor material 43. In Experimental Examples 5 to 9, each third organic semiconductor material 43 was F6-SubPc-OC6F5 represented by Formula (21), F6-SubPc-Ph2,6F2 represented by Formula (22), SubPc-OC6F5 represented by Formula (23), ZCl-Mes represented by Formula (24), and Du-H represented by Formula (25).

[Chemical Formula 24]

(24)

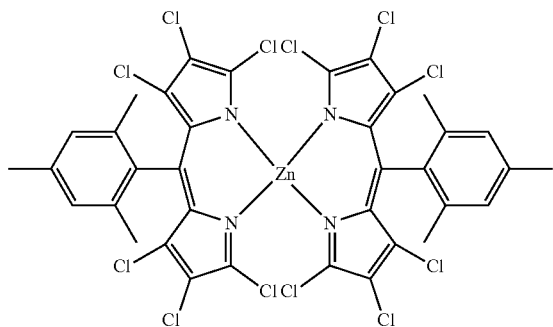

[Chemical Formula 25]

(25)

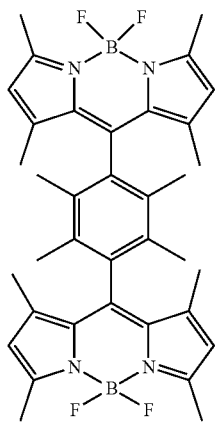

[Evaluation of External Quantum Efficiency]

The wavelength of the light irradiated from a green LED light source to the photoelectric conversion element through the band-pass filter was 560 nm, the amount of light was 1.62 μW/cm², a vias voltage applied between the electrodes of the photoelectric conversion element was controlled using a semiconductor parameter analyzer, and a voltage applied to the lower electrode is swept with respect to the upper electrode to obtain a current-voltage curve. The EQE was calculated by measuring bright and dark current values when the vias voltage was −2.6 V.

A calculation result of each EQE is shown in Table 7. When the EQE of Experimental Example 4 was 1.0, comparable good characteristics were obtained in Experimental Examples 5 to 7. On the other hand, Experimental Examples 8 and 9 did not obtain good characteristics.

TABLE 7

| | Organic photoelectric conversion layer | | | |
|---|---|---|---|---|
| | First organic semiconductor material | Second organic semiconductor material | Third organic semiconductor material | EQE |
| Experimental example 4 | BP-rBDT | C60 | F6-SubPc-OPh2,6F2 | 1.0 |
| Experimental example 5 | BP-rBDT | C60 | F6-SubPc-OC6F5 | 1.1 |
| Experimental example 6 | BP-rBDT | C60 | F6-SubPc-Ph2,6F2 | 1.0 |
| Experimental example 7 | BP-rBDT | C60 | SubPc-OC6F5 | 0.8 |
| Experimental example 8 | BP-rBDT | C60 | ZCl-Mes | 0.5 |
| Experimental example 9 | BP-rBDT | C60 | Du-H | 0.06 |

[PL Measurement]

The PL measurement was performed on each of Experimental Examples 4 to 7. Using the Raman spectroscopic apparatus and the YAG laser with a wavelength of 532 nm for excitation, the measurement wavelength range was 500 nm or more to 1000 nm or less. Since the organic film was damaged by intense irradiation with the laser, the minimum amount of light with which the emission spectrum can be confirmed was adjusted by using the ND filter, and the measurement was performed by irradiating light from above the ITO.

Figure 18:
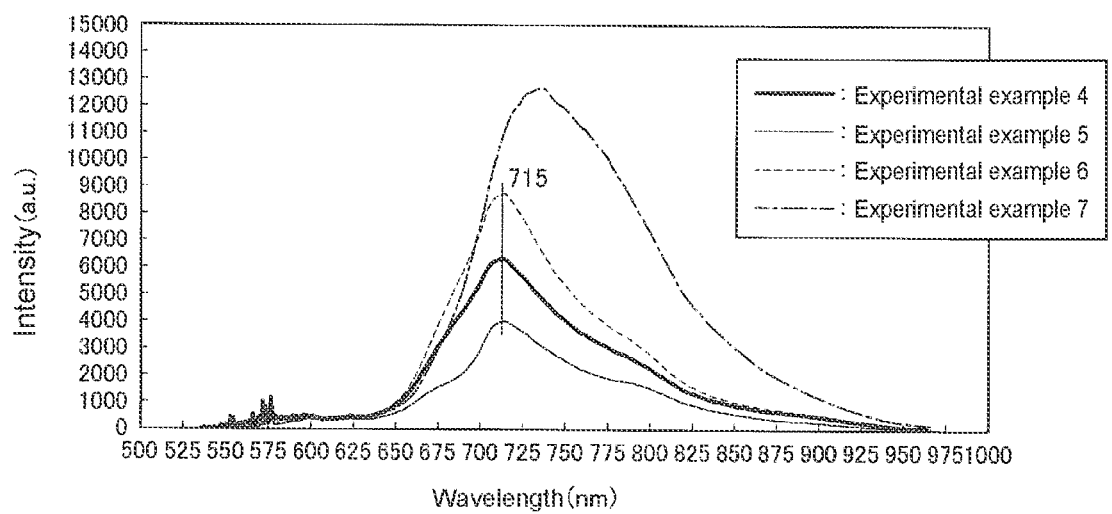
FIG. 18 is a graph showing PL spectra of active layers of Experimental Examples 4 to 7.
Figure 19:
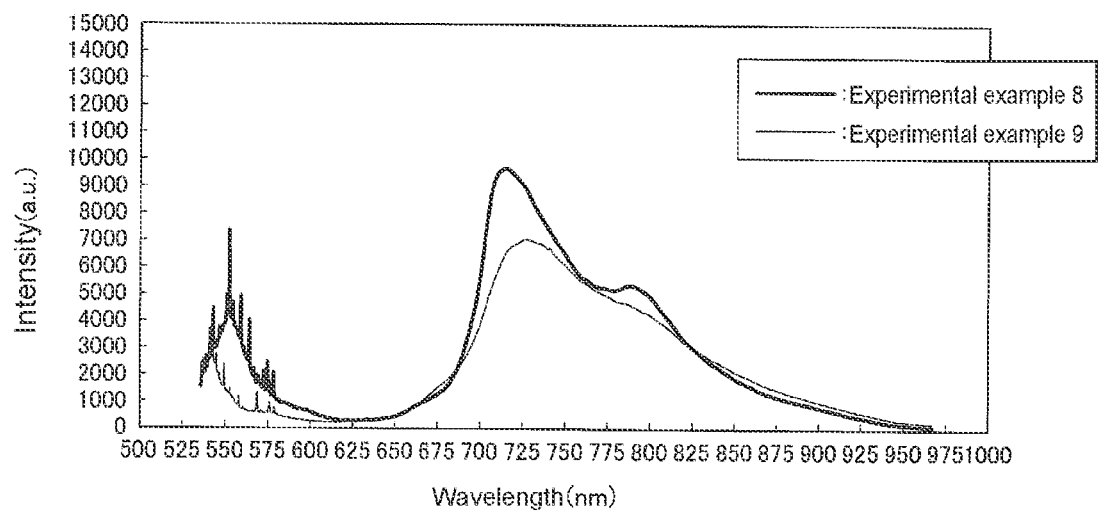
FIG. 19 is a graph showing PL spectra of active layers of Experimental Examples 8 and 9.

FIG. 18 shows PL spectra acquired in the active layers of Experimental Examples 4-7, and FIG. 19 shows PL spectra acquired in the active layers of Experimental Examples 8 and 9. Since the third organic semiconductor material 43 included in Experimental Examples 4 to 9 has a visible absorption band of 500 nm or more and 600 nm or less, the excitation wavelength of the PL measurement was set to 532 nm within the wavelength of this absorption band.

As shown in FIG. 18, in Experimental Examples 4 to 7, the emission peak of the third organic semiconductor material 43 is not observed within the wavelength range of 520 nm or more and 580 nm or less, and only the emission peak of fullerene used as the second organic semiconductor material 42 is observed in the region where the maximum wavelength is 715 nm. Therefore, in Experimental Examples 4 to 7, it can be determined that the second organic semiconductor material 42 and the third organic semiconductor material 43 form a uniform dissolved state.

As shown in FIG. 19, in Experimental Examples 8 and 9, the emission peaks of the third organic semiconductor material 43 are observed in the wavelength range of 520 nm or more and 580 nm or less. Therefore, in Experimental Examples 8 and 9, it is supposed that the third organic semiconductor material 43 and the second organic semiconductor material 42 are not sufficiently dissolved to each other.

In fact, results of calculating A/B by the aforementioned method are shown in Table 8. In Experimental Examples 4 to 7, since A/B<0.1 is satisfied, it can be determined that a state in which the second organic semiconductor material 42 and the third organic semiconductor material 43 forming the second domain 17B are uniformly dissolved to each other is formed.

TABLE 8

| | Third organic semiconductor material | A/B |
|---|---|---|
| Experimental example 4 | F6-SubPc-OPh2, 6F2 | 0.070 |
| Experimental example 5 | F6-SubPc-OC6F5 | 0.097 |

TABLE 8-continued

|  | Third organic semiconductor material | A/B |
|---|---|---|
| Experimental example 6 | F6-SubPc-Ph2,6F2 | 0.066 |
| Experimental example 7 | SubPc-OC6F5 | 0.023 |
| Experimental example 8 | ZCl-Mes | 0.45 |
| Experimental example 9 | Du-H | 0.63 |

Next, the first organic semiconductor material 41 will be described. It is conceivable that the first organic semiconductor material 41 having an electron donating property can form a hole transport path by forming a self domain as the first domain 17A. However, since the crystal grain size (domain size) of the first domain 17A becomes too large, the charge separation efficiency of the exciton decreases, such that it is desirable that the crystal grain size of the first domain 17A is 20 nm or less. For determining the crystal grain size, if the first organic semiconductor material is crystalline, it is effective to calculate the crystal grain size by the X-ray diffraction method.

Figure 20:
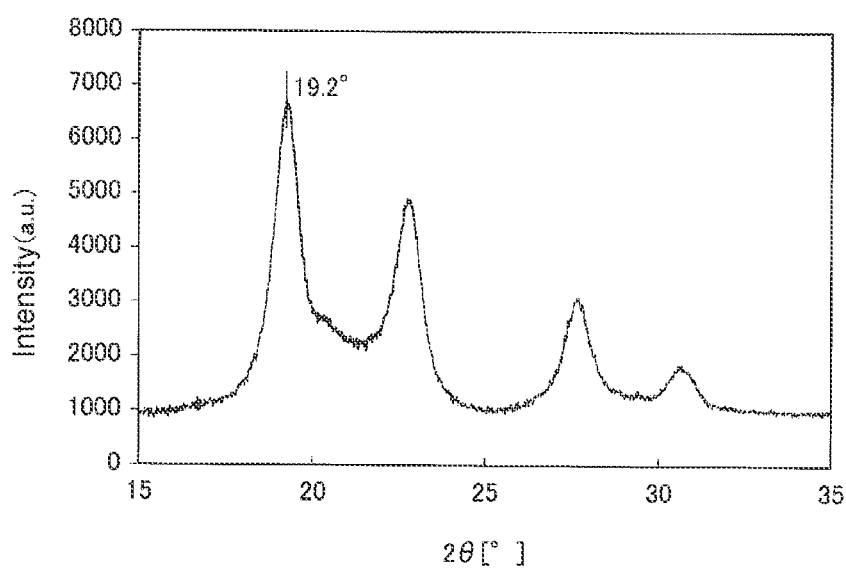
FIG. 20 is a graph showing an X-ray diffraction result of Experimental Example 3.

FIG. 20 shows an X-ray diffraction spectrum measured in the active layer of Experimental Example 6. The X-ray source was CuKα. From the diffraction peak derived from the first organic semiconductor material 41 observed around a Bragg angle 19.2°, the crystal grain size was calculated as 12.9 nm. The grain size was determined by fitting a diffraction peak from the first organic semiconductor material 41 observed in the vicinity of the Bragg angle of 19.2° using a Pearson VII function, determining a half-value width of the diffraction peaks, and substituting the half-value width into a Scherrer's equation. At this time, a Scherer constant K was 0.94. Alternatively, by a transmission electron microscopy (TEM) observation, a dispersion state of the crystal domain may be confirmed.

Similar to Experiment 6, the crystal grain size of the first domain 17A was also calculated by the XRD for Experimental Examples 4, 5, 7, and 9. Calculation results of the crystal grain size of the first domain 17A are shown in Table 9.

TABLE 9

| | Organic photoelectric conversion layer | | | |
|---|---|---|---|---|
| | First organic semi- conductor material | Second organic semi- conductor material | Third organic semi- conductor material | Crystal grain size (nm) (2θ = 19.7°) |
| Experimental example 4 | BP-rBDT | C60 | F6-SubPc-OPh2,6F2 | 12.7 |
| Experimental example 5 | BP-rBDT | C60 | F6-SubPc-OC6F5 | 11.7 |
| Experimental example 6 | BP-rBDT | C60 | F6-SubPc-Ph2,6F2 | 12.9 |
| Experimental example 7 | BP-rBDT | C60 | SubPc-OC6F5 | 11.5 |
| Experimental example 9 | BP-rBDT | C60 | Du-H | 8.3 |

As shown in Table 9, when the crystal grain size of the first domain 17A was 11.5 nm or more and 12.9 nm or less as in Experimental Examples 4 to 7, it was found that good EQE was obtained as shown in Table 7.

Fifth Embodiment

The photoelectric conversion element 10 according to a fifth embodiment also has the cross-sectional structure shown in FIG. 1, which is common to the structure of the photoelectric conversion element according to the first to fourth embodiments. However, the photoelectric conversion element 10 according to the fifth embodiment differs from the first to fourth embodiments in the configuration of the organic photoelectric conversion layer 17. Hereinafter, description will be given focusing on the configuration of the organic photoelectric conversion layer 17, and description of common portions with the first to fourth embodiments will be omitted.

As already described in the third embodiment, in the photoelectric conversion element used as the pixel or the like of the solid-state imaging device, the improvement of the external quantum efficiency (EQE) is needed. Therefore, the fifth embodiment provides a photoelectric conversion element capable of improving the EQE.

The photoelectric conversion element 10 according to the fifth embodiment includes the lower electrode (first electrode) 15a and the upper electrode (second electrode) 18 arranged to face each other, and the organic photoelectric conversion layer 17 provided between the lower electrode 15a and the upper electrode 18, as schematically shown in FIG. 1. The electron transport layer 17a is provided between the upper electrode 18 and the organic photoelectric conversion layer 17. The hole transport layer 17b is provided between the lower electrode 15a and the organic photoelectric conversion layer 17.

The organic photoelectric conversion layer 17 is formed of at least two kinds of organic semiconductor materials including fullerene. For example, the organic photoelectric conversion layer 17 may be formed of the first organic semiconductor material and the second organic semiconductor material having different mother skeletons. The first organic semiconductor material has the electron donating property, and the second organic semiconductor material has the electron accepting property. The first organic semiconductor material is formed of the p-type semiconductor organic material. The p-type semiconductor organic material functions relatively as the electron donor. The second organic semiconductor material is formed of the n-type semiconductor organic material. The n-type semiconductor organic material functions relatively as the electron acceptor. The mixing ratio of the p-type organic semiconductor material and the n-type organic semiconductor material forming the organic photoelectric conversion layer 17 may be, for example, about 30% by mass of the p-type organic semiconductor material and about 70% by mass of the n-type organic semiconductor material, and is not limited thereto.

As the first organic semiconductor material and the second organic semiconductor material contained in the organic photoelectric conversion layer 17, for example, two or more kinds of organic semiconductor materials such as quinacridone, chlorinated boron subphthalocyanine, pentacene, benzothienobenzothiophene, fullerene, and derivatives thereof are combined and constituted. The organic semiconductor material functions as the p-type semiconductor or the n-type semiconductor depending on the combination thereof. Incidentally, as the first organic semiconductor material and the second organic semiconductor material contained in the organic photoelectric conversion layer 17, further, for example, any one of naphthalene, anthracene, phenanthrene, tetracene, pyrene, perylene, and fluoranthene or derivatives thereof is suitably used. Alternatively, polymers such as phenylenevinylene, fluorene, carbazole, indole, pyrene, pyrrole, picoline, thiophene, acetylene, diacetylene, and the like and derivatives thereof may be used. In the fifth embodiment, for example, the n-type semiconductor material forming the second organic semiconductor material may be fullerene or a fullerene derivative.

When the organic photoelectric conversion layer 17 is formed of the first organic semiconductor material and the second organic semiconductor material, it is desirable that self-aggregation of fullerene or a fullerene derivative forming the second organic semiconductor material is suppressed, and the first organic semiconductor material and the second organic semiconductor material are in a uniformly dissolved state. The state in which the first organic semiconductor material and the second organic semiconductor material are uniformly dissolved means a state in which the first organic semiconductor material and the second organic semiconductor material do not form the self-association or the self-aggregation, and are uniformly mixed into one phase.

In addition, the organic photoelectric conversion layer 17 may include the third organic semiconductor material having the mother skeleton different from the first organic semiconductor material and the second organic semiconductor material in addition to the first organic semiconductor material and the second organic semiconductor material. The third organic semiconductor material is the pigment material that absorbs light and is excited. For example, as the mixing ratio of the first organic semiconductor material, the second organic semiconductor material, and the third organic semiconductor material forming the organic photoelectric conversion layer 17, 30% by mass of the first organic semiconductor material, 30% by mass of the second organic semiconductor material, and 40% by mass of the third organic semiconductor material are exemplified, but it is not limited to the values.

As the third organic semiconductor material 43, for example, a metal complex pigment material, a cyanine-based pigment material, a merocyanine-based pigment material, a phenylxanthene-based pigment material, a triphenylmethane-based pigment material, a rhodacyanine-based pigment material, a xanthene-based pigment material, a macrocyclic azaannulene-based pigment material, an azulene-based pigment material, naphthoquinone, an anthraquinone-based pigment material, a pigment material similar to the cyanine-based pigment material bonded by a chain compound in which a fused polycyclic aromatic such as anthracene and pyrene, and an aromatic ring or a heterocyclic compound is fused, or two nitrogen-containing heterocyclic rings such as quinoline, benzothiazole and benzooxazol having a squarylium group and a croconicumetin group as bonding chains or a squarylium group and a croconicumetin group, or the like can be desirably used. Note that, as the above-described metal complex pigment material, a dithiol metal complex-based pigment material, a metal phthalocyanine pigment material, a metal porphyrin pigment material, or a ruthenium complex pigment material is desirable, but it is not limited thereto.

In a case where the organic photoelectric conversion layer 17 is formed of the first organic semiconductor material, the second organic semiconductor material, and the third organic semiconductor material, as already described in the fourth embodiment and schematically shown in FIG. 12, the organic photoelectric conversion layer 17 may have the first domain 17A formed only of the first organic semiconductor material 41 and the second domain 17B in which the second organic semiconductor material 42 and the third organic semiconductor material 43 are uniformly dissolved. As shown in FIG. 14, the second organic semiconductor material 42 and the third organic semiconductor material 43 are uniformly dissolved (miscible) at the molecular level, and the self-association and the self-aggregation of the second organic semiconductor material 42 and the third organic semiconductor material 43 are suppressed. In the second domain 17B, the state in which the second organic semiconductor material 42 and the third organic semiconductor material 43 are uniformly dissolved to each other means a state in which the second organic semiconductor material 42 and the third organic semiconductor material 43 do not form the self-association or the self-aggregation, and are uniformly mixed into one phase, as schematically shown in FIG. 14A.

The first organic semiconductor material 41 forming the first domain 17A is desirably crystalline, and the first domain 17A in the crystal fine particle state forms the hole transport path. On the other hand, the second organic semiconductor material 42 and the third organic semiconductor material 43 forming the second domain 17B are uniformly dissolved (miscible) at the molecular level, the self-association and the self-aggregation of each material are suppressed. When the third organic semiconductor material 43 forms the self-association or the self-aggregation, it is conceivable that absorption different from the desired absorption is generated by the association, or the charge separation efficiency of the exciton is lowered. When the second organic semiconductor material 42 forms the self-association or the self-aggregation, the energy level different from the dispersed state is generated. This can be the trap or the inhibition factor of the energy transfer. Therefore, by uniformly dissolving the second organic semiconductor material 42 and the third organic semiconductor material 43 at the molecular level as shown in FIG. 14A, these disadvantages can be suppressed. Furthermore, since the distance between the second organic semiconductor materials 42 is also kept constant, the electron transport path is also ensured as shown in FIG. 13. By employing such a structure, it becomes unnecessary to limit the amount of the third organic semiconductor material 43, as compared with the case where the pigment material is segregated at the junction interface between the donor and the acceptor or dispersed in the organic semiconductor material. Since the third organic semiconductor material 43 has the effect of sensitizing the light absorption, it is desirable to increase the blending amount of the second organic semiconductor material 42, to increase the light absorption efficiency.

Here, the present inventors have discovered that a dissolved state and an interaction state between fullerene or a fullerene derivative and the first organic semiconductor material in a case where the organic photoelectric conversion layer 17 is formed of two types of the first organic semiconductor material and the second organic semiconductor material and the second organic semiconductor material is fullerene or a fullerene derivative, and that a dissolved state and an interaction state between the fullerene or fullerene derivative and the third organic semiconductor material in a case where the organic photoelectric conversion layer 17 is formed of three types of the first organic semiconductor material, the second organic semiconductor material, and the third organic semiconductor material and the second organic semiconductor material is fullerene or a fullerene derivative can be confirmed by observing an energy gap of fullerene or a fullerene derivative in the organic photoelectric conversion layer 17.

That is, the present inventors have confirmed that an energy gap Eg(C60) in the crystal of the C60 film is 2.4 eV, whereas the energy gap Eg(C60) is as large as 2.6 eV or more when C60 is in the dissolved state. Furthermore, it was confirmed that the energy gap Eg(C60) was further widened to 2.8 eV or more and 3.1 eV or less by interacting between C60 and the p-type semiconductor material or by dissolving and interacting between C60 and an organic pigment material. Note that 3.1 eV is a theoretical maximum value of the energy gap Eg(C60).

The energy gap of fullerene or a fullerene derivative in the organic photoelectric conversion layer 17 can be confirmed by combining ultraviolet photoelectron spectroscopy (UPS) and inverse photoelectron spectroscopy (IPES). That is, ionization energy of the HOMO of fullerene or a fullerene derivative measured by the ultraviolet photoelectron spectroscopy is determined as a peak-rising portion derived from the HOMO. An electron affinity of fullerene or a fullerene derivative measured by the back photoelectron spectroscopy is determined as a peak-rising portion derived from the LUMO. An energy difference between the peak-rising portion derived from the HOMO and the peak-rising portion derived from the LUMO can be determined as the energy gap.

Figure 21A:
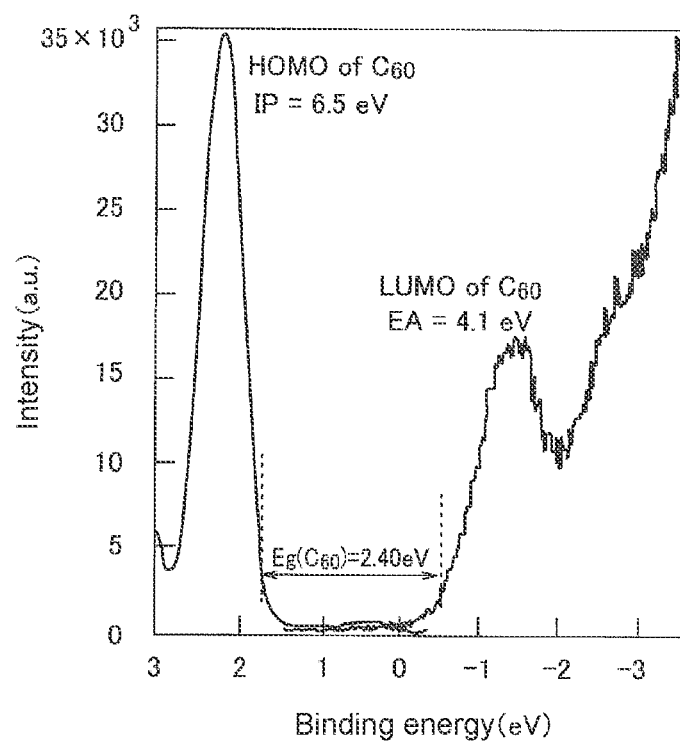
FIG. 21A is a graph showing a measurement result of an energy gap of C60 in a C60 single film.

FIG. 21A shows a spectrum of C60 measured by the ultraviolet photoelectron spectroscopy and the inverse photoelectron spectroscopy for the C60 single film. An ionization potential (IP) measured by the ultraviolet photoelectron spectroscopy is 6.5 eV and the electron affinity (EA) measured by the inverse photoelectron spectroscopy is 4.1 eV. The energy gap Eg(C60), which is the energy difference between the peak-rising portion derived from the HOMO measured by the ultraviolet photoelectron spectroscopy and the peak-rising portion derived from the LUMO measured by the inverse photoelectron spectroscopy, is 2.4 eV.

Figure 21B:
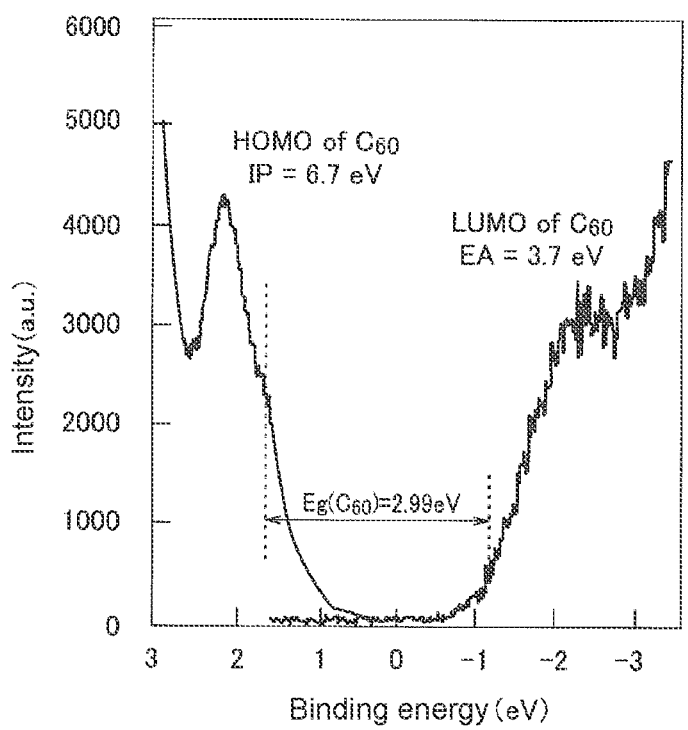
FIG. 21B is a graph showing a measurement result of an energy gap of C60 of a photoelectric conversion film formed of B12:26F2:C60.

FIG. 21B shows the spectrum of C60 measured by the ultraviolet photoelectron spectroscopy and the inverse photoelectron spectroscopy for a photoelectric conversion film formed of B12:26F2:C60=4:4:2. The ionization potential (IP) measured by the ultraviolet photoelectron spectroscopy is 6.7 eV and the electron affinity (EA) measured by the inverse photoelectron spectroscopy is 3.7 eV. The energy gap Eg(C60), which is the energy difference between the peak-rising portion derived from the HOMO measured by the ultraviolet photoelectron spectroscopy and the peak-rising portion derived from the LUMO measured by the back photoelectron spectroscopy, is 2.99 eV, which is larger than that of the C60 single film in FIG. 21A.

Figure 22:
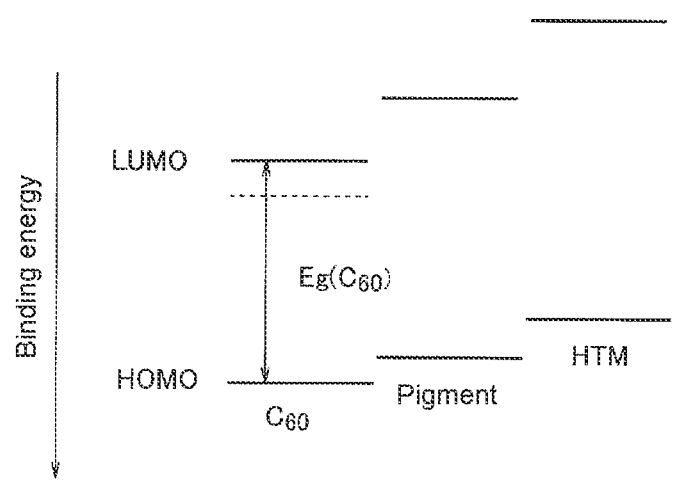

FIG. 22 shows the LUMO level and the HOMO level of C60, the pigment, and the HTM. The LUMO level of the C60 is a position indicated by a broken line, when the energy gap Eg(C60) is small, it becomes the trap, properties may be deteriorated. In contrast, the LUMO level of C60 is a position indicated by a solid line, when the energy gap Eg(C60) is increased, it can be suppressed to become the trap.

Therefore, in a case where the organic photoelectric conversion layer 17 is formed of two types of the first organic semiconductor material and the second organic semiconductor material, the second organic semiconductor material is fullerene or a fullerene derivative, and the value of the energy gap of fullerene or a fullerene derivative in the organic photoelectric conversion layer 17 is 2.6 eV or more, it becomes an index of determining that the self-aggregation of fullerene or a fullerene derivative is suppressed and fullerene or a fullerene derivative the first organic semiconductor material are dissolved to each other.

In addition, in a case where the organic photoelectric conversion layer 17 is formed of three types of the first organic semiconductor material, the second organic semiconductor material, and the third organic semiconductor material, the second organic semiconductor material is fullerene or a fullerene derivative, and the value of the energy gap of fullerene or a fullerene derivative in the organic photoelectric conversion layer 17 is 2.6 eV or more, the self-aggregation of fullerene or a fullerene derivative is suppressed and the fullerene or a fullerene derivative and the third organic semiconductor material are dissolved to each other.

As described above, according to the photoelectric conversion element 10 of the fifth embodiment, in the bulk heterojunction type organic photoelectric conversion layer 17, the self-aggregation of C60 can be suppressed and C60 and the organic pigment material or C60 and the p-type semiconductor material can be dissolved to each other by employing a structure, a material, a film forming condition, or the like in which the energy gap Eg(C60) of C60, which is an n-type semiconductor material, is 2.6 eV or more, so that the light absorption efficiency can be improved. Furthermore, the self-aggregation of C60 can be further suppressed and the dissolubility can be further increased.

Example

[Methods of Preparing Samples in Experimental Examples 10 to 14]

As a method of preparing Experimental Example 10, an ITO film having a thickness of 100 nm was formed on a quartz substrate using a sputtering apparatus, and the ITO film was patterned by photolithography and etching to form an ITO lower electrode. After the substrate was cleaned by the UV/ozone treatment, the substrate was transferred to the vacuum evaporator, and an organic material film was formed by the resistive heating method while the substrate holder was rotated under a reduced pressure of $1 \times 10^{-5}$ Pa or less. First, as an electron blocking layer, a film of HTM105 represented by the above formula (18) having a thickness of 10 nm was formed at a substrate temperature of 0° C., and then a film of BP-rBDT represented by the above formula (19) as the first organic semiconductor material, a film of C60 as the second organic semiconductor material, and a film of F6-SubPc-OPh2,6F2 represented by the above formula (17) as the third organic semiconductor material 43 were formed at a substrate temperature of 40° C. and at deposition rates of 0.50 Å/sec, 0.50 Å/sec, and 0.25 Å/sec, respectively, so that the thickness of the mixed layer was 230 nm. Finally, as the hole blocking layer, NDI-35 represented by the above equation (20) having a thickness of 10 nm was formed at a substrate temperature of 0° C. Subsequently, the substrate was transferred to the sputtering apparatus, and the ITO film having a thickness of 50 nm was formed to form the upper electrode. The photoelectric conversion element having the photoelectric conversion region of 1 mm×1 mm was produced by the above preparing method. The device thus prepared was annealed at 150° C. for 210 minutes in a $N_2$ atmosphere.

Experimental Example 11 was prepared in the same manner as in Experimental Example 10 by changing the organic pigment to F6-SubPc-OC6F5. Experimental Example 12 was prepared in the same manner as in Experimental Example 10 by changing the organic pigment to ZCl-Mes. Experimental Example 13 was prepared in the same manner as in Experimental Example 10 by changing the first organic semiconductor material to BTBT19 without using the organic pigment. Experimental Example 14 was prepared in the same manner as in Experimental Example 10 by changing the organic pigment to Du-H.

[Evaluation of External Quantum Efficiency]

The wavelength of the light irradiated from a green LED light source to the photoelectric conversion element through the band-pass filter was 560 nm, the amount of light was 1.62 µW/cm$^2$, a vias voltage applied between the electrodes of the photoelectric conversion element was controlled using a semiconductor parameter analyzer, and a voltage applied to the lower electrode is swept with respect to the upper electrode to obtain a current-voltage curve. The EQE was calculated by measuring bright and dark current values when the vias voltage was −2.6 V.

[Measurement of Energy Gap Eg(C60)]

As a method of measuring the energy gap Eg(C60), the energy difference between the peak-rising portion derived from the HOMO of C60 detected by the ultraviolet photoelectron spectroscopy (UPS) measurement and the peak-rising portion derived from the LUMO of C60 detected by the inverse photoelectron spectroscopy (IPES) measurement was used.

In the UPS measurement and the IPES measurement of each organic film, the organic film was exposed by peeling off the upper electrode and the lower electrode, and the desired film was exposed by etching with an argon gas cluster ion gun. The conditions of the argon gas cluster ion gun were an acceleration voltage of 2.5 kV, a target current (reference current) of 8 nA, and a raster size of 10×10 mm.

The peak-rising portion derived from the HOMO of C60, i.e., ionization energy of the HOMO of C60, can be measured by the UPS-measurement. As an analyzer for the UPS measurement, PHI 5000 VersaProbe II manufactured by ULVAC-PHI Co., Ltd. was used. As a light source, a He discharge tube (excitation light: HeIα, 21.2 eV) was used. At the time of analysis, each sample to be analyzed was irradiated with a HeI resonance line (21.2 eV), and a photoelectron spectrum was measured at a pass energy of 1.18 eV. The ionization energy of the HOMO of C60 used an energy position of the peak-rising derived from the HOMO of C60.

The peak-rising portion derived from the LUMO of C60, i.e., the electron affinity of C60, can be measured by a low-energy IPES measurement. A low-energy inverse photoelectron spectroscopy (LEIPS) manufactured by Ad-cap Vacuum Technology, Co., Ltd. was used as an analyzer for measuring low-energy IPES. At the time of analysis, each sample to be analyzed was irradiated with an electron beam, and the back-photoelectron spectrum was measured using a band-pass filter having a center wavelength of 260 nm. For the electron affinity of C60, an energy position of spectrum-rising was used.

An energy difference between the ionization energy of C60 (energy position of peak-rising of HOMO peak of C60 in ultraviolet photoelectron spectrum) and the electron affinity of C60 (energy position of peak-rising of LUMO in inverse photoelectron spectrum) is the energy gap Eg(C60) of C60.

Measured results of the energy gap Eg(C60) and the EQE by the UPS measurement and the IPES measurement for each of Experimental Examples 10 to 14 are shown in Table 10.

TABLE 10

| | Organic photoelectric conversion layer | | | | |
|---|---|---|---|---|---|
| | First organic semiconductor material | Organic pigment | Second organic semiconductor material | Eg (C60) | EQE |
| Experimental example 10 | BP-rBDT | F6-SubPc-OPh26F2 | C60 | 2.99 | 1.0 (81%) |
| Experimental example 11 | BP-rBDT | F6-SubPc-OC6F5 | C60 | 2.81 | 1.1 (92%) |
| Experimental example 12 | BP-rBDT | ZCI-Mes | C60 | 2.76 | 0.68 (55%) |
| Experimental example 13 | BTBT19 | — | C60 | 2.64 | 0.43 (35%) |
| Experimental example 14 | BP-rBDT | Du-H | C60 | 2.40 | 0.06 (5%) |

As shown in Table 10, in Experimental Example 14, the Eg(C60) becomes less than 2.6 eV, C60 is in an aggregated state, good EQE is not obtained. On the other hand, in Experimental Examples 10 to 13, the Eg(C60) becomes 2.6 eV or more and 3.1 eV or less, C60 is dissolved and interacted with the first organic semiconductor or the organic pigment, and good EQE was obtained. Furthermore, in Experimental Examples 10 and 11, the Eg(C60) was 2.8 eV or more and 3.1 eV or less, and better EQE was obtained than in Experimental Examples 12 and 13. Thus, the Eg(C60) is preferably 2.6 eV or more and 3.1 eV or less, more preferably 2.8 eV or more and 3.1 eV or less.

First Application Example

Figure 23:
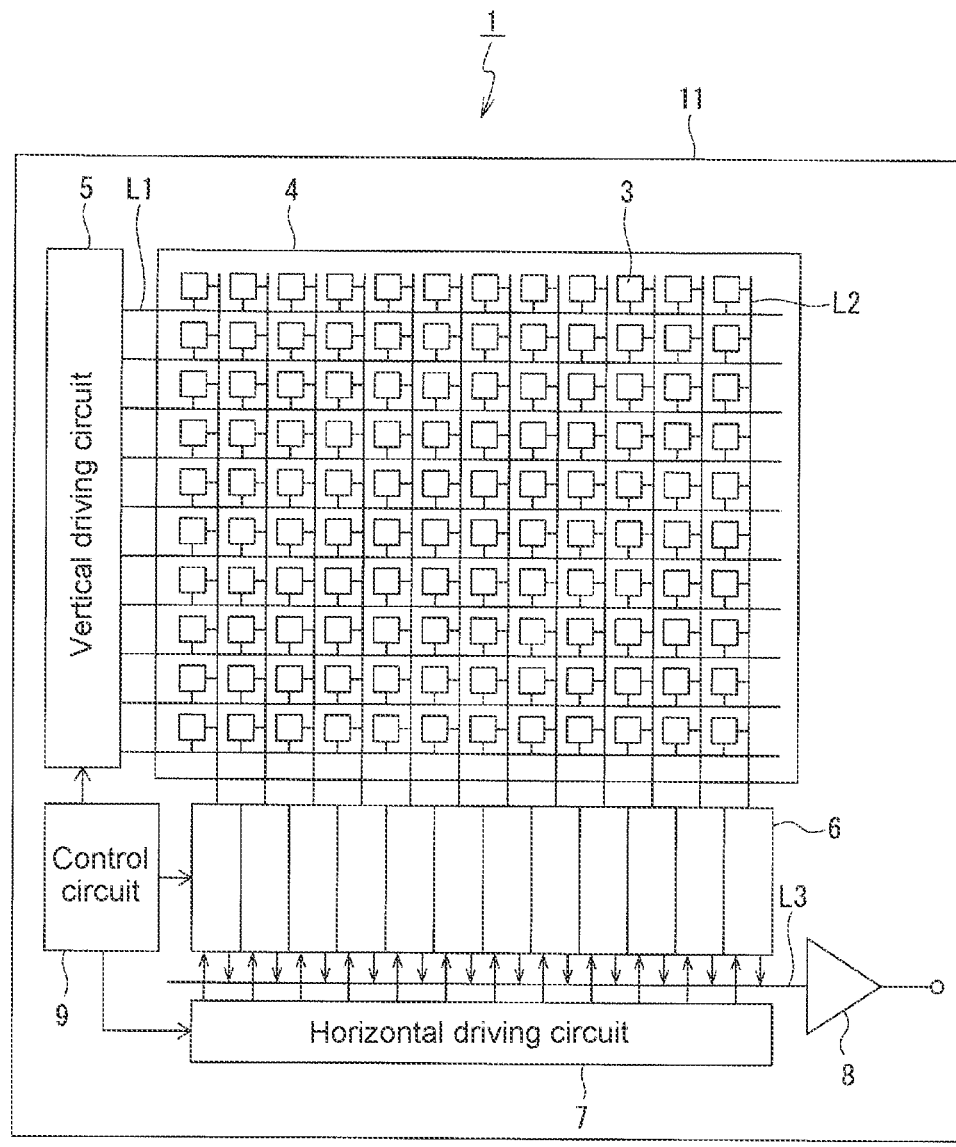
FIG. 23 is a cross-sectional view showing an example of an imaging device as a first application example of the present technology.

Using the photoelectric conversion elements 10 according to the first to fifth embodiments as pixels, respectively, the solid-state imaging device 1 can be configured as shown in FIG. 23. The solid-state imaging device 1 is a CMOS image sensor that includes a pixel region 4 as an imaging area on the semiconductor substrate 11 and includes a peripheral circuit section (5, 6, 7, 8, 9) of a vertical driving circuit 5, a column selection circuit 6, a horizontal driving circuit 7, an output circuit 8 and a control circuit 9, for example, in a peripheral region of the pixel region 4.

The pixel region 4 includes, for example, a plurality of unit pixels 3 arranged two-dimensionally in a matrix (corresponding to photoelectric conversion element 10). In the unit pixel 3, for example, a pixel driving line L1 (specifically, row selection line and reset control line) is wired for each pixel row, and a vertical signal line L2 is wired for each pixel column. The pixel driving line L1 transmits a driving signal for signal reading from the pixel. One end of the pixel driving line L1 is connected to an output terminal corresponding to each row of the vertical driving circuit 5.

The vertical driving circuit 5 is constituted by a shift register, an address decoder, and the like. The vertical driving circuit 5 drives each pixel 3 of the pixel region 4, for example, for each row unit. The signal output from each pixel 3 of the pixel row selected and scanned by the vertical driving circuit 5 is supplied to the column selection circuit 6 through each of the vertical signal lines L2. The column selection circuit 6 includes an amplifier, a horizontal selection switch, and the like provided for each vertical signal line L2.

The horizontal driving circuit 7 is constituted by a shift register and an address decoder or the like. The horizontal driving circuit 7 drives sequentially while scanning each horizontal selection switch of the column selection circuit 6. By the selective scanning by the horizontal driving circuit 7, the signal of each pixel transmitted through the vertical signal lines L2 is sequentially output to the horizontal signal lines L3, and is transmitted to outside of the semiconductor substrate 11 through the horizontal signal lines L3.

Circuit portions including the vertical driving circuit 5, the column selection circuit 6, the horizontal driving circuit 7, and the horizontal signal line L3 may be formed on the semiconductor substrate 11, or may be arranged on an external control IC. Furthermore, these circuit portions may be formed on another substrate connected by a cable or the like.

The control circuit 9 receives a clock supplied from outside of the semiconductor substrate 11, data instructing an operation mode, and the like, and outputs data such as internal information of the solid-state imaging device 1. The control circuit 9 further includes a timing generator for generating various timing signals, and performs driving control of the peripheral circuits such as the vertical driving circuit 5, the column selection circuit 6, and the horizontal driving circuit 7 on the basis of the various timing signals generated by the timing generator.

Second Application Example

Figure 24:
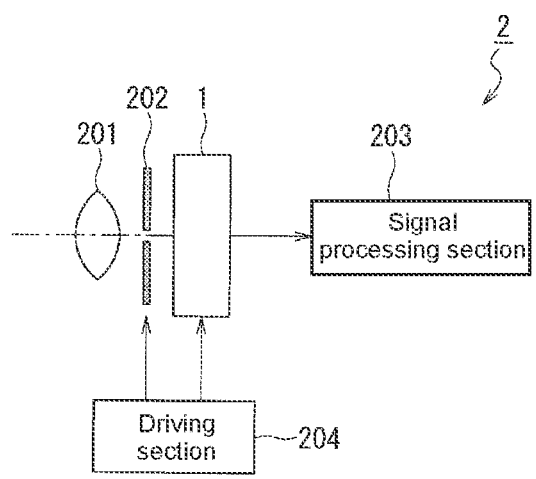
FIG. 24 is a cross-sectional view showing an example of an electronic apparatus as a second application example of the present technology.

The solid-state imaging device 1 according to the first application example can be applied to any type of electronic apparatus having an imaging function, for example, a camera system such as a digital still camera or a video camera, a mobile phone having an imaging function, and the like. For example, FIG. 24 shows a schematic configuration of an electronic apparatus 2 (camera) as a second application example. The electronic apparatus 2 is, for example, a video camera capable of capturing a still image or a moving image, and includes a solid-state imaging device 1, an optical system (optical lens) 201, a shutter device 202, a driving section 204 for driving the solid-state imaging device 1 and the shutter device 202, and a signal processing section 203. The optical system 201 guides image light from a subject (incident light) to the pixel region 4 of the solid-state imaging device 1. The optical system 201 may be formed of a plurality of optical lenses. The shutter device 202 controls a light irradiation period and a light shielding period to the solid-state imaging device 1. The driving section 204 controls a transfer operation of the solid-state imaging device 1 and a shutter operation of the shutter device 202. The signal processing section 203 performs various signal processing on the signal output from the solid-state imaging device 1. The video signal after the signal processing is stored in a storage medium such as a memory or output to a monitor or the like.

Third Application Example 3

The technology according to the present disclosure is applicable to various products. For example, the technology according to the present disclosure may be achieved as an apparatus installed in any kind of mobile object such as an automobile, an electric vehicle, a hybrid electric vehicle, a motorcycle, a bicycle, personal mobility, an airplane, a drone, a ship, a robot, construction machinery, agricultural machinery (tractor), and the like.

Figure 25:
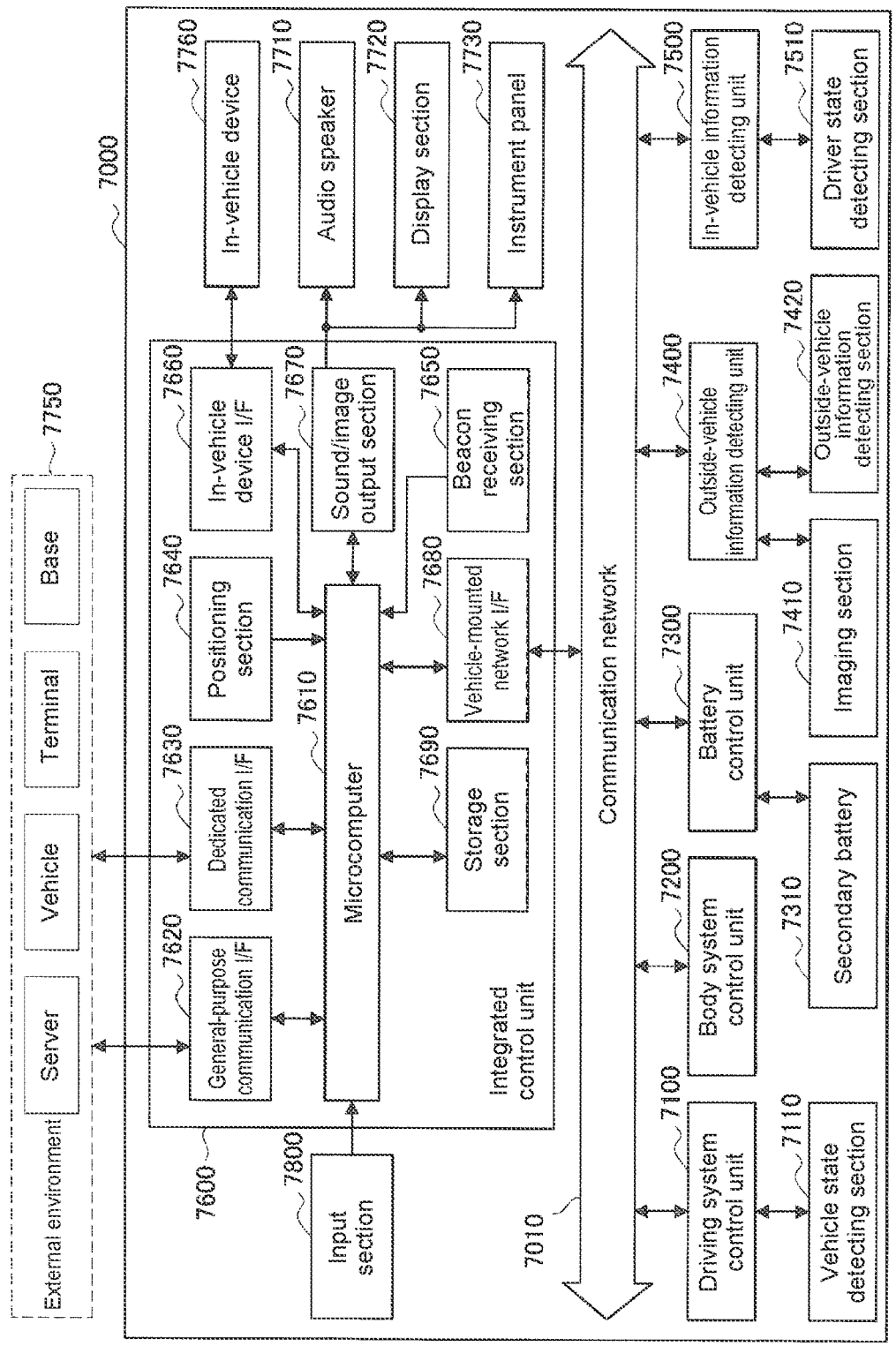
FIG. 25 is a block diagram depicting an example of schematic configuration of a vehicle control system.

FIG. 25 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 25, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 25 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 26:
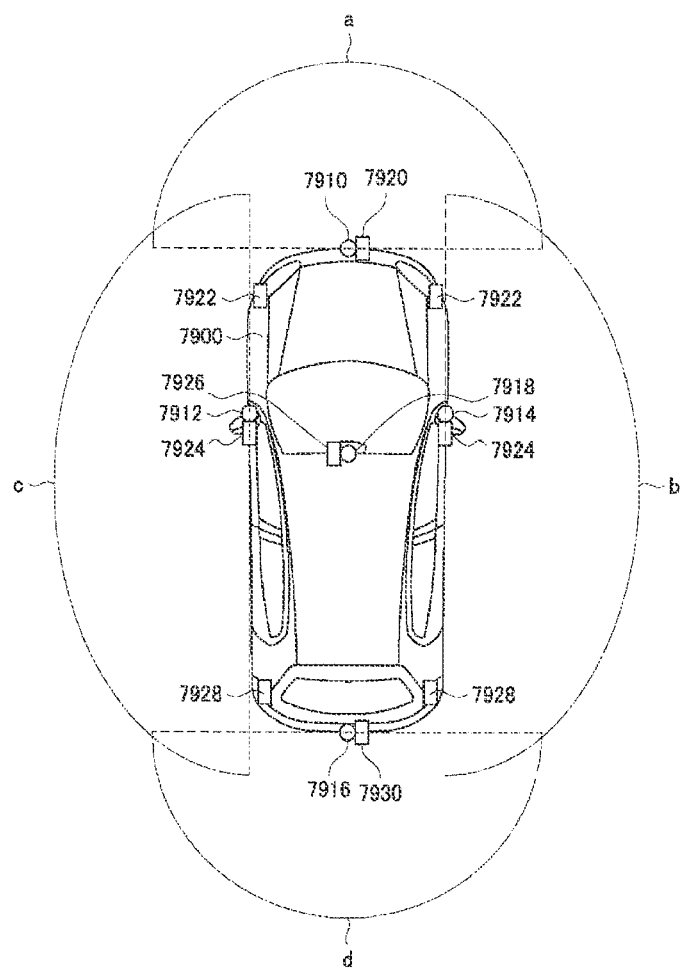
FIG. 26 is a diagram of assistance in explaining an example of installation positions of an outside-vehicle information detecting section and an imaging section.

FIG. 26 depicts an example of installation positions of the imaging section 7410 and the outside-vehicle information detecting section 7420. Imaging sections 7910, 7912, 7914, 7916, and 7918 are, for example, arranged at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 25, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, arranged in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Furthermore, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), worldwide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 25, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 25 may be integrated into one control unit. Alternatively, each individual control unit may include a plurality of control units. Furthermore, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Fourth Application Example

The technology according to the present disclosure is applicable to various products. For example, a technology according to the present disclosure may be applied to an endoscopic surgical system.

Figure 27:
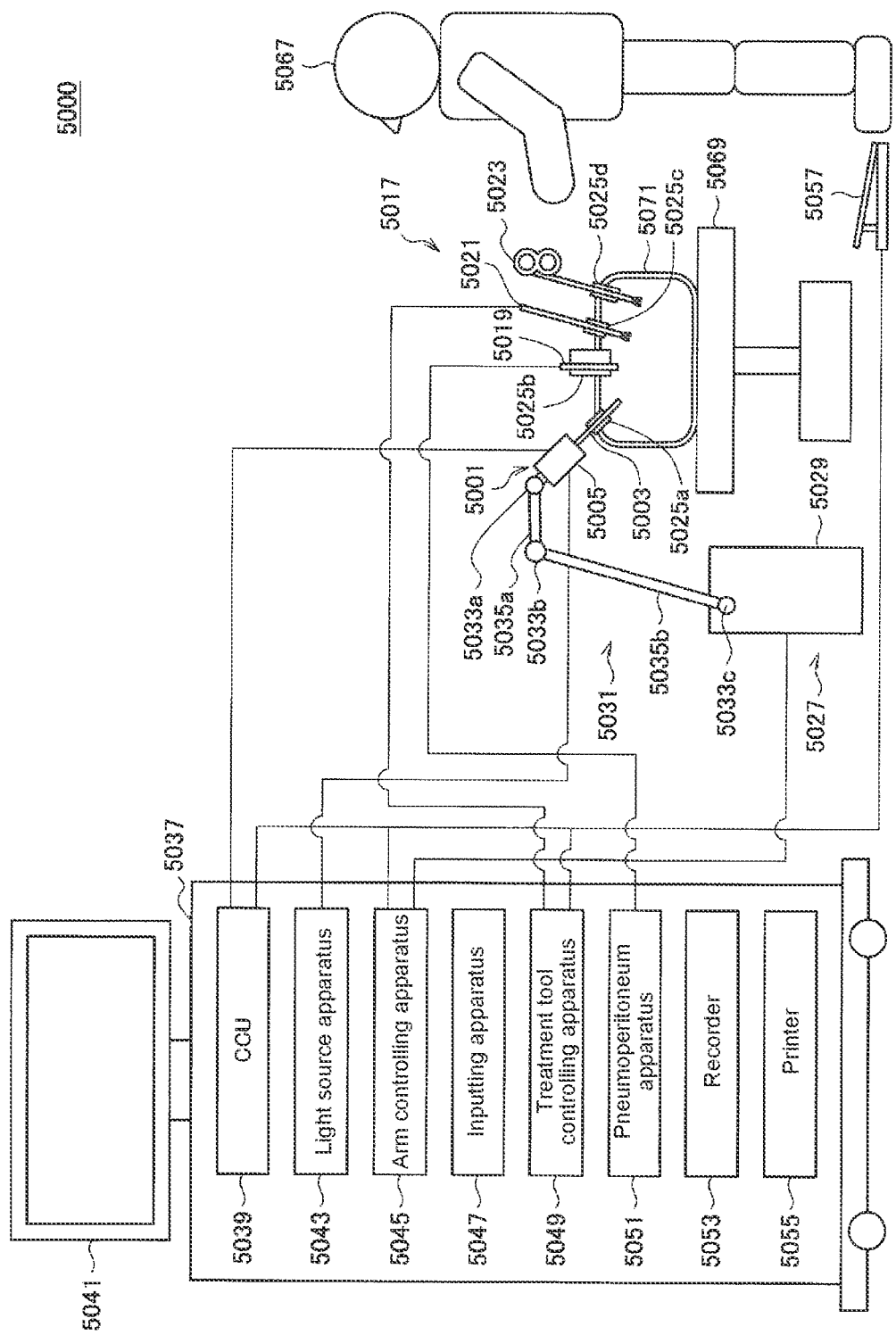
FIG. 27 is a view depicting an example of a schematic configuration of an endoscopic surgery system.

FIG. 27 is a view depicting an example of a schematic configuration of an endoscopic surgery system 5000 to which the technology according to an embodiment of the present disclosure can be applied. In FIG. 27, a state is illustrated in which a surgeon (medical doctor) 5067 is using the endoscopic surgery system 5000 to perform surgery for a patient 5071 on a patient bed 5069. As depicted, the endoscopic surgery system 5000 includes an endoscope 5001, other surgical tools 5017, a supporting arm apparatus 5027 which supports the endoscope 5001 thereon, and a cart 5037 on which various apparatus for endoscopic surgery are mounted.

In endoscopic surgery, in place of incision of the abdominal wall to perform laparotomy, a plurality of tubular aperture devices called trocars 5025a to 5025d are used to puncture the abdominal wall. Then, a lens barrel 5003 of the endoscope 5001 and the other surgical tools 5017 are inserted into body lumens of the patient 5071 through the trocars 5025a to 5025d. In the example depicted, as the other surgical tools 5017, a pneumoperitoneum tube 5019, an energy treatment tool 5021 and forceps 5023 are inserted into body lumens of the patient 5071. Furthermore, the energy treatment tool 5021 is a treatment tool for performing incision and peeling of a tissue, sealing of a blood vessel or the like by high frequency current or ultrasonic vibration. However, the surgical tools 5017 depicted are mere examples at all, and as the surgical tools 5017, various surgical tools which are generally used in endoscopic surgery such as, for example, a pair of tweezers or a retractor may be used.

An image of a surgical region in a body lumen of the patient 5071 imaged by the endoscope 5001 is displayed on a display apparatus 5041. The surgeon 5067 would use the energy treatment tool 5021 or the forceps 5023 while watching the image of the surgical region displayed on the display apparatus 5041 on the real time basis to perform such treatment as, for example, resection of an affected area. It is to be noted that, though not depicted, the pneumoperitoneum tube 5019, the energy treatment tool 5021 and the forceps 5023 are supported by the surgeon 5067, an assistant or the like during surgery.

(Supporting Arm Apparatus)

The supporting arm apparatus 5027 includes an arm unit 5031 extending from a base unit 5029. In the example depicted, the arm unit 5031 includes joint portions 5033a, 5033b and 5033c and links 5035a and 5035b and is driven under the control of an arm controlling apparatus 5045. The endoscope 5001 is supported by the arm unit 5031 such that the position and the posture of the endoscope 5001 are controlled. Consequently, stable fixation in position of the endoscope 5001 can be implemented.

(Endoscope)

The endoscope 5001 includes the lens barrel 5003 which has a region of a predetermined length from a distal end thereof to be inserted into a body lumen of the patient 5071, and a camera head 5005 connected to a proximal end of the lens barrel 5003. In the example depicted, the endoscope 5001 is depicted which includes as a hard mirror having the lens barrel 5003 of the hard type. However, the endoscope 5001 may otherwise be configured as a soft mirror having the lens barrel 5003 of the soft type.

The lens barrel 5003 has, at a distal end thereof, an opening in which an objective lens is fitted. A light source apparatus 5043 is connected to the endoscope 5001 such that light generated by the light source apparatus 5043 is introduced to a distal end of the lens barrel by a light guide extending in the inside of the lens barrel 5003 and is irradiated toward an observation target in a body lumen of the patient 5071 through the objective lens. It is to be noted that the endoscope 5001 may be a direct view mirror or may be a perspective view mirror or a side view mirror.

An optical system and an image pickup element are provided in the inside of the camera head 5005 such that reflected light (observation light) from an observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 5039. It is to be noted that the camera head 5005 has a function incorporated therein for suitably driving the optical system of the camera head 5005 to adjust the magnification and the focal distance.

It is to be noted that, in order to establish compatibility with, for example, a stereoscopic vision (three dimensional (3D) display), a plurality of image pickup elements may be provided on the camera head 5005. In this case, a plurality of relay optical systems are provided in the inside of the lens barrel 5003 in order to guide observation light to each of the plurality of image pickup elements.

(Various Apparatus Incorporated in Cart)

The CCU 5039 includes a central processing unit (CPU), a graphics processing unit (GPU) or the like and integrally controls operation of the endoscope 5001 and the display apparatus 5041. In particular, the CCU 5039 performs, for an image signal received from the camera head 5005, various image processes for displaying an image based on the image signal such as, for example, a development process (demosaic process). The CCU 5039 provides the image signal for which the image processes have been performed to the display apparatus 5041. Furthermore, the CCU 5039 transmits a control signal to the camera head 5005 to control driving of the camera head 5005. The control signal may include information relating to an image pickup condition such as a magnification or a focal distance.

The display apparatus 5041 displays an image based on an image signal for which the image processes have been performed by the CCU 5039 under the control of the CCU 5039. If the endoscope 5001 is ready for imaging of a high resolution such as 4K (horizontal pixel number 3840× vertical pixel number 2160), 8K (horizontal pixel number 7680×vertical pixel number 4320) or the like and/or ready for 3D display, then a display apparatus by which corresponding display of the high resolution and/or 3D display are possible may be used as the display apparatus 5041. Where the apparatus is ready for imaging of a high resolution such as 4K or 8K, if the display apparatus used as the display apparatus 5041 has a size of equal to or not less than 55 inches, then a more immersive experience can be obtained. Furthermore, a plurality of display apparatus 5041 having different resolutions and/or different sizes may be provided in accordance with purposes.

The light source apparatus 5043 includes a light source such as, for example, a light emitting diode (LED) and supplies irradiation light for imaging of a surgical region to the endoscope 5001.

The arm controlling apparatus 5045 includes a processor such as, for example, a CPU and operates in accordance with a predetermined program to control driving of the arm unit 5031 of the supporting arm apparatus 5027 in accordance with a predetermined controlling method.

An inputting apparatus 5047 is an input interface for the endoscopic surgery system 5000. A user can perform inputting of various kinds of information or instruction inputting to the endoscopic surgery system 5000 through the inputting apparatus 5047. For example, the user would input various kinds of information relating to surgery such as physical information of a patient, information regarding a surgical procedure of the surgery and so forth through the inputting apparatus 5047. Furthermore, the user would input, for example, an instruction to drive the arm unit 5031, an instruction to change an image pickup condition (type of irradiation light, magnification, focal distance or the like) by the endoscope 5001, an instruction to drive the energy treatment tool 5021 or the like through the inputting apparatus 5047.

The type of the inputting apparatus 5047 is not limited and may be that of any one of various known inputting apparatus. As the inputting apparatus 5047, for example, a mouse, a keyboard, a touch panel, a switch, a foot switch 5057 and/or a lever or the like may be applied. Where a touch panel is used as the inputting apparatus 5047, it may be provided on the display face of the display apparatus 5041.

Otherwise, the inputting apparatus 5047 is a device to be mounted on a user such as, for example, a glasses type wearable device or a head mounted display (HMD), and various kinds of inputting are performed in response to a gesture or a line of sight of the user detected by any of the devices mentioned. Furthermore, the inputting apparatus 5047 includes a camera which can detect a motion of a user, and various kinds of inputting are performed in response to a gesture or a line of sight of a user detected from a video imaged by the camera. Furthermore, the inputting apparatus 5047 includes a microphone which can collect the voice of a user, and various kinds of inputting are performed by voice collected by the microphone. By configuring the inputting apparatus 5047 such that various kinds of information can be inputted in a contactless fashion in this manner, especially a user who belongs to a clean area (for example, the surgeon 5067) can operate an apparatus belonging to an unclean area in a contactless fashion. Furthermore, since the user can operate an apparatus without releasing a possessed surgical tool from its hand, the convenience to the user is improved.

A treatment tool controlling apparatus 5049 controls driving of the energy treatment tool 5021 for cautery or incision of a tissue, sealing of a blood vessel or the like. A pneumoperitoneum apparatus 5051 feeds gas into a body lumen of the patient 5071 through the pneumoperitoneum tube 5019 to inflate the body lumen in order to secure the field of view of the endoscope 5001 and secure the working space for the surgeon. A recorder 5053 is an apparatus capable of recording various kinds of information relating to surgery. A printer 5055 is an apparatus capable of printing various kinds of information relating to surgery in various forms such as a text, an image or a graph.

In the following, especially a characteristic configuration of the endoscopic surgery system 5000 is described in more detail.

(Supporting Arm Apparatus)

The supporting arm apparatus 5027 includes the base unit 5029 serving as a base, and the arm unit 5031 extending from the base unit 5029. In the example depicted, the arm unit 5031 includes the plurality of joint portions 5033*a*, 5033*b* and 5033*c* and the plurality of links 5035*a* and 5035*b* connected to each other by the joint portion 5033*b*. In FIG. 27, for simplified illustration, the configuration of the arm unit 5031 is depicted in a simplified form. Actually, the shape, number and arrangement of the joint portions 5033*a* to 5033*c* and the links 5035*a* and 5035*b* and the direction and so forth of axes of rotation of the joint portions 5033*a* to 5033*c* can be set suitably such that the arm unit 5031 has a desired degree of freedom. For example, the arm unit 5031 may preferably be configured such that it has a degree of freedom equal to or not less than 6 degrees of freedom. This makes it possible to move the endoscope 5001 freely within the movable range of the arm unit 5031. Consequently, it becomes possible to insert the lens barrel 5003 of the endoscope 5001 from a desired direction into a body lumen of the patient 5071.

An actuator is provided in each of the joint portions 5033*a* to 5033*c*, and the joint portions 5033*a* to 5033*c* are configured such that they are rotatable around predetermined axes of rotation thereof by driving of the respective actuators. The driving of the actuators is controlled by the arm controlling apparatus 5045 to control the rotational angle of each of the joint portions 5033*a* to 5033*c* thereby to control driving of the arm unit 5031. Consequently, control of the position and the posture of the endoscope 5001 can be implemented. Thereupon, the arm controlling apparatus 5045 can control driving of the arm unit 5031 by various known controlling methods such as force control or position control.

For example, if the surgeon 5067 suitably performs operation inputting through the inputting apparatus 5047 (including the foot switch 5057), then driving of the arm unit 5031 may be controlled suitably by the arm controlling apparatus 5045 in response to the operation input to control the position and the posture of the endoscope 5001. After the endoscope 5001 at the distal end of the arm unit 5031 is moved from an arbitrary position to a different arbitrary position by the control just described, the endoscope 5001 can be supported fixedly at the position after the movement. It is to be noted that the arm unit 5031 may be operated in a master-slave fashion. In this case, the arm unit 5031 may be remotely controlled by the user through the inputting apparatus 5047 which is placed at a place remote from the surgery room.

Furthermore, where force control is applied, the arm controlling apparatus 5045 may perform power-assisted control to drive the actuators of the joint portions 5033*a* to 5033*c* such that the arm unit 5031 may receive external force by the user and move smoothly following the external force. This makes it possible to move, when the user directly touches with and moves the arm unit 5031, the arm unit 5031 with comparatively weak force. Accordingly, it becomes possible for the user to move the endoscope 5001 more intuitively by a simpler and easier operation, and the convenience to the user can be improved.

Here, generally in endoscopic surgery, the endoscope 5001 is supported by a medical doctor called scopist. In contrast, where the supporting arm apparatus 5027 is used, the position of the endoscope 5001 can be fixed more certainly without hands, and therefore, an image of a surgical region can be obtained stably and surgery can be performed smoothly.

It is to be noted that the arm controlling apparatus 5045 may not necessarily be provided on the cart 5037. Furthermore, the arm controlling apparatus 5045 may not necessarily be a single apparatus. For example, the arm controlling apparatus 5045 may be provided in each of the joint portions 5033*a* to 5033*c* of the arm unit 5031 of the supporting arm apparatus 5027 such that the plurality of arm controlling apparatus 5045 cooperate with each other to implement driving control of the arm unit 5031.

(Light Source Apparatus)

The light source apparatus 5043 supplies irradiation light upon imaging of a surgical region to the endoscope 5001. The light source apparatus 5043 includes a white light source which includes, for example, an LED, a laser light source or a combination of them. In this case, where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 5043. Furthermore, in this case, if laser beams from the respective RGB laser light sources are irradiated time-divisionally on an observation target and driving of the image pickup elements of the camera head 5005 is controlled in synchronism with the irradiation timings, then images individually corresponding to the R, G and B colors can be picked up time-divisionally. According to the method just described, a color image can be obtained even if a color filter is not provided for the image pickup element.

Furthermore, driving of the light source apparatus 5043 may be controlled such that the intensity of light to be outputted is changed for each predetermined time. By controlling driving of the image pickup element of the camera head 5005 in synchronism with the timing of the change of the intensity of light to acquire images time-divisionally and synthesizing the images, an image of a high dynamic range free from underexposed blocked up shadows and overexposed highlights can be created.

Furthermore, the light source apparatus 5043 may be configured to supply light of a predetermined wavelength band ready for special light observation. In special light observation, for example, by utilizing the wavelength dependency of absorption of light in a body tissue to irradiate light of a narrower band in comparison with irradiation light upon ordinary observation (namely, white light), narrow band light observation (narrow band imaging) of imaging a predetermined tissue such as a blood vessel of a superficial portion of the mucous film or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 5043 can be configured to supply such narrow-band light and/or excitation light suitable for special light observation as described above.

(Camera Head and CCU)

Figure 28:
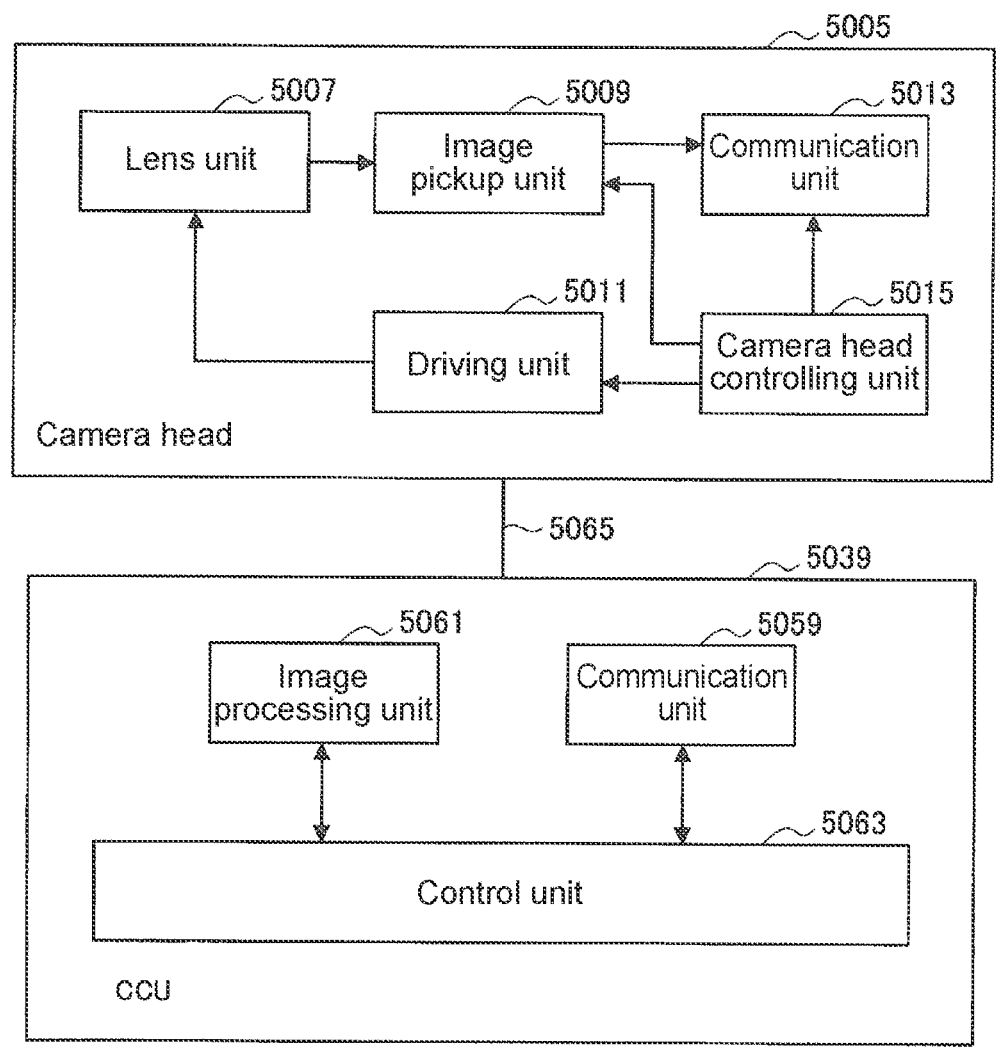
FIG. 28 is a block diagram depicting an example of a functional configuration of a camera head and a camera control unit (CCU) depicted in FIG. 28.

Functions of the camera head 5005 of the endoscope 5001 and the CCU 5039 are described in more detail with reference to FIG. 28. FIG. 28 is a block diagram depicting an example of a functional configuration of the camera head 5005 and the CCU 5039 depicted in FIG. 27.

Referring to FIG. 28, the camera head 5005 has, as functions thereof, a lens unit 5007, an image pickup unit 5009, a driving unit 5011, a communication unit 5013 and a camera head controlling unit 5015. Furthermore, the CCU 5039 has, as functions thereof, a communication unit 5059, an image processing unit 5061 and a control unit 5063. The camera head 5005 and the CCU 5039 are connected to be bidirectionally communicable to each other by a transmission cable 5065.

First, a functional configuration of the camera head 5005 is described. The lens unit 5007 is an optical system provided at a connecting location of the camera head 5005 to the lens barrel 5003. Observation light taken in from a distal end of the lens barrel 5003 is introduced into the camera head 5005 and enters the lens unit 5007. The lens unit 5007 includes a combination of a plurality of lenses including a zoom lens and a focusing lens. The lens unit 5007 has optical properties adjusted such that the observation light is condensed on a light receiving face of the image pickup element of the image pickup unit 5009. Furthermore, the zoom lens and the focusing lens are configured such that the positions thereof on their optical axis are movable for adjustment of the magnification and the focal point of a picked up image.

The image pickup unit 5009 includes an image pickup element and arranged at a succeeding stage to the lens unit 5007. Observation light having passed through the lens unit 5007 is condensed on the light receiving face of the image pickup element, and an image signal corresponding to the observation image is generated by photoelectric conversion of the image pickup element. The image signal generated by the image pickup unit 5009 is provided to the communication unit 5013.

As the image pickup element which is included by the image pickup unit 5009, an image sensor, for example, of the complementary metal oxide semiconductor (CMOS) type is used which has a Bayer array and is capable of picking up an image in color. It is to be noted that, as the image pickup element, an image pickup element may be used which is ready, for example, for imaging of an image of a high resolution equal to or not less than 4K. If an image of a surgical region is obtained in a high resolution, then the surgeon 5067 can comprehend a state of the surgical region in enhanced details and can proceed with the surgery more smoothly.

Furthermore, the image pickup element which is included by the image pickup unit 5009 includes such that it has a pair of image pickup elements for acquiring image signals for the right eye and the left eye compatible with 3D display. Where 3D display is applied, the surgeon 5067 can comprehend the depth of a living body tissue in the surgical region more accurately. It is to be noted that, if the image pickup unit 5009 is configured as that of the multi-plate type, then a plurality of systems of lens units 5007 are provided corresponding to the individual image pickup elements of the image pickup unit 5009.

The image pickup unit 5009 may not necessarily be provided on the camera head 5005. For example, the image pickup unit 5009 may be provided just behind the objective lens in the inside of the lens barrel 5003.

The driving unit 5011 includes an actuator and moves the zoom lens and the focusing lens of the lens unit 5007 by a predetermined distance along the optical axis under the control of the camera head controlling unit 5015. Consequently, the magnification and the focal point of a picked up image by the image pickup unit 5009 can be adjusted suitably.

The communication unit 5013 includes a communication apparatus for transmitting and receiving various kinds of information to and from the CCU 5039. The communication unit 5013 transmits an image signal acquired from the image pickup unit 5009 as RAW data to the CCU 5039 through the transmission cable 5065. Thereupon, in order to display a picked up image of a surgical region in low latency, preferably the image signal is transmitted by optical communication. This is because, upon surgery, the surgeon 5067 performs surgery while observing the state of an affected area through a picked up image, it is demanded for a moving image of the surgical region to be displayed on the real time basis as far as possible in order to achieve surgery with a higher degree of safety and certainty. Where optical communication is applied, a photoelectric conversion module for converting an electric signal into an optical signal is provided in the communication unit 5013. After the image signal is converted into an optical signal by the photoelectric conversion module, it is transmitted to the CCU 5039 through the transmission cable 5065.

Furthermore, the communication unit 5013 receives a control signal for controlling driving of the camera head 5005 from the CCU 5039. The control signal includes information relating to image pickup conditions such as, for example, information that a frame rate of a picked up image is designated, information that an exposure value upon image picking up is designated and/or information that a magnification and a focal point of a picked up image are designated. The communication unit 5013 provides the received control signal to the camera head controlling unit 5015. It is to be noted that also the control signal from the CCU 5039 may be transmitted by optical communication. In this case, a photoelectric conversion module for converting an optical signal into an electric signal is provided in the communication unit 5013. After the control signal is converted into an electric signal by the photoelectric conversion module, it is provided to the camera head controlling unit 5015.

It is to be noted that the image pickup conditions such as the frame rate, exposure value, magnification or focal point are set automatically by the control unit 5063 of the CCU 5039 on the basis of an acquired image signal. In other words, an auto exposure (AE) function, an auto focus (AF) function and an auto white balance (AWB) function are incorporated in the endoscope 5001.

The camera head controlling unit 5015 controls driving of the camera head 5005 on the basis of a control signal from the CCU 5039 received through the communication unit 5013. For example, the camera head controlling unit 5015 controls driving of the image pickup element of the image pickup unit 5009 on the basis of information that a frame rate of a picked up image is designated and/or information that an exposure value upon image picking up is designated. Furthermore, for example, the camera head controlling unit 5015 controls the driving unit 5011 to suitably move the zoom lens and the focus lens of the lens unit 5007 on the basis of information that a magnification and a focal point of a picked up image are designated. The camera head controlling unit 5015 may further include a function for storing information for identifying the lens barrel 5003 and/or the camera head 5005.

It is to be noted that, by disposing the components such as the lens unit 5007 and the image pickup unit 5009 in a sealed structure having high airtightness and waterproof, the camera head 5005 can be provided with resistance to an autoclave sterilization process.

Now, a functional configuration of the CCU 5039 is described. The communication unit 5059 includes a communication apparatus for transmitting and receiving various kinds of information to and from the camera head 5005. The communication unit 5059 receives an image signal transmitted thereto from the camera head 5005 through the transmission cable 5065. Thereupon, the image signal may be transmitted preferably by optical communication as described above. In this case, for the compatibility with optical communication, the communication unit 5059 includes a photoelectric conversion module for converting an optical signal into an electric signal. The communication unit 5059 provides the image signal after conversion into an electric signal to the image processing unit 5061.

Furthermore, the communication unit 5059 transmits, to the camera head 5005, a control signal for controlling driving of the camera head 5005. The control signal may also be transmitted by optical communication.

The image processing unit 5061 performs various image processes for an image signal in the form of RAW data transmitted thereto from the camera head 5005. The image processes include various known signal processes such as, for example, a development process, an image quality improving process (a bandwidth enhancement process, a super-resolution process, a noise reduction (NR) process and/or an image stabilization process) and/or an enlargement process (electronic zooming process). Furthermore, the image processing unit 5061 performs a detection process for an image signal in order to perform AE, AF and AWB.

The image processing unit 5061 includes a processor such as a CPU or a GPU, and when the processor operates in accordance with a predetermined program, the image processes and the detection process described above can be performed. It is to be noted that, where the image processing unit 5061 includes a plurality of GPUs, the image processing unit 5061 suitably divides information relating to an image signal such that image processes are performed in parallel by the plurality of GPUs.

The control unit 5063 performs various kinds of control relating to image picking up of a surgical region by the endoscope 5001 and display of the picked up image. For example, the control unit 5063 generates a control signal for controlling driving of the camera head 5005. Thereupon, if image pickup conditions are inputted by the user, then the control unit 5063 generates a control signal on the basis of the input by the user. Alternatively, where the endoscope 5001 has an AE function, an AF function and an AWB function incorporated therein, the control unit 5063 suitably calculates an optimum exposure value, focal distance and white balance in response to a result of a detection process by the image processing unit 5061 and generates a control signal.

Furthermore, the control unit 5063 controls the display apparatus 5041 to display an image of a surgical region on the basis of an image signal for which image processes have been performed by the image processing unit 5061. Thereupon, the control unit 5063 recognizes various objects in the surgical region image using various image recognition technologies. For example, the control unit 5063 can recognize a surgical tool such as forceps, a particular living body region, bleeding, mist when the energy treatment tool 5021 is used and so forth by detecting the shape, color and so forth of edges of the objects included in the surgical region image. The control unit 5063 causes, when it controls the display unit 5041 to display a surgical region image, various kinds of surgery supporting information to be displayed in an overlapping manner with an image of the surgical region using a result of the recognition. Where surgery supporting information is displayed in an overlapping manner and presented to the surgeon 5067, the surgeon 5067 can proceed with the surgery more safety and certainty.

The transmission cable 5065 which connects the camera head 5005 and the CCU 5039 to each other is an electric signal cable ready for communication of an electric signal, an optical fiber ready for optical communication or a composite cable ready for both of electrical and optical communication.

Here, while, in the example depicted, communication is performed by wired communication using the transmission cable 5065, the communication between the camera head 5005 and the CCU 5039 may be performed otherwise by wireless communication. Where the communication between the camera head 5005 and the CCU 5039 is performed by wireless communication, there is no necessity to lay the transmission cable 5065 in the surgery room. Therefore, such a situation that movement of medical staff in the surgery room is disturbed by the transmission cable 5065 can be eliminated.

An example of the endoscopic surgery system 5000 to which the technology according to an embodiment of the present disclosure can be applied has been described above. It is to be noted here that, although the endoscopic surgery system 5000 has been described as an example, the system to which the technology according to an embodiment of the present disclosure can be applied is not limited to the example. For example, the technology according to an embodiment of the present disclosure may be applied to a soft endoscopic system for inspection or a microscopic surgery system.

The technology according to the present disclosure can be suitably applied to the image pickup unit 5009 among the configurations described above. By applying the technology according to the present disclosure to the image pickup unit 5009, a clearer surgical region image can be obtained, and therefore, surgery can be performed more safely and more reliably.

OTHER EMBODIMENTS

As noted above, although the above-mentioned technology has been described in terms of the first through fifth embodiments, the discussion and drawings that form a part of this disclosure should not be construed as limiting the technology. Various alternative embodiments, examples, and operation technology will be apparent to those skilled in the art from the present disclosure.

For example, content described in the first to fifth embodiments can be appropriately combined. For example, in the photoelectric conversion element according to the first embodiment, as described in the second embodiment, m/n may be 1 or more when the film density of the photoelectric conversion layer is m and the weighted average of the film density of the single film of each organic semiconductor material forming the organic photoelectric conversion layer with respect to the composition is n. Furthermore, in the photoelectric conversion element according to the first embodiment, as described in the third embodiment, the photoelectric conversion layer includes the pigment material that absorbs light and is excited and the organic semiconductor material having electron accepting property, and the ratio of the organic semiconductor material having only the most stable structure as the coordination structure with the adjacent pigment material may be 0.5 or more. Furthermore, in the photoelectric conversion element according to the first embodiment, as described in the fourth embodiment, the photoelectric conversion layer may include the pigment material that absorbs light and is excited, the first organic semiconductor material having the electron donating property, and the second organic semiconductor material having the electron accepting property, and the photoelectric conversion layer may include the first domain 17A formed of the first organic semiconductor material and the second domain 17B in which the second organic semiconductor material and the pigment material are uniformly dissolved at the molecular level.

In addition, in the photoelectric conversion element according to the second embodiment, as described in the first embodiment, at least one of the organic semiconductor materials forming the photoelectric conversion element may be organic molecules each having the HOMO volume fraction of 0.15 or less or the LUMO volume fraction of 0.15 or less. Furthermore, in the photoelectric conversion element according to the second embodiment, as described in the third embodiment, the photoelectric conversion layer includes the pigment material that absorbs light and is excited and the organic semiconductor material having electron accepting property, and the ratio of the organic semiconductor material having only the most stable structure as the coordination structure with the adjacent pigment material may be 0.5 or more. Furthermore, in the photoelectric conversion element according to the second embodiment, as described in the fourth embodiment, the photoelectric conversion layer may include the pigment material that absorbs light and is excited, the first organic semiconductor material having the electron donating property, and the second organic semiconductor material having the electron accepting property, and the photoelectric conversion layer may include the first domain 17A formed of the first organic semiconductor material, and the second domain 17B in which the second organic semiconductor material and the pigment material are uniformly dissolved at the molecular level.

In addition, in the photoelectric conversion element according to the third embodiment, as described in the first embodiment, at least one of the organic semiconductor materials forming the photoelectric conversion element may be organic molecules each having the HOMO volume fraction of 0.15 or less or the LUMO volume fraction of 0.15 or less. Furthermore, in the photoelectric conversion element according to the third embodiment, as described in the second embodiment, m/n may be 1 or more when the film density of the photoelectric conversion layer is m and the weighted average of the film density of the single film of each organic semiconductor material forming the organic photoelectric conversion layer with respect to the composition is n. Furthermore, in the photoelectric conversion element according to the third embodiment, as described in the fourth embodiment, the photoelectric conversion layer may include the pigment material that absorbs light and is excited, the first organic semiconductor material having the electron donating property, and the second organic semiconductor material having the electron accepting property, and the photoelectric conversion layer may include the first domain 17A formed of the first organic semiconductor material, and the second domain 17B in which the second organic semiconductor material and the pigment material are uniformly dissolved at the molecular level.

In addition, the photoelectric conversion element according to the fourth embodiment, as described in the first embodiment, at least one of the organic semiconductor materials forming the photoelectric conversion element may be organic molecules each having the HOMO volume fraction of 0.15 or less or the LUMO volume fraction of 0.15 or less. Furthermore, in the photoelectric conversion element according to the fourth embodiment, as described in the second embodiment, m/n may be 1 or more when the film density of the photoelectric conversion layer is m and the weighted average of the film density of the single film of each organic semiconductor material forming the organic photoelectric conversion layer with respect to the composition is n. Furthermore, in the photoelectric conversion element according to the fourth embodiment, as described in the third embodiment, the photoelectric conversion layer includes the pigment material that absorbs light and is excited and the organic semiconductor material having electron accepting property, and the ratio of the organic semiconductor material having only the most stable structure as the coordination structure with the adjacent pigment material may be 0.5 or more.

In addition, in the first to fifth embodiments described above, the structure in which the organic photoelectric conversion portion 11G for detecting green light and the inorganic photoelectric conversion portions 11B and 11R for detecting blue light and red light, respectively, are laminated as the photoelectric conversion element is exemplified, but the present disclosure is not limited to such a structure. That is, red light or blue light may be detected in the organic photoelectric conversion section, and green light may be detected in the inorganic photoelectric conversion section. In addition, the number and the ratio of the organic photoelectric conversion section and the inorganic photoelectric conversion section are not limited, and two or more organic photoelectric conversion sections may be provided, and color signals of a plurality of colors may be obtained only by the organic photoelectric conversion section. Furthermore, the structure is not limited to the structure in which the organic photoelectric conversion section and the inorganic photoelectric conversion section are laminated in the longitudinal direction, and may be arranged in parallel along the substrate surface.

In the first to fifth embodiments described above, the configuration of the back surface irradiation type solid-state imaging device is exemplified, but the present disclosure is also applicable to the front surface irradiation type solid-state imaging device. In the solid-state imaging device and the photoelectric conversion element of the present disclosure, it is not necessary to include all of the constituent elements described in the above embodiments and the like, and conversely, other constituent elements may be included. Furthermore, the art of the present disclosure can be applied not only to a solid-state imaging device but also to, for example, a solar cell.

The present technology can be configured as follows.

(1)
A photoelectric conversion element, including:
a first electrode and a second electrode arranged to face each other; and
a photoelectric conversion layer provided between the first electrode and the second electrode, in which
the photoelectric conversion layer includes a first organic semiconductor material and a second organic semiconductor material, and
at least one of the first organic semiconductor material or the second organic semiconductor material is an organic molecule having a HOMO volume fraction of 0.15 or less or a LUMO volume fraction of 0.15 or less.

(2)
A photoelectric conversion element, including:
a first electrode and a second electrode arranged to face each other; and
a photoelectric conversion layer provided between the first electrode and the second electrode, in which
the photoelectric conversion layer is formed of two or more kinds of organic semiconductor materials, and
m/n is 1 or more, where m is a film density of the photoelectric conversion layer, and n is a weighted average of the film density of a single film of each organic semiconductor material forming the photoelectric conversion layer with respect to a composition.

(3)
The photoelectric conversion element according to (1) or (2), in which at least one of the organic semiconductor materials forming the photoelectric conversion layer is a hole transporting material.

(4)
The photoelectric conversion element according to (3), in which the photoelectric conversion layer contains 30% or more by weight of the hole transporting material.

(5)
A photoelectric conversion element, including:
a first electrode and a second electrode arranged to face each other; and
a photoelectric conversion layer provided between the first electrode and the second electrode, in which
the photoelectric conversion layer includes first to third organic semiconductor materials, and
a ratio of the second organic semiconductor material, which has only a most stable structure as a coordination structure with the third organic semiconductor material adjacent to the second organic semiconductor material, is 0.5 or more.

(6)
The photoelectric conversion element according to (5), in which the first organic semiconductor material has an electron donating property,
the second organic semiconductor material has an electron accepting property, and
the third organic semiconductor material is a pigment material that absorbs light and is excited.

(7)
The photoelectric conversion element according to (5) or (6), in which $N_A/N \geq 0.5$ is satisfied when a segment surface is defined which is perpendicular to an axis passing through a center of gravity of the third organic semiconductor material and a center of gravity of the second organic semiconductor material and which is segmented by a plane passing through the center of gravity of the third organic semiconductor material in a most stable dimer structure of the second organic semiconductor material calculated by a quantum chemical calculation and the third organic semiconductor material, a region in a direction where the second organic semiconductor material is present of two regions defined by the segment surface is set as a special region, the number of the second organic semiconductor materials located only in the special region defined by the segment surface of the adjacent third organic semiconductor material of the second organic semiconductor material in the photoelectric conversion layer is $N_A$, and a total number of the second organic semiconductor materials in the photoelectric conversion layer is N.

(8)
The photoelectric conversion element according to (7), in which a distance between the centers of gravity of the second organic semiconductor material and the third organic semiconductor material adjacent to each other is within 1.0 nm.

(9)
The photoelectric conversion element according to any one of (5) to (8), in which the second organic semiconductor material is fullerene or a fullerene derivative.

(10)
A photoelectric conversion element, including:
a first electrode and a second electrode arranged to face each other; and
a photoelectric conversion layer provided between the first electrode and the second electrode, in which
the photoelectric conversion layer includes first, second, and third organic semiconductor materials, and
the photoelectric conversion layer has a first domain formed of the first organic semiconductor material and a second domain in which the second organic semiconductor material and the third organic semiconductor material are uniformly dissolved at a molecular level.

(11)
The photoelectric conversion element according to (10), in which
the first organic semiconductor material has an electron donating property,
the second organic semiconductor material has an electron accepting property, and
the third organic semiconductor material is a pigment material that absorbs and excites light.

(12)
The photoelectric conversion element according to (10) or (11), in which
the second organic semiconductor material and the third organic semiconductor material are uniformly dissolved to each other at an intermolecular distance of less than 1.5 nm.

(13)
The photoelectric conversion element according to (10) to (12), in which A/B<0.1 is satisfied where A denotes a maximum emission intensity of an emission peak of the third organic semiconductor material and B denotes a maximum emission intensity of an emission peak of the second organic semiconductor material in a photoluminescence spectrum of the photoelectric conversion layer excited at a wavelength of a visible range absorption band of the third organic semiconductor material.

(14)
The photoelectric conversion element according to any one of (10) to (13), in which the third organic semiconductor material has a maximum absorption wavelength in a wavelength range of 500 nm or more and 600 nm or less.

(15)
The photoelectric conversion element according to any one of (10) to (14), in which the third organic semiconductor material has a maximum emission intensity in a wavelength range of 520 nm or more and 580 nm or less.

(16)
The photoelectric conversion element according to any one of (10) to (15), in which the second organic semiconductor material has a maximum emission intensity in a wavelength range of 710 nm or more and 740 nm or less.

(17)
The photoelectric conversion element according to any one of (10) to (16), in which the second organic semiconductor material is fullerene or a fullerene derivative.

(18)
The photoelectric conversion element according to (17), in which a maximum wavelength in a wavelength range of 710 nm or more and 740 nm or less is 720 nm or less in a photoluminescence spectrum of the photoelectric conversion layer excited at a wavelength of a visible range absorption band of the third organic semiconductor material.

(19)
The photoelectric conversion element according to any one of (10) to (18), in which a crystal grain size of the first domain is 5 nm or more and 20 nm or less.

(20)
The photoelectric conversion element according to any one of (10) to (19), in which mass content of the third organic semiconductor material is larger than mass content of the second organic semiconductor material in the photoelectric conversion layer.

(21)
A photoelectric conversion element, including:
a first electrode and a second electrode arranged to face each other; and
a photoelectric conversion layer provided between the first electrode and the second electrode, in which
the photoelectric conversion layer is formed of two or more kinds of organic semiconductor materials including at least fullerenes, and
a value of an energy gap of fullerene in the photoelectric conversion layer measured by ultraviolet photoelectron spectroscopy and inverse photoelectron spectroscopy is 2.6 eV or more.

(22)
The photoelectric conversion element according to (21), in which
the photoelectric conversion layer includes a p-type semiconductor material and an n-type semiconductor material, and
the n-type semiconductor material is fullerene.

(23)
The photoelectric conversion element according to (22), in which the photoelectric conversion layer further includes a pigment material.

(24) The photoelectric conversion element according to any one of (21) to (23), in which the value of the energy gap is 2.8 eV or more and 3.1 eV or less.

REFERENCE SIGNS LIST 1 solid-state imaging device
2 electronic apparatus
3 unit pixel
4 pixel region
5 vertical driving circuit
6 column selection circuit
7 horizontal driving circuit
8 output circuit
9 control circuit
10 photoelectric conversion element
11 semiconductor substrate
11B, 11R inorganic photoelectric conversion section
11G organic photoelectric conversion section
11a silicon layer
12, 14 interlayer insulator
12a, 12b, 12c, 12d conductive plug
13a, 13b wiring layer
15a lower electrode
15b wiring layer
16 insulating film
17 organic photoelectric conversion layer
18 upper electrode
19 protective layer
19a contact hole
20 contact metal layer
21 planarization layer
22 on-chip lens
23 multilayer interconnection layer
24 wiring
25 interlayer insulator
26 supporting substrate
31 third organic semiconductor material (pigment material)
32 second organic semiconductor material
41 first organic semiconductor material
42 second organic semiconductor material
43 third organic semiconductor material
110g green storage layer
201 optical system
202 shutter device
203 signal processing section
204 driving section

What is claimed is:
1. A photoelectric conversion element, comprising:
a first electrode and a second electrode arranged to face each other; and
a photoelectric conversion layer provided between the first electrode and the second electrode, wherein the photoelectric conversion layer includes a first organic semiconductor material and a second organic semiconductor material, and at least one of the first organic semiconductor material or the second organic semiconductor material is an organic molecule having a highest occupied molecular orbital (HOMO) volume fraction of 0.15 or less or a lowest unoccupied molecular orbital (LUMO) volume fraction of 0.15 or less.

2. A photoelectric conversion element, comprising:
a first electrode and a second electrode arranged to face each other; and
a photoelectric conversion layer provided between the first electrode and the second electrode, wherein
the photoelectric conversion layer is formed of two or more kinds of organic semiconductor materials, and
m/n is 1 or more, where m is a film density of the photoelectric conversion layer, and n is a weighted average of the film density of a single film of each organic semiconductor material forming the photoelectric conversion layer with respect to a composition.

3. The photoelectric conversion element according to claim 2, wherein at least one of the organic semiconductor materials forming the photoelectric conversion layer is a hole transporting material.

4. The photoelectric conversion element according to claim 3, wherein the photoelectric conversion layer contains 30% or more by weight of the hole transporting material.

5. A photoelectric conversion element, comprising:
a first electrode and a second electrode arranged to face each other; and
a photoelectric conversion layer provided between the first electrode and the second electrode, wherein
the photoelectric conversion layer includes first to third organic semiconductor materials having different mother skeletons, and
a ratio of the second organic semiconductor material, which has only a most stable structure as a coordination structure with the third organic semiconductor material adjacent to the second organic semiconductor material, is 0.5 or more.

6. The photoelectric conversion element according to claim 5, wherein the first organic semiconductor material has an electron donating property,
the second organic semiconductor material has an electron accepting property, and
the third organic semiconductor material is a pigment material that absorbs light and is excited.

7. The photoelectric conversion element according to claim 5, wherein $N_A/N \geq 0.5$ is satisfied when a segment surface is defined which is perpendicular to an axis passing through a center of gravity of the third organic semiconductor material and a center of gravity of the second organic semiconductor material and which is segmented by a plane passing through the center of gravity of the third organic semiconductor material in a most stable dimer structure of the second organic semiconductor material calculated by a quantum chemical calculation and the third organic semiconductor material, a region in a direction where the second organic semiconductor material is present of two regions defined by the segment surface is set as a special region, the number of the second organic semiconductor materials located only in the special region defined by the segment surface of the adjacent third organic semiconductor material of the second organic semiconductor material in the photoelectric conversion layer is $N_A$, and a total number of the second organic semiconductor materials in the photoelectric conversion layer is N.

8. The photoelectric conversion element according to claim 7, wherein a distance between the centers of gravity of the second organic semiconductor material and the third organic semiconductor material adjacent to each other is within 1.0 nm.

9. The photoelectric conversion element according to claim 5, wherein the second organic semiconductor material is fullerene or a fullerene derivative.

10. A photoelectric conversion element, comprising:
a first electrode and a second electrode arranged to face each other; and
a photoelectric conversion layer provided between the first electrode and the second electrode, wherein
the photoelectric conversion layer includes first, second, and third organic semiconductor materials, having different mother skeletons, and
the photoelectric conversion layer has a first domain formed of the first organic semiconductor material and a second domain in which the second organic semiconductor material and the third organic semiconductor material are uniformly dissolved at a molecular level.

11. The photoelectric conversion element according to claim 10, wherein
the first organic semiconductor material has an electron donating property,
the second organic semiconductor material has an electron accepting property, and
the third organic semiconductor material is a pigment material that absorbs and excites light.

12. The photoelectric conversion element according to claim 10, wherein
the second organic semiconductor material and the third organic semiconductor material are uniformly dissolved to each other at an intermolecular distance of less than 1.5 nm.

13. The photoelectric conversion element according to claim 10, wherein A/B<0.1 is satisfied where A denotes a maximum emission intensity of an emission peak of the third organic semiconductor material and B denotes a maximum emission intensity of an emission peak of the second organic semiconductor material in a photoluminescence spectrum of the photoelectric conversion layer excited at a wavelength of a visible range absorption band of the third organic semiconductor material.

14. The photoelectric conversion element according to claim 10, wherein the third organic semiconductor material has a maximum absorption wavelength in a wavelength range of 500 nm or more and 600 nm or less.

15. The photoelectric conversion element according to claim 10, wherein the third organic semiconductor material has a maximum emission intensity in a wavelength range of 520 nm or more and 580 nm or less.

16. The photoelectric conversion element according to claim 10, wherein the second organic semiconductor material has a maximum emission intensity in a wavelength range of 710 nm or more and 740 nm or less.

17. The photoelectric conversion element according to claim 10, wherein the second organic semiconductor material is fullerene or a fullerene derivative.

18. The photoelectric conversion element according to claim 17, wherein a maximum wavelength in a wavelength range of 710 nm or more and 740 nm or less is 720 nm or less in a photoluminescence spectrum of the photoelectric conversion layer excited at a wavelength of a visible range absorption band of the third organic semiconductor material.

19. The photoelectric conversion element according to claim 10, wherein a crystal grain size of the first domain is 5 nm or more and 20 nm or less.

20. The photoelectric conversion element according to claim 10, wherein mass content of the third organic semiconductor material is larger than mass content of the second organic semiconductor material in the photoelectric conversion layer.

21. A photoelectric conversion element, comprising:
a first electrode and a second electrode arranged to face each other; and
a photoelectric conversion layer provided between the first electrode and the second electrode, wherein
the photoelectric conversion layer is formed of two or more kinds of organic semiconductor materials including at least fullerenes, having different mother skeletons, and are uniformly mixed into one phase, and
a value of an energy gap of fullerene in the photoelectric conversion layer measured by ultraviolet photoelectron spectroscopy and inverse photoelectron spectroscopy is 2.6 eV or more.

22. The photoelectric conversion element according to claim 21, wherein
the photoelectric conversion layer includes a p-type semiconductor material and an n-type semiconductor material, and
the n-type semiconductor material is fullerene.

23. The photoelectric conversion element according to claim 22, wherein the photoelectric conversion layer further includes a pigment material.

24. The photoelectric conversion element according to claim 21, wherein the value of the energy gap is 2.8 eV or more and 3.1 eV or less.

* * * * *